US008170040B2

(12) United States Patent
Konda

(10) Patent No.: US 8,170,040 B2
(45) Date of Patent: *May 1, 2012

(54) FULLY CONNECTED GENERALIZED BUTTERFLY FAT TREE NETWORKS

(75) Inventor: Venkat Konda, San Jose, CA (US)

(73) Assignee: Konda Technologies Inc., San Jose, CA (US)

( * ) Notice: Subject to any disclaimer, the term of this patent is extended or adjusted under 35 U.S.C. 154(b) by 273 days.

This patent is subject to a terminal disclaimer.

(21) Appl. No.: 12/601,273

(22) PCT Filed: May 22, 2008

(86) PCT No.: PCT/US2008/064603
§ 371 (c)(1),
(2), (4) Date: Nov. 22, 2009

(87) PCT Pub. No.: WO2008/147926
PCT Pub. Date: Dec. 4, 2008

(65) Prior Publication Data
US 2010/0172349 A1    Jul. 8, 2010

Related U.S. Application Data

(60) Provisional application No. 60/940,387, filed on May 25, 2007, provisional application No. 60/940,390, filed on May 25, 2007.

(51) Int. Cl.
*H04L 12/28* (2006.01)
(52) U.S. Cl. ........................................ 370/408
(58) Field of Classification Search .......... 370/351–357, 370/359–360, 369–370, 372, 375, 380, 386–390, 370/400, 408, 422, 427, 901, 902–903
See application file for complete search history.

(56) References Cited

U.S. PATENT DOCUMENTS 4,991,168 A * 2/1991 Richards ................. 370/381
5,018,129 A * 5/1991 Netravali et al. .......... 398/55

(Continued)

*Primary Examiner* — Derrick Ferris
*Assistant Examiner* — Omar Ghowrwal

(57) ABSTRACT

A generalized butterfly fat tree network comprising ($\log_d N$) stages is operated in strictly nonblocking manner for unicast and in rearrangeably nonblocking manner for arbitrary fan-out multicast when $s \geq 2$, and is operated in strictly nonblocking manner for arbitrary fan-out multicast when $s \geq 3$, includes a leaf stage consisting of an input stage having $$\frac{N}{d}$$

switches with each of them having d inlet links and s×d outgoing links connecting to its immediate succeeding stage switches, and an output stage having $$\frac{N}{d}$$

switches with each of them having d outlet links and s×d incoming links connecting from switches in its immediate succeeding stage. The network also has ($\log_d N$)−1 middle stages with each middle stage, excepting the root stage, having $$\frac{s \times N}{d}$$

switches, and each switch in the middle stage has d incoming links connecting from the switches in its immediate preceding stage, d incoming links connecting from the switches in its immediate succeeding stage, d outgoing links connecting to the switches in its immediate succeeding stage, d outgoing links connecting to the switches in its immediate preceding stage, and the root stage having $$\frac{s \times N}{d}$$

switches, and each switch in the middle stage has d incoming links connecting from the switches in its immediate preceding stage and d outgoing links connecting to the switches in its immediate preceding stage.

22 Claims, 20 Drawing Sheets

U.S. PATENT DOCUMENTS

| | | | | |
|---|---|---|---|---|
| 5,179,551 A * | 1/1993 | Turner | | 370/398 |
| 5,541,914 A * | 7/1996 | Krishnamoorthy et al. | | 370/427 |
| 5,689,506 A * | 11/1997 | Chiussi et al. | | 370/388 |
| 5,864,552 A * | 1/1999 | Du et al. | | 370/388 |
| 6,307,852 B1 * | 10/2001 | Fisher et al. | | 370/352 |
| 6,452,926 B1 * | 9/2002 | Wiklund | | 370/388 |
| 6,868,084 B2 * | 3/2005 | Konda | | 370/395.1 |
| 6,885,669 B2 * | 4/2005 | Konda | | 370/395.1 |
| 7,378,938 B2 * | 5/2008 | Konda | | 340/2.22 |
| 7,424,010 B2 * | 9/2008 | Konda | | 370/388 |
| 7,424,011 B2 * | 9/2008 | Konda | | 370/388 |
| 2004/0032866 A1 * | 2/2004 | Konda | | 370/388 |
| 2004/0056757 A1 * | 3/2004 | Konda | | 340/2.22 |
| 2005/0053061 A1 * | 3/2005 | Konda | | 370/388 |
| 2005/0063410 A1 * | 3/2005 | Konda | | 370/432 |
| 2005/0094644 A1 * | 5/2005 | Konda | | 370/395.4 |
| 2005/0105517 A1 * | 5/2005 | Konda | | 370/370 |
| 2005/0117573 A1 * | 6/2005 | Konda | | 370/388 |
| 2005/0117575 A1 * | 6/2005 | Konda | | 370/389 |
| 2005/0129043 A1 * | 6/2005 | Konda | | 370/412 |
| 2006/0159078 A1 * | 7/2006 | Konda | | 370/386 |
| 2006/0165085 A1 * | 7/2006 | Konda | | 370/395.1 |
| 2006/0268691 A1 * | 11/2006 | Ramanan | | 370/229 |
| 2007/0053356 A1 * | 3/2007 | Konda | | 370/390 |
| 2010/0135286 A1 * | 6/2010 | Konda | | 370/388 |
| 2011/0044329 A1 * | 2/2011 | Konda | | 370/388 |

* cited by examiner

FULLY CONNECTED GENERALIZED BUTTERFLY FAT TREE NETWORKS

CROSS REFERENCE TO RELATED APPLICATIONS

This application is related to and claims priority of PCT Application Serial No. PCT/US08/64603 entitled "FULLY CONNECTED GENERALIZED BUTTERFLY FAT TREE NETWORKS" by Venkat Konda assigned to the same assignee as the current application, filed May 22, 2008, the U.S. Provisional Patent Application Ser. No. 60/940,387 entitled "FULLY CONNECTED GENERALIZED BUTTERFLY FAT TREE NETWORKS" by Venkat Konda assigned to the same assignee as the current application, filed May 25, 2007, and the U.S. Provisional Patent Application Ser. No. 60/940,390 entitled "FULLY CONNECTED GENERALIZED MULTI-LINK BUTTERFLY FAT TREE NETWORKS" by Venkat Konda assigned to the same assignee as the current application, filed May 25, 2007.

This application is related to and incorporates by reference in its entirety the U.S. application Ser. No. 12/530,207 entitled "FULLY CONNECTED GENERALIZED MULTI-STAGE NETWORKS" by Venkat Konda assigned to the same assignee as the current application, filed Sep. 6, 2009, the PCT Application Serial No. PCT/US08/56064 entitled "FULLY CONNECTED GENERALIZED MULTI-STAGE NETWORKS" by Venkat Konda assigned to the same assignee as the current application, filed Mar. 6, 2008, the U.S. Provisional Patent Application Ser. No. 60/905,526 entitled "LARGE SCALE CROSSPOINT REDUCTION WITH NONBLOCKING UNICAST & MULTICAST IN ARBITRARILY LARGE MULTI-STAGE NETWORKS" by Venkat Konda assigned to the same assignee as the current application, filed Mar. 6, 2007, and the U.S. Provisional Patent Application Ser. No. 60/940,383 entitled "FULLY CONNECTED GENERALIZED MULTI-STAGE NETWORKS" by Venkat Konda assigned to the same assignee as the current application, filed May 25, 2007.

This application is related to and incorporates by reference in its entirety the U.S. patent application Ser. No. 12/601,274 entitled "FULLY CONNECTED GENERALIZED MULTI-LINK MULTI-STAGE NETWORKS" by Venkat Konda assigned to the same assignee as the current application filed concurrently, the PCT Application Serial No. PCT/US08/64604 entitled "FULLY CONNECTED GENERALIZED MULTI-LINK MULTI-STAGE NETWORKS" by Venkat Konda assigned to the same assignee as the current application, filed May 22, 2008, the U.S. Provisional Patent Application Ser. No. 60/940,389 entitled "FULLY CONNECTED GENERALIZED REARRANGEABLY NONBLOCKING MULTI-LINK MULTI-STAGE NETWORKS" by Venkat Konda assigned to the same assignee as the current application, filed May 25, 2007, the U.S. Provisional Patent Application Ser. No. 60/940,391 entitled "FULLY CONNECTED GENERALIZED FOLDED MULTI-STAGE NETWORKS" by Venkat Konda assigned to the same assignee as the current application, filed May 25, 2007 and the U.S. Provisional Patent Application Ser. No. 60/940,392 entitled "FULLY CONNECTED GENERALIZED STRICTLY NON-BLOCKING MULTI-LINK MULTI-STAGE NETWORKS" by Venkat Konda assigned to the same assignee as the current application, filed May 25, 2007.

This application is related to and incorporates by reference in its entirety the U.S. patent application Ser. No. 12/601,275 entitled "VLSI LAYOUTS OF FULLY CONNECTED GENERALIZED NETWORKS" by Venkat Konda assigned to the same assignee as the current application filed concurrently, the PCT Application Serial No. PCT/US08/64605 entitled "VLSI LAYOUTS OF FULLY CONNECTED GENERALIZED NETWORKS" by Venkat Konda assigned to the same assignee as the current application, filed May 22, 2008, and the U.S. Provisional Patent Application Ser. No. 60/940,394 entitled "VLSI LAYOUTS OF FULLY CONNECTED GENERALIZED NETWORKS" by Venkat Konda assigned to the same assignee as the current application, filed May 25, 2007.

This application is related to and incorporates by reference in its entirety the U.S. Provisional Patent Application Ser. No. 61/252,603 entitled "VLSI LAYOUTS OF FULLY CONNECTED NETWORKS WITH LOCALITY EXPLOITATION" by Venkat Konda assigned to the same assignee as the current application, filed Oct. 16, 2009.

This application is related to and incorporates by reference in its entirety the U.S. Provisional Patent Application Ser. No. 61/252,609 entitled "VLSI LAYOUTS OF FULLY CONNECTED GENERALIZED AND PYRAMID NETWORKS" by Venkat Konda assigned to the same assignee as the current application, filed Oct. 16, 2009.

BACKGROUND OF INVENTION

Clos switching network, Benes switching network, and Cantor switching network are a network of switches configured as a multi-stage network so that fewer switching points are necessary to implement connections between its inlet links (also called "inputs") and outlet links (also called "outputs") than would be required by a single stage (e.g. crossbar) switch having the same number of inputs and outputs. Clos and Benes networks are very popularly used in digital cross-connects, switch fabrics and parallel computer systems. However Clos and Benes networks may block some of the connection requests.

There are generally three types of nonblocking networks: strictly nonblocking; wide sense nonblocking; and rearrangeably nonblocking (See V. E. Benes, "Mathematical Theory of Connecting Networks and Telephone Traffic" Academic Press, 1965 that is incorporated by reference, as background). In a rearrangeably nonblocking network, a connection path is guaranteed as a result of the networks ability to rearrange prior connections as new incoming calls are received. In strictly nonblocking network, for any connection request from an inlet link to some set of outlet links, it is always possible to provide a connection path through the network to satisfy the request without disturbing other existing connections, and if more than one such path is available, any path can be selected without being concerned about realization of future potential connection requests. In wide-sense nonblocking networks, it is also always possible to provide a connection path through the network to satisfy the request without disturbing other existing connections, but in this case the path used to satisfy the connection request must be carefully selected so as to maintain the nonblocking connecting capability for future potential connection requests.

Butterfly Networks, Banyan Networks, Batcher-Banyan Networks, Baseline Networks, Delta Networks, Omega Networks and Flip networks have been widely studied particularly for self routing packet switching applications. Also Benes Networks with radix of two have been widely studied and it is known that Benes Networks of radix two are shown to be built with back to back baseline networks which are rearrangeably nonblocking for unicast connections.

U.S. Pat. No. 5,451,936 entitled "Non-blocking Broadcast Network" granted to Yang et al. is incorporated by reference herein as background of the invention. This patent describes a number of well known nonblocking multi-stage switching network designs in the background section at column 1, line 22 to column 3, 59. An article by Y. Yang, and G. M., Masson entitled, "Non-blocking Broadcast Switching Networks" IEEE Transactions on Computers, Vol. 40, No. 9, September 1991 that is incorporated by reference as background indicates that if the number of switches in the middle stage, m, of a three-stage network satisfies the relation $m \geq \min((n-1)(x+r^{1/x}))$ where $1 \leq x \leq \min(n-1,r)$, the resulting network is nonblocking for multicast assignments. In the relation, r is the number of switches in the input stage, and n is the number of inlet links in each input switch.

U.S. Pat. No. 6,885,669 entitled "Rearrangeably Nonblocking Multicast Multi-stage Networks" by Konda showed that three-stage Clos network is rearrangeably nonblocking for arbitrary fan-out multicast connections when $m \geq 2 \times n$. And U.S. Pat. No. 6,868,084 entitled "Strictly Nonblocking Multicast Multi-stage Networks" by Konda showed that three-stage Clos network is strictly nonblocking for arbitrary fan-out multicast connections when $m \geq 3 \times n - 1$.

In general multi-stage networks for stages of more than three and radix of more than two are not well studied. An article by Charles Clos entitled "A Study of Non-Blocking Switching Networks" The Bell Systems Technical Journal, Volume XXXII, January 1953, No. 1, pp. 406-424 showed a way of constructing large multi-stage networks by recursive substitution with a crosspoint complexity of $d^2 \times N \times (\log_d N)^{2.58}$ for strictly nonblocking unicast network. Similarly U.S. Pat. No. 6,885,669 entitled "Rearrangeably Nonblocking Multicast Multi-stage Networks" by Konda showed a way of constructing large multi-stage networks by recursive substitution for rearrangeably nonblocking multicast network. An article by D. G. Cantor entitled "On Non-Blocking Switching Networks" 1: pp. 367-377, 1972 by John Wiley and Sons, Inc., showed a way of constructing large multistage networks with a crosspoint complexity of $d^2 \times N \times (\log_d N)^2$ for strictly nonblocking unicast, (by using $\log_d N$ number of Benes Networks for d=2) and without counting the crosspoints in multiplexers and demultiplexers. Jonathan Turner studied the cascaded Benes Networks with radices larger than two, for nonblocking multicast with 10 times the crosspoint complexity of that of nonblocking unicast for a network of size N=256.

The crosspoint complexity of all these networks is prohibitively large to implement the interconnect for multicast connections particularly in field programmable gate array (FPGA) devices, programmable logic devices (PLDs), field programmable interconnect Chips (FPICs), digital crossconnects, switch fabrics and parallel computer systems.

SUMMARY OF INVENTION

A generalized butterfly fat tree network comprising ($\log_d N$) stages is operated in strictly nonblocking manner for unicast includes a leaf stage consisting of an input stage having $$\frac{N}{d}$$

switches with each of them having d inlet links and $2 \times d$ outgoing links connecting to its immediate succeeding stage switches, and an output stage having $$\frac{N}{d}$$

switches with each of them having d outlet links and $2 \times d$ incoming links connecting from switches in its immediate succeeding stage. The network also has ($\log_d N$)-1 middle stages with each middle stage, excepting the root stage, having $$\frac{2 \times N}{d}$$

switches, and each switch in the middle stage has d incoming links connecting from the switches in its immediate preceding stage, d incoming links connecting from the switches in its immediate succeeding stage, d outgoing links connecting to the switches in its immediate succeeding stage, d outgoing links connecting to the switches in its immediate preceding stage, and the root stage having $$\frac{2 \times N}{d}$$

switches, and each switch in the middle stage has d incoming links connecting from the switches in its immediate preceding stage and d outgoing links connecting to the switches in its immediate preceding stage. Also the same generalized butterfly fat tree network is operated in rearrangeably nonblocking manner for arbitrary fan-out multicast and each multicast connection is set up by use of at most two outgoing links from the input stage switch.

A generalized butterfly fat tree network comprising ($\log_d N$) stages is operated in strictly nonblocking manner for multicast includes a leaf stage consisting of an input stage having $$\frac{N}{d}$$

switches with each of them having d inlet links and $3 \times d$ outgoing links connecting to its immediate succeeding stage switches, an output stage having $$\frac{N}{d}$$

switches with each of them having d outlet links and $3 \times d$ incoming links connecting from switches in its immediate succeeding stage. The network also has ($\log_d N$)-1 middle stages with each middle stage, excepting the root stage, having $$\frac{3 \times N}{d}$$

switches, and each switch in the middle stage has d incoming links connecting from the switches in its immediate preceding stage, d incoming links connecting from the switches in its immediate succeeding stage, d outgoing links connecting to the switches in its immediate succeeding stage, d outgoing links connecting to the switches in its immediate preceding stage, and the root stage having $$\frac{3 \times N}{d}$$

switches, and each switch in the middle stage has d incoming links connecting from the switches in its immediate preceding stage and d outgoing links connecting to the switches in its immediate preceding stage.

BRIEF DESCRIPTION OF DRAWINGS

FIG. 5A1 is a diagram 500A1 of an exemplary prior art implementation of a two by two switch; FIG. 5A2 is a diagram 500A2 for programmable integrated circuit prior art implementation of the diagram 500A1 of FIG. 5A1; FIG. 5A3 is a diagram 500A3 for one-time programmable integrated circuit prior art implementation of the diagram 500A1 of FIG.

5A1; FIG. 5A4 is a diagram 500A4 for integrated circuit placement and route implementation of the diagram 500A1 of FIG. 5A1.

DETAILED DESCRIPTION OF THE INVENTION

Figure 1A:
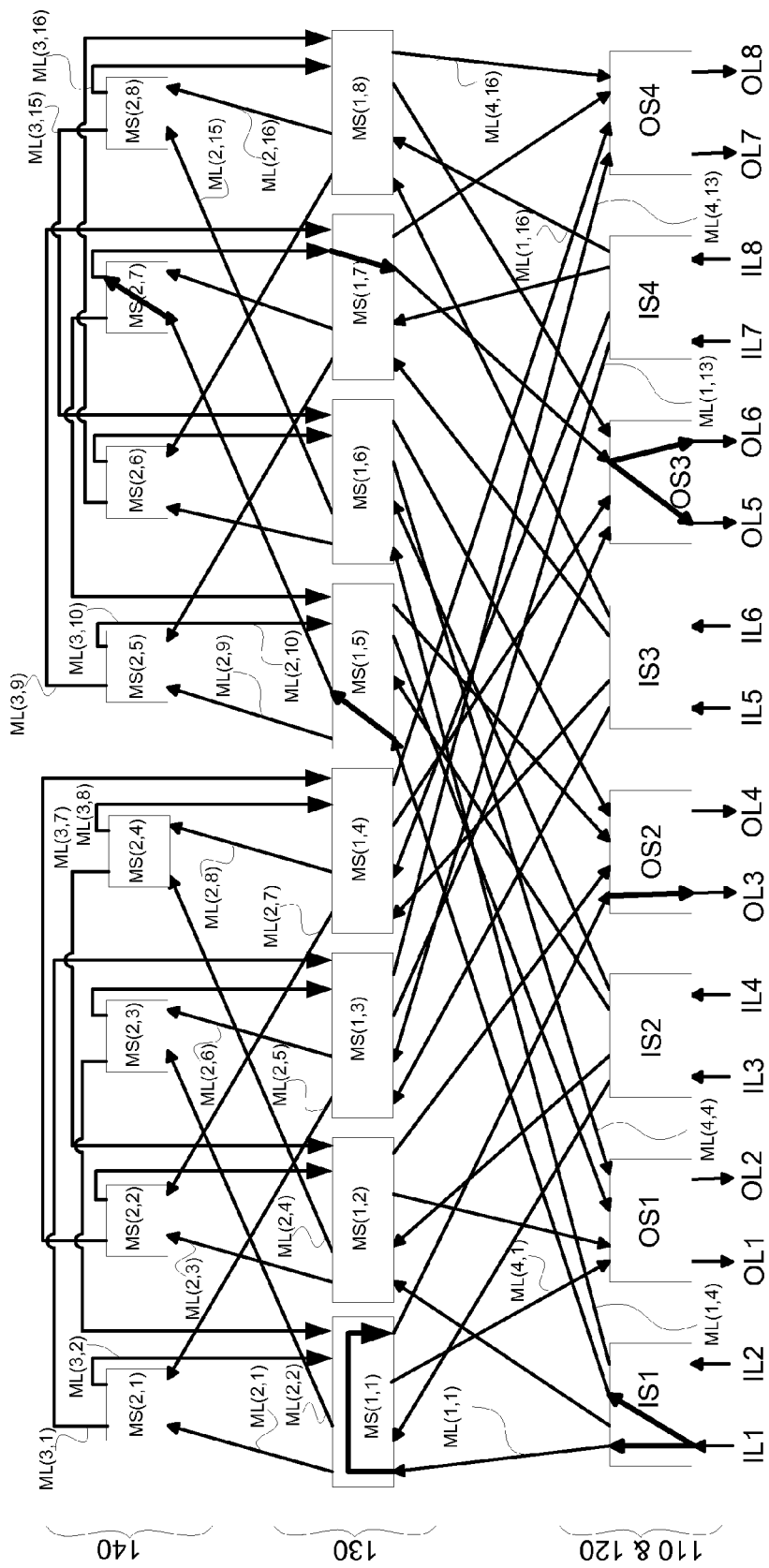
FIG. 1A is a diagram 100A of an exemplary Symmetrical Butterfly fat tree network $V_{bft}(N,d,s)$ having inverse Benes connection topology of three stages with N=8, d=2 and s=2 with exemplary multicast connections, strictly nonblocking network for unicast connections and rearrangeably nonblocking network for arbitrary fan-out multicast connections, in accordance with the invention.

The present invention is concerned with the design and operation of large scale crosspoint reduction using arbitrarily large Butterfly fat tree networks and Multi-link Butterfly fat tree networks for broadcast, unicast and multicast connections. Particularly Butterfly fat tree networks and Multi-link Butterfly fat tree networks with stages more than or equal to three and radices greater than or equal to two offer large scale crosspoint reduction when configured with optimal links as disclosed in this invention.

When a transmitting device simultaneously sends information to more than one receiving device, the one-to-many connection required between the transmitting device and the receiving devices is called a multicast connection. A set of multicast connections is referred to as a multicast assignment. When a transmitting device sends information to one receiving device, the one-to-one connection required between the transmitting device and the receiving device is called unicast connection. When a transmitting device simultaneously sends information to all the available receiving devices, the one-to-all connection required between the transmitting device and the receiving devices is called a broadcast connection.

In general, a multicast connection is meant to be one-to-many connection, which includes unicast and broadcast connections. A multicast assignment in a switching network is nonblocking if any of the available inlet links can always be connected to any of the available outlet links.

In certain butterfly fat tree networks and multi-link butterfly fat tree networks of the type described herein, any connection request of arbitrary fan-out, i.e. from an inlet link to an outlet link or to a set of outlet links of the network, can be satisfied without blocking if necessary by rearranging some of the previous connection requests. In certain other Butterfly fat tree networks of the type described herein, any connection request of arbitrary fan-out, i.e. from an inlet link to an outlet link or to a set of outlet links of the network, can be satisfied without blocking with never needing to rearrange any of the previous connection requests.

In certain butterfly fat tree networks and multi-link butterfly fat tree networks of the type described herein, any connection request of unicast from an inlet link to an outlet link of the network, can be satisfied without blocking if necessary by rearranging some of the previous connection requests. In certain other Butterfly fat tree networks of the type described herein, any connection request of unicast from an inlet link to an outlet link of the network, can be satisfied without blocking with never needing to rearrange any of the previous connection requests.

Nonblocking configurations for other types of networks with numerous connection topologies and scheduling methods are disclosed as follows:

1) Strictly and rearrangeably nonblocking for arbitrary fan-out multicast and unicast for generalized multi-stage networks $V(N_1,N_2,d,s)$ with numerous connection topologies and the scheduling methods are described in detail in the U.S. application Ser. No. 12/530,207 that is incorporated by reference above.

2) Rearrangeably nonblocking for arbitrary fan-out multicast and unicast, and strictly nonblocking for unicast for generalized multi-link multi-stage networks $V_{mlink}(N_1,N_2,d,s)$ and generalized folded multi-link multi-stage networks $V_{fold-mlink}(N_1,N_2,d,s)$ with numerous connection topologies and the scheduling methods are described in detail in the PCT Application Serial No. PCT/US08/64604 that is incorporated by reference above.

3) Strictly and rearrangeably nonblocking for arbitrary fan-out multicast and unicast for generalized folded multi-stage networks $V_{fold}(N_1,N_2,d,s)$ with numerous connection topologies and the scheduling methods are described in detail in the PCT Application Serial No. PCT/US08/64604 that is incorporated by reference above.

4) Strictly nonblocking for arbitrary fan-out multicast for generalized multi-link multi-stage networks $V_{mlink}(N_1,N_2,d,s)$ and generalized folded multi-link multi-stage networks $V_{fold-mlink}(N_1,N_2,d,s)$ with numerous connection topologies and the scheduling methods are described in detail in the PCT Application Serial No. PCT/US08/64604 that is incorporated by reference above.

5) VLSI layouts of generalized multi-stage networks $V(N_1,N_2,d,s)$, generalized folded multi-stage networks $V_{fold}(N_1,N_2,d,s)$ generalized butterfly fat tree networks $V_{bft}(N_1,N_2,d,s)$, generalized multi-link multi-stage networks $V_{mlink}(N_1,N_2,d,s)$, generalized folded multi-link multi-stage networks $V_{fold-mlink}(N_1,N_2,d,s)$, generalized multi-link butterfly fat tree networks $V_{mlink-bft}(N_1,N_2,d,s)$, and generalized hypercube networks $V_{hcube}(N_1,N_2,d,s)$ for s=1, 2, 3 or any number in general, are described in detail in the PCT Application Serial No. PCT/US08/64605 that is incorporated by reference above.

6) VLSI layouts of numerous types of multi-stage networks with locality exploitation are described in U.S. Provisional Patent Application Ser. No. 61/252,603 that is incorporated by reference above.

7) VLSI layouts of numerous types of multistage pyramid networks are described in U.S. Provisional Patent Application Ser. No. 61/252,609 that is incorporated by reference above.

Butterfly Fat Tree Embodiments:
Symmetric RNB Embodiments:

Referring to FIG. 1A, in one embodiment, an exemplary symmetrical butterfly fat tree network 100A with three stages of twenty four switches for satisfying communication requests, such as setting up a telephone call or a data call, or a connection between configurable logic blocks, between an input stage 110 and output stage 120 via middle stages 130, and 140 is shown where input stage 110 consists of four, two by four switches IS1-IS4 and output stage 120 consists of four, four by two switches OS1-OS4. Input stage 110 and output stage 120 together belong to leaf stage. And all the middle stages excepting root stage namely middle stage 130 consists of eight, four by four switches MS(1,1)-MS(1,8), and root stage i.e., middle stage 140 consists of eight, two by two switches MS(2,1)-MS(2,8).

Such a network can be operated in strictly non-blocking manner for unicast connections, because the switches in the input stage 110 are of size two by four, the switches in output stage 120 are of size four by two, and there are eight switches in each of middle stage 130 and middle stage 140. Such a network can be operated in rearrangeably non-blocking manner for multicast connections, because the switches in the input stage 110 are of size two by four, the switches in output stage 120 are of size four by two, and there are eight switches in each of middle stage 130 and middle stage 140.

In one embodiment of this network each of the input switches IS1-IS4 and output switches OS1-OS4 are crossbar switches. The number of switches of input stage 110 and of output stage 120 can be denoted in general with the variable $$\frac{N}{d},$$

where N is the total number of inlet links or outlet links. Input stage 110 and output stage 120 together belong to leaf stage. The number of middle switches in each middle stage is denoted by $$2 \times \frac{N}{d}.$$

The size of each input switch IS1-IS4 can be denoted in general with the notation d*2d and each output switch OS1-OS4 can be denoted in general with the notation 2d*d. Likewise, the size of each switch in any of the middle stages can be denoted as 2d*2d excepting that the size of each switch in middle stage 140 is denoted as d*d. (In another embodiment, the size of each switch in any of the middle stages other than the middle stage 140, can be implemented as d*2d and d*d since the down coming middle links are never setup to the up going middle links For example in network 100A of FIG. 1A, the down coming middle links ML(3,2) and ML(3,5) are never setup to the up going middle links ML(2,1) and ML(2,2) for the middle switch MS(1,1). So middle switch MS(1,1) can be implemented as a two by four switch with middle links ML(1,1) and ML(1,3) as inputs and middle links ML(2,1), ML(2,2), ML(4,1) and ML(4,2) as outputs; and a two by two switch with middle links ML(3,2) and ML(3,5) as inputs and middle links ML(4,1) and ML(4,2) as outputs).

Middle stage 140 is called as root stage. A switch as used herein can be either a crossbar switch, or a network of switches each of which in turn may be a crossbar switch or a network of switches. A symmetric Butterfly fat tree network can be represented with the notation $V_{bft}(N,d,s)$, where N represents the total number of inlet links of all input switches (for example the links IL1-IL8), d represents the inlet links of each input switch or outlet links of each output switch, and s is the ratio of number of outgoing links from each input switch to the inlet links of each input switch. Although it is not necessary that there be the same number of inlet links IL1-IL8 as there are outlet links OL1-OL8, in a symmetrical network they are the same.

Each of the $$\frac{N}{d}$$

input switches IS1-IS4 are connected to exactly 2×d switches in middle stage 130 through 2×d links (for example input switch IS1 is connected to middle switches MS(1,1), MS(1,2), MS(1,5) and MS(1,6) through the links ML(1,1), ML(1,2), ML(1,3) and ML(1,4) respectively).

Each of the $$2 \times \frac{N}{d}$$

middle switches MS(1,1)-MS(1,8) in the middle stage 130 are connected from exactly d input switches through d links (for example the links ML(1,1) and ML(1,5) are connected to the middle switch MS(1,1) from input switch IS1 and IS2 respectively) and are also connected from exactly d switches in middle stage 140 through d links (for example the links ML(3,1) and ML(3,6) are connected to the middle switch MS(1,1) from middle switches MS(2,1) and MS(2,3) respectively).

Each of the $$2 \times \frac{N}{d}$$

middle switches MS(1,1)-MS(1,8) in the middle stage 130 are connected to exactly d switches in middle stage 140 through d links (for example the links ML(2,1) and ML(2,2) are connected from middle switch MS(1,1) to middle switch MS(2,1) and MS(2,3) respectively) and also are connected to exactly d output switches in output stage 120 through d links (for example the links ML(4,1) and ML(4,2) are connected to output switches OS1 and OS2 respectively from middle switches MS(1,1)).

Similarly each of the $$2 \times \frac{N}{d}$$

middle switches MS(2,1)-MS(2,8) in the middle stage 140 are connected from exactly d switches in middle stage 130 through d links (for example the links ML(2,1) and ML(2,5) are connected to the middle switch MS(2,1) from middle switches MS(1,1) and MS(1,3) respectively) and also are connected to exactly d switches in middle stage 130 through d links (for example the links ML(3,1) and ML(3,2) are connected from middle switch MS(2,1) to middle switch MS(1,1) and MS(1,3) respectively).

Each of the $$\frac{N}{d}$$

output switches OS1-OS4 are connected from exactly 2×d switches in middle stage 130 through 2×d links (for example output switch OS1 is connected from middle switches MS(1,1), MS(1,2), MS(1,5) and MS(1,6) through the links ML(4,1), ML(4,3), ML(4,9) and ML(4,11) respectively).

Finally the connection topology of the network 100A shown in FIG. 1A is known to be back to back inverse Benes connection topology.

In the three embodiments of FIG. 1A, FIG. 1A1 and FIG. 1A2 the connection topology is different. That is the way the links ML(1,1)-ML(1,16), ML(2,1)-ML(2,16), ML(3,1)-ML(3,16), and ML(4,1)-ML(4,16) are connected between the respective stages is different. Even though only three embodiments are illustrated, in general, the network $V_{bft}(N,d,s)$ can comprise any arbitrary type of connection topology. For example the connection topology of the network $V_{bft}(N,d,s)$ may be back to back Benes networks, Delta Networks and many more combinations. The applicant notes that the fundamental property of a valid connection topology of the $V_{bft}(N,d,s)$ network is, when no connections are setup from any input link all the output links should be reachable. Based on this property numerous embodiments of the network $V_{bft}(N,d,s)$ can be built. The embodiments of FIG. 1A, FIG. 1A1, and FIG. 1A2 are only three examples of network $V_{bft}(N,d,s)$.

In the three embodiments of FIG. 1A, FIG. 1A1 and FIG. 1A2, each of the links ML(1,1)-ML(1,16), ML(2,1)-ML(2,16), ML(3,1)-ML(3,16) and ML(4,1)-ML(4,16) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,8) and MS(2,1)-MS(2,8) are referred to as middle switches or middle ports. The middle stage 130 is also referred to as root stage and middle stage switches MS(1,2)-MS(2,8) are referred to as root stage switches.

In the example illustrated in FIG. 1A (or in FIG. 1A1, or in FIG. 1A2), a fan-out of four is possible to satisfy a multicast connection request if input switch is IS2, but only two switches in middle stage 130 will be used. Similarly, although a fan-out of three is possible for a multicast connection request if the input switch is IS1, again only a fan-out of two is used. The specific middle switches that are chosen in middle stage 130 when selecting a fan-out of two is irrelevant so long as at most two middle switches are selected to ensure that the connection request is satisfied. In essence, limiting the fan-out from input switch to no more than two middle switches permits the network 100A (or 100A1, or 100A2), to be operated in rearrangeably nonblocking manner in accordance with the invention.

The connection request of the type described above can be unicast connection request, a multicast connection request or a broadcast connection request, depending on the example. In case of a unicast connection request, a fan-out of one is used, i.e. a single middle stage switch in middle stage 130 is used to satisfy the request. Moreover, although in the above-described embodiment a limit of two has been placed on the fan-out into the middle stage switches in middle stage 130, the limit can be greater depending on the number of middle stage switches in a network (while maintaining the rearrangeably nonblocking nature of operation of the network for multicast connections). However any arbitrary fan-out may be used within any of the middle stage switches and the output stage switches to satisfy the connection request.

Figure 1B:
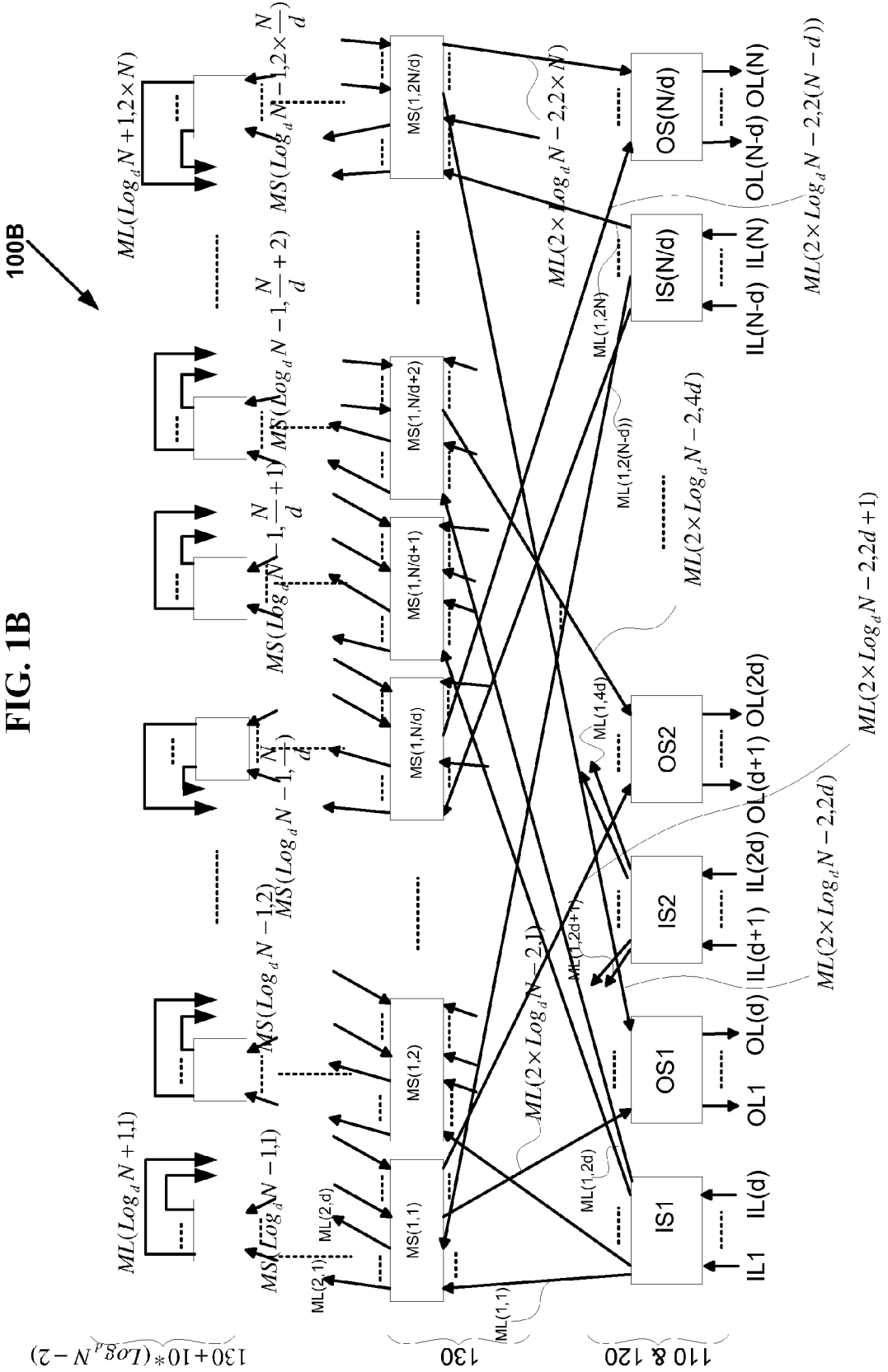
FIG. 1B is a diagram 100B of a general symmetrical Butterfly fat tree network $V_{bft}(N,d,s)$ with ($\log_d N$) stages strictly nonblocking network for unicast connections and rearrangeably nonblocking network for arbitrary fan-out multicast connections in accordance with the invention.

Generalized Symmetric RNB Embodiments:

Network 100B of FIG. 1B is an example of general symmetrical Butterfly fat tree network $V_{bft}(N,d,s)$ with $(\log_d N)$ stages. The general symmetrical Butterfly fat tree network $V_{bft}(N,d,s)$ can be operated in rearrangeably nonblocking manner for multicast when s=2 according to the current invention. Also the general symmetrical Butterfly fat tree network $V_{bft}(N,d,s)$ can be operated in strictly nonblocking manner for unicast if s=2 according to the current invention. (And in the example of FIG. 1B, s=2). The general symmetrical Butterfly fat tree network $V_{bft}(N,d,s)$ with $(\log_d N)$ stages has d inlet links for each $$\frac{N}{d}$$

input switches IS1-IS(N/d) (for example the links IL1-IL(d) to the input switch IS1) and 2×d outgoing links for each of $$\frac{N}{d}$$

input switches IS1-IS(N/d) (for example the links ML(1,1)-ML(1,2d) to the input switch IS1). There are d outlet links for each of $$\frac{N}{d}$$

output switches OS1-OS(N/d) (for example the links OL1-OL(d) to the output switch OS1) and 2×d incoming links for each of $$\frac{N}{d}$$

output switches OS1-OS(N/d) (for example ML(2×Log$_d$ N−2,1)–ML(2×Log$_d$ N−2,2×d) to the output switch OS1).

Each of the $$\frac{N}{d}$$

input switches IS1-IS(N/d) are connected to exactly 2×d switches in middle stage 130 through 2×d links (for example input switch IS1 is connected to middle switches MS(1,1)-MS(1,d) through the links ML(1,1)-ML(1,d) and to middle switches MS(1,N/d+1)-MS(1,{N/d}+d) through the links ML(1,d+1)-ML(1,2d) respectively.

Each of the $$2 \times \frac{N}{d}$$

middle switches MS(1,1)-MS(1,2N/d) in the middle stage 130 are connected from exactly d input switches through d links and also are connected to exactly d switches in middle stage 140 through d links.

Similarly each of the $$2 \times \frac{N}{d}$$

middle switches MS(1,1)-MS(1,2N/d) in the middle stage 130 are also connected from exactly d switches in middle stage 140 through d links and also are connected to exactly d output switches in output stage 120 through d links.

Similarly each of the $$2 \times \frac{N}{d}$$

middle switches $$MS(\text{Log}_d N - 1, 1) - MS\left(\text{Log}_d N - 1, 2 \times \frac{N}{d}\right)$$

in the middle stage 130+10*(Log$_d$ N−2) are connected from exactly d switches in middle stage 130+10*(Log$_d$ N−3) through d links and also are connected to exactly d switches in middle stage 130+10*(Log$_d$ N−1) through d links.

Each of the $$\frac{N}{d}$$

output switches OS1-OS(N/d) are connected from exactly 2×d switches in middle stage 130 through 2×d links.

As described before, again the connection topology of a general $V_{bft}(N,d,s)$ may be any one of the connection topologies. For example the connection topology of the network $V_{bft}(N,d,s)$ may be back to back inverse Benes networks, back to back Omega networks, back to back Benes networks, Delta Networks and many more combinations. The applicant notes that the fundamental property of a valid connection topology of the general $V_{bft}(N,d,s)$ network is, when no connections are setup from any input link if any output link should be reachable. Based on this property numerous embodiments of the network $V_{bft}(N,d,s)$ can be built. The embodiments of FIG. 1A, FIG. 1A1, and FIG. 1A2 are three examples of network $V_{bft}(N,d,s)$.

The general symmetrical Butterfly fat tree network $V_{bft}(N,d,s)$ can be operated in rearrangeably nonblocking manner for multicast when $s \geq 2$ according to the current invention. Also the general symmetrical Butterfly fat tree network $V_{bft}(N,d,s)$ can be operated in strictly nonblocking manner for unicast if $s \geq 2$ according to the current invention.

Every switch in the Butterfly fat tree networks discussed herein has multicast capability. In a $V_{bft}(N,d,s)$ network, if a network inlet link is to be connected to more than one outlet link on the same output switch, then it is only necessary for the corresponding input switch to have one path to that output switch. This follows because that path can be multicast within the output switch to as many outlet links as necessary. Multicast assignments can therefore be described in terms of connections between input switches and output switches. An existing connection or a new connection from an input switch to r' output switches is said to have fan-out r'. If all multicast assignments of a first type, wherein any inlet link of an input switch is to be connected in an output switch to at most one outlet link are realizable, then multicast assignments of a second type, wherein any inlet link of each input switch is to be connected to more than one outlet link in the same output switch, can also be realized. For this reason, the following discussion limited to general multicast connections of the first type (with fan-out r', $$1 \leq r' \leq \frac{N}{d})$$

although the same discussion is applicable to the second type.

To characterize a multicast assignment, for each inlet link $$i \in \left\{1, 2, \ldots, \frac{N}{d}\right\},$$

let $I_i = O$, where $$O \subset \left\{1, 2, \ldots, \frac{N}{d}\right\},$$

denote the subset of output switches to which inlet link i is to be connected in the multicast assignment. For example, the network of FIG. 1A shows an exemplary three-stage network, namely $V_{bft}(8,2,2)$, with the following multicast assignment $I_1 = \{2,3\}$ and all other $I_j = \phi$ for $j = [2-8]$. It should be noted that the connection $I_1$ fans out in the first stage switch IS1 into middle switches MS(1,1) and MS(1,5) in middle stage 130, and fans out in middle switches MS(1,1) and MS(1,5) only once into output switch OS2 in output stage 120 and middle switch MS(2,7) in middle stage 140 respectively.

The connection $I_1$ also fans out in middle switch MS(2,7) only once into middle switches MS(3,1) and MS(3,7) respectively in middle stage 150. The connection $I_1$ also fans out in middle switch MS(1,7) only once into output switch OS3 in output stage 120. Finally the connection $I_1$ fans out once in the output stage switch OS2 into outlet link OL3 and in the output stage switch OS3 twice into the outlet links OL5 and OL6. In accordance with the invention, each connection can fan out in the input stage switch into at most two middle stage switches in middle stage 130.

Figure 1C:
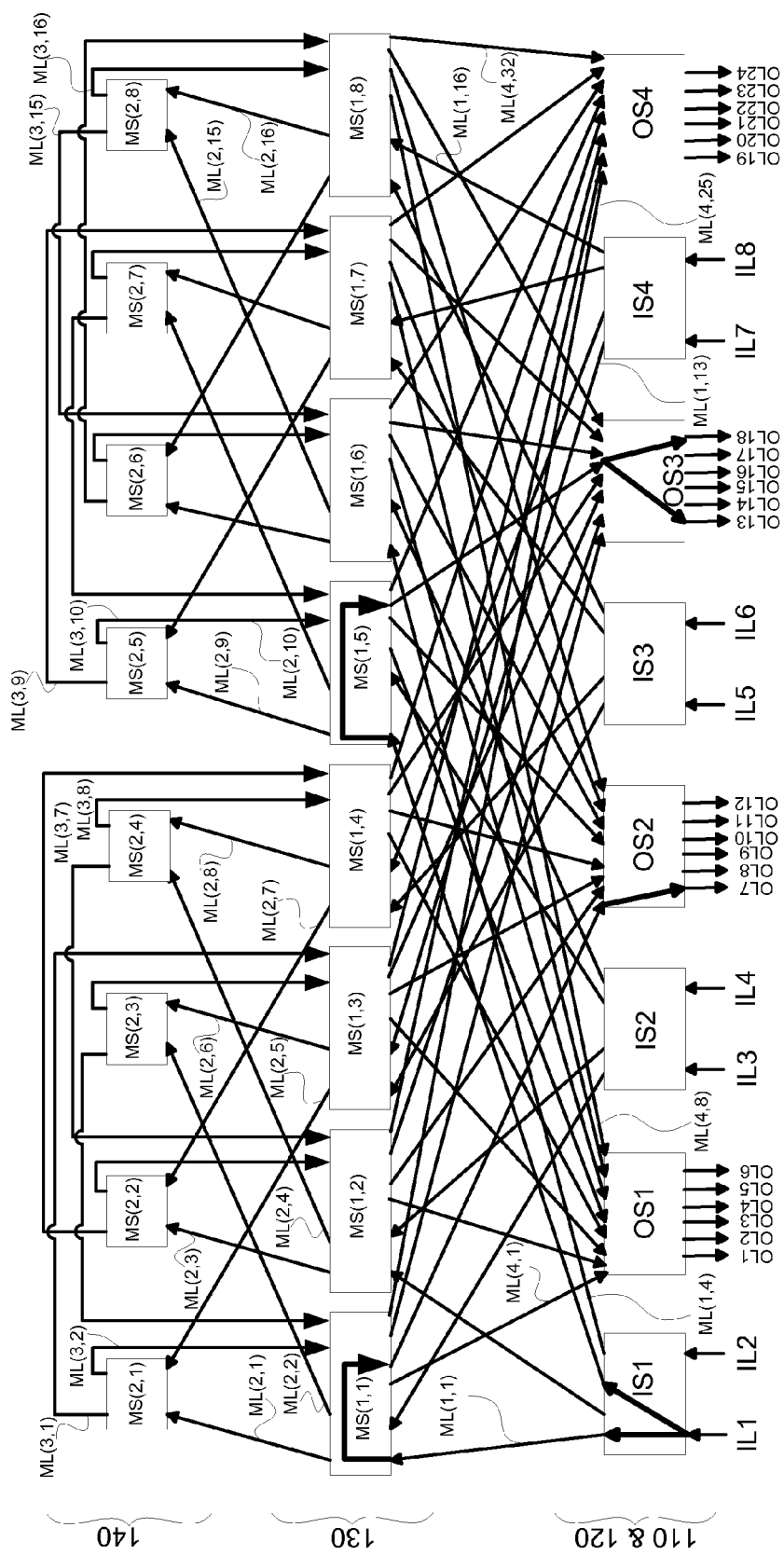
FIG. 1C is a diagram 100C of an exemplary Asymmetrical Butterfly fat tree network $V_{bft}(N_1,N_2,d,2)$ having inverse Benes connection topology of three stages with $N_1=8$, $N_2=p*N_1=24$ where p=3, and d=2 with exemplary multicast connections, strictly nonblocking network for unicast connections and rearrangeably nonblocking network for arbitrary fan-out multicast connections, in accordance with the invention.

Asymmetric RNB ($N_2 > N_1$) Embodiments:

Referring to FIG. 1C, in one embodiment, an exemplary asymmetrical Butterfly fat tree network 100C with three stages of twenty four switches for satisfying communication requests, such as setting up a telephone call or a data call, or a connection between configurable logic blocks, between an input stage 110 and output stage 120 via middle stages 130 and 140 is shown where input stage 110 consists of four, two by four switches IS1-IS4 and output stage 120 consists of four, eight by six switches OS1-OS4. Input stage 110 and output stage 120 together belong to leaf stage. Middle stage 130 consists of eight, four by six switches MS(1,1)-MS(1,8) and middle stage 140 consists of eight, two by two switches MS(2,1)-MS(2,8).

Such a network can be operated in strictly non-blocking manner for unicast connections, because the switches in the input stage 110 are of size two by four, the switches in output stage 120 are of size eight by six, and there are eight switches in each of middle stage 130 and middle stage 140. Such a network can be operated in rearrangeably non-blocking manner for multicast connections, because the switches in the input stage 110 are of size two by four, the switches in output stage 120 are of size eight by six, and there are eight switches of size four by six in middle stage 130 and eight switches of size two by two in middle stage 140.

In one embodiment of this network each of the input switches IS1-IS4 and output switches OS1-OS4 are crossbar switches. The number of switches of input stage 110 and of output stage 120 can be denoted in general with the variable $$\frac{N_1}{d},$$

$N_1$ is the total number of inlet links or and $N_2$ is the total number of outlet links and $N_2 > N_1$ and $N_2 = p*N_1$ where $p > 1$. The number of middle switches in each middle stage is denoted by $$2 \times \frac{N_1}{d}.$$

The size of each input switch IS1-IS4 can be denoted in general with the notation $d*2d$ and each output switch OS1-OS4 can be denoted in general with the notation $(d+d_2)*d$, where $$d_2 = N_2 \times \frac{d}{N_1} = p \times d.$$

The size of each switch in middle stage 130 can be denoted as $2d*(d+d_2)$. The size of each switch in the root stage (i.e., middle stage 140) can be denoted as d*d. The size of each switch in all the middle stages excepting middle stage 130 and root stage can be denoted as $2d*2d$ (In network 100C of FIG. 1C, there is no such middle stage). (In another embodiment, the size of each switch in any of the middle stages other than the middle stage 140, can be implemented as d*2d and d*d since the down coming middle links are never setup to the up going middle links. For example in network 100C of FIG. 1C, the down coming middle links ML(3,2) and ML(3,5) are never setup to the up going middle links ML(2,1) and ML(2, 2) for the middle switch MS(1,1). So middle switch MS(1,1) can be implemented as a two by four switch with middle links ML(1,1) and ML(1,3) as inputs and middle links ML(2,1), ML(2,2), ML(4,1) and ML(4,2) as outputs; and a two by two switch with middle links ML(3,2) and ML(3,5) as inputs and middle links ML(4,1) and ML(4,2) as outputs).

A switch as used herein can be either a crossbar switch, or a network of switches each of which in turn may be a crossbar switch or a network of switches. An asymmetric Butterfly fat tree network can be represented with the notation $V_{bft}(N_1,N_2,d,s)$, where $N_1$ represents the total number of inlet links of all input switches (for example the links IL1-IL8), $N_2$ represents the total number of outlet links of all output switches (for example the links OL1-OL24), d represents the inlet links of each input switch where $N_2 > N_1$, and s is the ratio of number of outgoing links from each input switch to the inlet links of each input switch.

Each of the $$\frac{N_1}{d}$$

input switches IS1-IS4 are connected to exactly 2×d switches in middle stage 130 through 2×d links (for example input switch IS1 is connected to middle switches MS(1,1), MS(1, 2), MS(1,5) and MS(1,6) through the links ML(1,1), ML(1, 2), ML(1,3) and ML(1,4) respectively).

Each of the $$2 \times \frac{N_1}{d}$$

middle switches MS(1,1)-MS(1,8) in the middle stage 130 are connected from exactly d input switches through d links (for example the links ML(1,1) and ML(1,5) are connected to the middle switch MS(1,1) from input switch IS1 and IS2 respectively) and are also connected from exactly d switches in middle stage 140 through d links (for example the links ML(3,1) and ML(3,6) are connected to the middle switch MS(1,1) from middle switches MS(2,1) and MS(2,3) respectively).

Similarly each of the $$2 \times \frac{N_1}{d}$$

middle switches MS(1,1)-MS(1,8) in the middle stage 130 are connected to exactly d switches in middle stage 140 through d links (for example the links ML(2,1) and ML(2,2) are connected from middle switch MS(1,1) to middle switch MS(2,1) and MS(2,3) respectively) and also are connected to exactly $$\frac{d+d_2}{2}$$

output switches in output stage 120 through $$\frac{d+d_2}{2}$$

links (for example the links ML(4,1), ML(4,2), ML(4,3) and ML(4,4) are connected to output switches OS1, OS2, OS3, and OS4 respectively from middle switch MS(1,1)).

Similarly each of the $$2 \times \frac{N_1}{d}$$

middle switches MS(2,1)-MS(2,8) in the middle stage 140 are connected from exactly d switches in middle stage 130 through d links (for example the links ML(2,1) and ML(2,5) are connected to the middle switch MS(2,1) from middle switches MS(1,1) and MS(1,3) respectively) and also are connected to exactly d switches in middle stage 130 through d links (for example the links ML(3,1) and ML(3,2) are connected from middle switch MS(2,1) to middle switch MS(1,1) and MS(1,3) respectively).

Each of the $$\frac{N_1}{d}$$

output switches OS1-OS4 are connected from exactly $d+d_2$ switches in middle stage 130 through $d+d_2$ links (for example output switch OS1 is connected from middle switches MS(1, 1), MS(1,2), MS(1,3), MS(1,4), MS(1,5), MS(1,6), MS(1,7), and MS(1,8) through the links ML(4,1), ML(4,5), ML(4,9), ML(4,13), ML(4,17), ML(4,21), ML(4,25) and ML(4,29) respectively).

Finally the connection topology of the network 100C shown in FIG. 1C is known to be back to back inverse Benes connection topology.

In the three embodiments of FIG. 1C, FIG. 1C1 and FIG. 1C2 the connection topology is different. That is the way the links ML(1,1)-ML(1,16), ML(2,1)-ML(2,16), ML(3,1)-ML(3,16), and ML(4,1)-ML(4,32) are connected between the respective stages is different. Even though only three embodiments are illustrated, in general, the network $V_{bft}(N_1,N_2,d,s)$ can comprise any arbitrary type of connection topology. For example the connection topology of the network $V_{bft}(N_1,N_2,d,s)$ may be back to back Benes networks, Delta Networks and many more combinations. The applicant notes that the fundamental property of a valid connection topology of the $V_{bft}(N_1,N_2,d,s)$ network is, when no connections are setup from any input link all the output links should be reachable. Based on this property numerous embodiments of the network $V_{bft}(N_1,N_2,d,s)$ can be built. The embodiments of FIG. 1C, FIG. 1C1, and FIG. 1C2 are only three examples of network $V_{bft}(N_1,N_2,d,s)$.

In the three embodiments of FIG. 1C, FIG. 1C1 and FIG. 1C2, each of the links ML(1,1)-ML(1,32), ML(2,1)-ML(2, 16), ML(3,1)-ML(3,16) and ML(4,1)-ML(4,32) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,8) and MS(2,1)-MS(2,8) are referred to as middle switches or middle ports.

In the example illustrated in FIG. 1C (or in FIG. 1C1, or in FIG. 1C2), a fan-out of four is possible to satisfy a multicast connection request if input switch is IS2, but only two switches in middle stage 130 will be used. Similarly, although a fan-out of three is possible for a multicast connection request if the input switch is IS1, again only a fan-out of two is used. The specific middle switches that are chosen in middle stage 130 when selecting a fan-out of two is irrelevant so long as at most two middle switches are selected to ensure that the connection request is satisfied. In essence, limiting the fan-out from input switch to no more than two middle switches permits the network 100C (or 100C1, or 100C2), to be operated in rearrangeably nonblocking manner in accordance with the invention.

The connection request of the type described above can be unicast connection request, a multicast connection request or a broadcast connection request, depending on the example. In case of a unicast connection request, a fan-out of one is used, i.e. a single middle stage switch in middle stage 130 is used to satisfy the request. Moreover, although in the above-described embodiment a limit of two has been placed on the fan-out into the middle stage switches in middle stage 130, the limit can be greater depending on the number of middle stage switches in a network (while maintaining the rearrangeably nonblocking nature of operation of the network for multicast connections). However any arbitrary fan-out may be used within any of the middle stage switches and the output stage switches to satisfy the connection request.

Figure 1D:
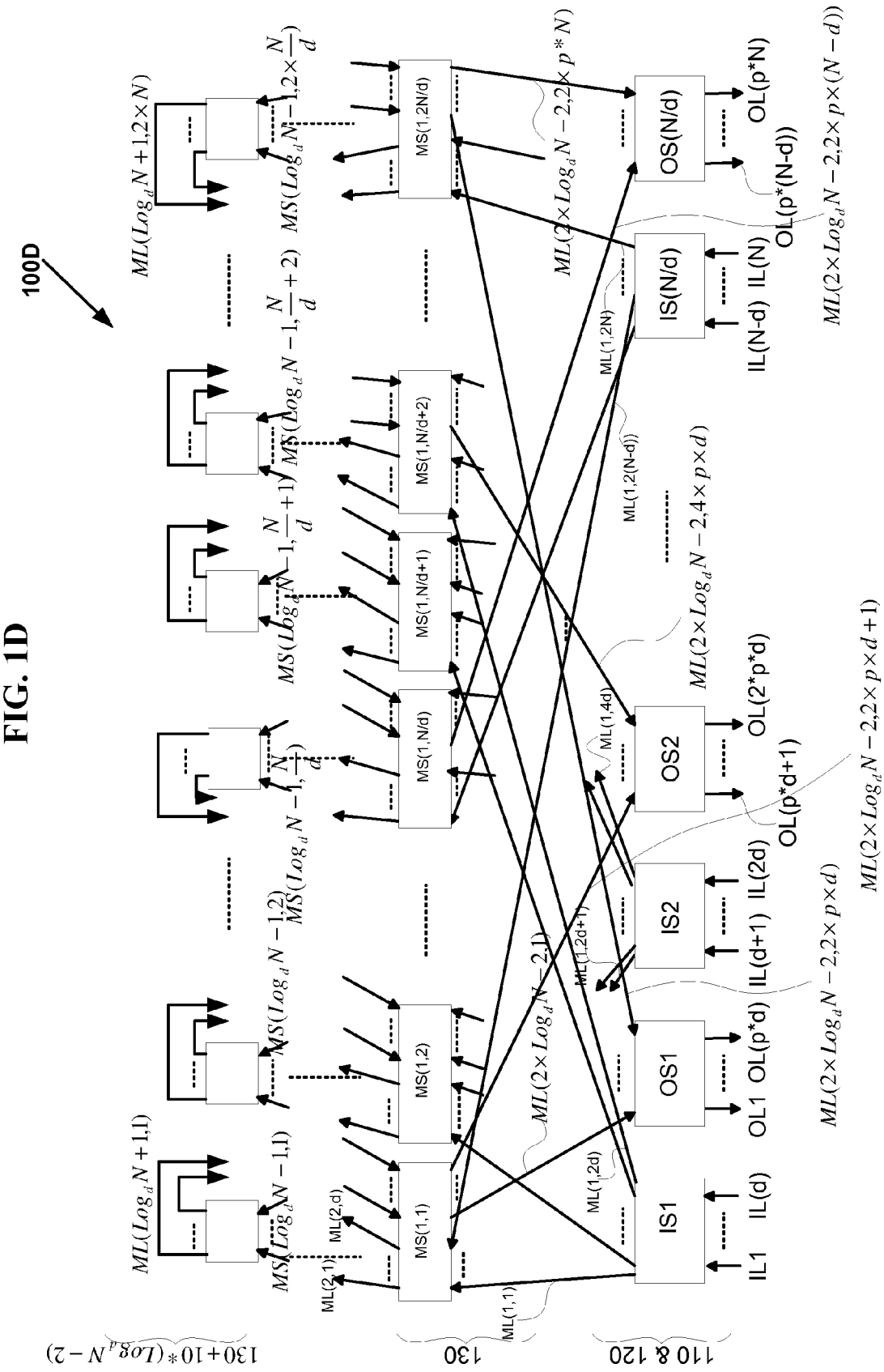
FIG. 1D is a diagram 100D of a general asymmetrical Butterfly fat tree network $V_{bft}(N_1,N_2,d,2)$ with $N_2=p*N_1$ and with ($\log_d N$) stages strictly nonblocking network for unicast connections and rearrangeably nonblocking network for arbitrary fan-out multicast connections in accordance with the invention.

Generalized Asymmetric RNB ($N_2 > N_1$) Embodiments:

Network 100D of FIG. 1D is an example of general asymmetrical Butterfly fat tree network $V_{bft}(N_1,N_2,d,s)$ with ($\log_d N$) stages where $N_2 > N_1$ and $N_2 = p*N_1$ where $p>1$. In network 100D of FIG. 1D, $N_1 = N$ and $N_2 = p*N$. The general asymmetrical Butterfly fat tree network $V_{bft}(N_1,N_2,d,s)$ can be operated in rearrangeably nonblocking manner for multicast when s=2 according to the current invention. Also the general asymmetrical Butterfly fat tree network $V_{bft}(N_1,N_2,d,s)$ can be operated in strictly nonblocking manner for unicast if s=2 according to the current invention. (And in the example of FIG. 1D, s=2). The general asymmetrical Butterfly fat tree network $V_{bft}(N_1,N_2,d,s)$ with ($\log_d N$) stages has d inlet links for each of $$\frac{N_1}{d}$$

input switches IS1-IS($N_1$/d) (for example the links IL1-IL(d) to the input switch IS1) and $2 \times d$ outgoing links for each of $$\frac{N_1}{d}$$

input switches IS1-IS($N_1$/d) (for example the links ML(1,1)-ML(1,2d) to the input switch IS1). There are $d_2$ $$\left(\text{where } d_2 = N_2 \times \frac{d}{N_1} = p \times d\right)$$

outlet links for each of $$\frac{N_1}{d}$$

output switches OS1-OS($N_1$/d) (for example the links OL1-OL(p*d) to the output switch OS1) and $d+d_2$ (=d+p×d) incoming links for each of $$\frac{N_1}{d}$$

output switches OS1-OS($N_1$/d) (for example ML(2×$\log_d N_1$ −2,1)-ML(2×$\log_d N_1$ −2,d+$d_2$) to the output switch OS1).

Each of the $$\frac{N_1}{d}$$

input switches IS1-IS($N_1$/d) are connected to exactly $2 \times d$ switches in middle stage 130 through $2 \times d$ links (for example in one embodiment the input switch IS1 is connected to middle switches MS(1,1)-MS(1,d) through the links ML(1, 1)-ML(1,d) and to middle switches MS(1,$N_1$/d+1)-MS(1, {$N_1$/d}+d) through the links ML(1,d+1)-ML(1,2d) respectively.

Each of the $$2 \times \frac{N_1}{d}$$

middle switches MS(1,1)-MS(1,2 $N_1$/d) in the middle stage 130 are connected from exactly d input switches through d links and also are connected to exactly d switches in middle stage 140 through d links.

Similarly each of the $$2 \times \frac{N_1}{d}$$

middle switches MS(1,1)-MS(1,2 $N_1$/d) in the middle stage 130 are connected from exactly d switches in middle stage 140 through d links and also are connected to exactly d output switches in output stage 120 through $$\frac{d+d_2}{2}$$

links.

Similarly each of the $$2 \times \frac{N_1}{d}$$

middle switches $$MS(\text{Log}_d N_1 - 1, 1) - MS\left(\text{Log}_d N_1 - 1, 2 \times \frac{N_1}{d}\right)$$

in the middle stage $130+10*(\text{Log}_d N_1-2)$ are connected from exactly d switches in middle stage $130+10*(\text{Log}_d N_1-3)$ through d links and also are connected to exactly d switches in middle stage $130+10*(\text{Log}_d N_1-1)$ through d links.

Each of the $$\frac{N_1}{d}$$

output switches OS1-OS($N_1/d$) are connected from exactly $d+d_2$ switches in middle stage 130 through $d+d_2$ links.

As described before, again the connection topology of a general $V_{bft}(N_1,N_2,d,s)$ may be any one of the connection topologies. For example the connection topology of the network $V_{bft}(N_1,N_2,d,s)$ may be back to back inverse Benes networks, back to back Omega networks, back to back Benes networks, Delta Networks and many more combinations. The applicant notes that the fundamental property of a valid connection topology of the general $V_{bft}(N_1,N_2,d,s)$ network is, when no connections are setup from any input link if any output link should be reachable. Based on this property numerous embodiments of the network $V_{bft}(N_1,N_2,d,s)$ can be built. The embodiments of FIG. 1C, FIG. 1C1, and FIG. 1C2 are three examples of network $V_{bft}(N_1,N_2,d,s)$ for s=2 and $N_2>N_1$.

The general symmetrical Butterfly fat tree network $V_{bft}(N_1,N_2,d,s)$ can be operated in rearrangeably nonblocking manner for multicast when s≧2 according to the current invention. Also the general symmetrical Butterfly fat tree network $V_{bft}(N_1,N_2,d,s)$ can be operated in strictly nonblocking manner for unicast if s≧2 according to the current invention.

For example, the network of FIG. 1C shows an exemplary three-stage network, namely $V_{bft}(8,24,22)$, with the following multicast assignment $I_1=\{2,3\}$ and all other $I_j=\phi$ for j=[2-8]. It should be noted that the connection $I_1$ fans out in the first stage switch IS1 into middle switches MS(1,1) and MS(1,5) in middle stage 130, and fans out in middle switches MS(1,1) and MS(1,5) only once into middle switches OS2 and OS3 respectively in output stage 120.

Finally the connection $I_1$ fans out once in the output stage switch OS2 into outlet link OL7 and in the output stage switch OS3 twice into the outlet links OL13 and OL18. In accordance with the invention, each connection can fan out in the input stage switch into at most two middle stage switches in middle stage 130.

Figure 1E:
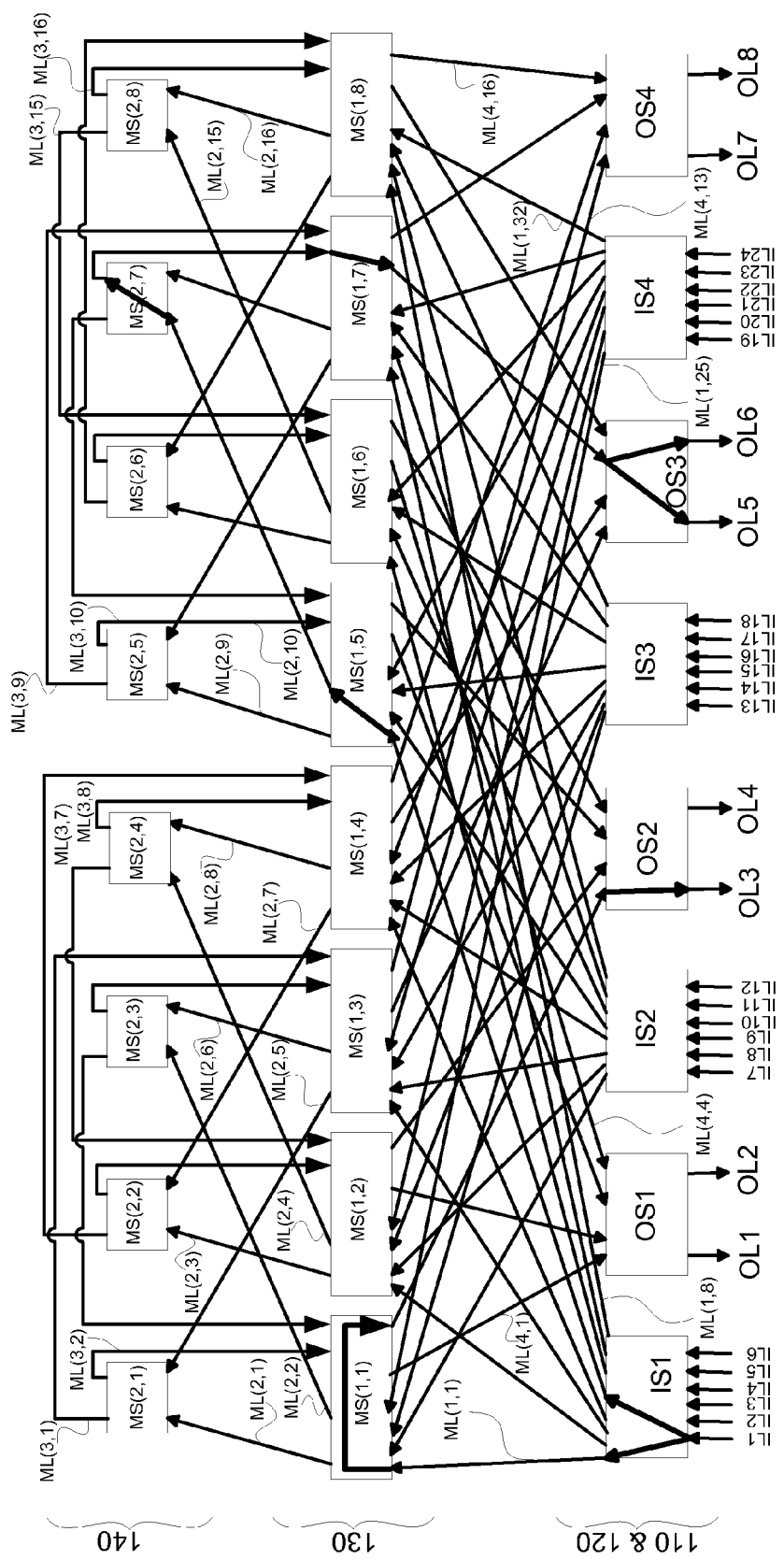
FIG. 1E is a diagram 100E of an exemplary Asymmetrical Butterfly fat tree network $V_{bft}(N_1,N_2,d,2)$ having inverse Benes connection topology of three stages with $N_2=8$, $N_1=p*N_2=24$, where p=3, and d=2 with exemplary multicast connections, strictly nonblocking network for unicast connections and rearrangeably nonblocking network for arbitrary fan-out multicast connections, in accordance with the invention.

Asymmetric RNB ($N_1>N_2$) Embodiments:

Referring to FIG. 1E, in one embodiment, an exemplary asymmetrical Butterfly fat tree network 100E with three stages of twenty four switches for satisfying communication requests, such as setting up a telephone call or a data call, or a connection between configurable logic blocks, between an input stage 110 and output stage 120 via middle stages 130 and 140 is shown where input stage 110 consists of four, six by eight switches IS1-IS4 and output stage 120 consists of four, four by two switches OS1-OS4. Middle stage 130 consists of eight, six by four switches MS(1,1)-MS(1,8) and middle stage 140 consists of eight, two by two switches MS(2,1)-MS(2,8).

Such a network can be operated in strictly non-blocking manner for unicast connections, because the switches in the input stage 110 are of size six by eight, the switches in output stage 120 are of size four by two, and there are eight switches in each of middle stage 130 and middle stage 140. Such a network can be operated in rearrangeably non-blocking manner for multicast connections, because the switches in the input stage 110 are of size six by eight, the switches in output stage 120 are of size four by two, and there are eight switches of size six by four in middle stage 130, and eight switches of size two by two in middle stage 140.

In one embodiment of this network each of the input switches IS1-IS4 and output switches OS1-OS4 are crossbar switches. The number of switches of input stage 110 and of output stage 120 can be denoted in general with the variable $$\frac{N_2}{d},$$

where $N_1$ is the total number of inlet links or and $N_2$ is the total number of outlet links and $N_1>N_2$ and $N_1=p*N_2$ where p>1. The number of middle switches in each middle stage is denoted by $$2 \times \frac{N_2}{d}.$$

The size of each input switch IS1-IS4 can be denoted in general with the notation $d*(d+d_1)$ and each output switch OS1-OS4 can be denoted in general with the notation $(2 \times d*d)$, where $$d_1 = N_1 \times \frac{d}{N_2} = p \times d.$$

The size of each switch in middle stage 130 can be denoted as $(d+d_1)*2d$. The size of each switch in the root stage (i.e., middle stage 140) can be denoted as $d*d$. The size of each switch in all the middle stages excepting middle stage 130 and root stage can be denoted as $2d*2d$ (In network 100E of FIG. 1E, there is no such middle stage). (In another embodiment, the size of each switch in any of the middle stages other than the middle stage 140, can be implemented as $d*2d$ and $d*d$ since the down coming middle links are never setup to the up going middle links. For example in network 100E of FIG. 1E, the down coming middle links ML(3,2) and ML(3,5) are never setup to the up going middle links ML(2,1) and ML(2,2) for the middle switch MS(1,1). So middle switch MS(1,1) can be implemented as a two by four switch with middle links ML(1,1) and ML(1,3) as inputs and middle links ML(2,1), ML(2,2), ML(4,1) and ML(4,2) as outputs; and a two by two switch with middle links ML(3,2) and ML(3,5) as inputs and middle links ML(4,1) and ML(4,2) as outputs).

A switch as used herein can be either a crossbar switch, or a network of switches each of which in turn may be a crossbar switch or a network of switches. An asymmetric Butterfly fat tree network can be represented with the notation $V_{bft}(N_1,N_2,$ d,s), where $N_1$ represents the total number of inlet links of all input switches (for example the links IL1-IL24), $N_2$ represents the total number of outlet links of all output switches (for example the links OL1-OL8), d represents the inlet links of each input switch where $N_1 > N_2$, and is the ratio of number of incoming links to each output switch to the outlet links of each output switch.

Each of the $$\frac{N_2}{d}$$

input switches IS1-IS4 are connected to exactly $d+d_1$ switches in middle stage 130 through $d+d_1$ links (for example input switch IS1 is connected to middle switches MS(1,1), MS(1,2), MS(1,3), MS(1,4), MS(1,5), MS(1,6), MS(1,7), and MS(1,8) through the links ML(1,1), ML(1,2), ML(1,3), ML(1,4), ML(1,5), ML(1,6), ML(1,7), and ML(1,8) respectively).

Each of the $$2 \times \frac{N_2}{d}$$

middle switches MS(1,1)-MS(1,8) in the middle stage 130 are connected from exactly $$\frac{(d+d_1)}{2}$$

input switches through $$\frac{(d+d_1)}{2}$$

links (for example the links ML(1,1), ML(1,9), ML(1,17) and ML(1,25) are connected to the middle switch MS(1,1) from input switch IS1, IS2, IS3, and IS4 respectively) and also are connected from exactly d switches in middle stage 140 through d links (for example the links ML(3,1) and ML(3,6) are connected to the middle switch MS(1,1) from middle switches MS(2,1) and MS(2,3) respectively).

Similarly each of the $$2 \times \frac{N_2}{d}$$

middle switches MS(1,1)-MS(1,8) in the middle stage 130 are connected to exactly d switches in middle stage 140 through d links (for example the links ML(2,1) and ML(2,2) are connected from middle switch MS(1,1) to middle switch MS(2,1) and MS(2,3) respectively), and also are connected to exactly d output switches in output stage 120 through d links (for example the links ML(4,1) and ML(4,2) are connected to output switches OS1 and OS2 respectively from middle switch MS(1,1)).

Similarly each of the $$2 \times \frac{N_2}{d}$$

middle switches MS(2,1)-MS(2,8) in the middle stage 140 are connected from exactly d switches in middle stage 130 through d links (for example the links ML(2,1) and ML(2,5) are connected to the middle switch MS(2,1) from middle switches MS(1,1) and MS(1,3) respectively) and also are connected to exactly d switches in middle stage 130 through d links (for example the links ML(3,1) and ML(3,2) are connected from middle switch MS(2,1) to middle switch MS(1,3) and MS(1,1) respectively).

Each of the $$\frac{N_2}{d}$$

output switches OS1-OS4 are connected from exactly $2 \times d$ switches in middle stage 130 through $2 \times d$ links (for example output switch OS1 is connected from middle switches MS(1,1), MS(1,2), MS(1,5), and MS(1,6) through the links ML(4,1), ML(4,3), ML(4,9), and ML(4,11) respectively).

Finally the connection topology of the network 100E shown in FIG. 1E is known to be back to back inverse Benes connection topology.

In the three embodiments of FIG. 1E, FIG. 1 E1 and FIG. 1 E2 the connection topology is different. That is the way the links ML(1,1)-ML(1,32), ML(2,1)-ML(2,16), ML(3,1)-ML(3,16), and ML(4,1)-ML(4,16) are connected between the respective stages is different. Even though only three embodiments are illustrated, in general, the network $V_{bft}(N_1,N_2,d,s)$ can comprise any arbitrary type of connection topology. For example the connection topology of the network $V_{bft}(N_1,N_2,d,s)$ may be back to back Benes networks, Delta Networks and many more combinations. The applicant notes that the fundamental property of a valid connection topology of the $V_{bft}(N_1,N_2,d,s)$ network is, when no connections are setup from any input link all the output links should be reachable. Based on this property numerous embodiments of the network $V_{bft}(N_1, N_2,d,s)$ can be built. The embodiments of FIG. 1E, FIG. 1E1, and FIG. 1E2 are only three examples of network $V_{bft}(N_1,N_2,d,s)$.

In the three embodiments of FIG. 1E, FIG. 1E1 and FIG. 1E2, each of the links ML(1,1)-ML(1,32), ML(2,1)-ML(2,16), ML(3,1)-ML(3,16) and ML(4,1)-ML(4,16) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,8) and MS(2,1)-MS(2,8) are referred to as middle switches or middle ports.

In the example illustrated in FIG. 1E (or in FIG. 1E1, or in FIG. 1E2), a fan-out of four is possible to satisfy a multicast connection request if input switch is IS2, but only two switches in middle stage 130 will be used. Similarly, although a fan-out of three is possible for a multicast connection request if the input switch is IS1, again only a fan-out of two is used. The specific middle switches that are chosen in middle stage 130 when selecting a fan-out of two is irrelevant so long as at most two middle switches are selected to ensure that the connection request is satisfied. In essence, limiting the fan-out from input switch to no more than two middle switches permits the network 100E (or 100E1, or 100E2), to be operated in rearrangeably nonblocking manner in accordance with the invention.

The connection request of the type described above can be unicast connection request, a multicast connection request or a broadcast connection request, depending on the example. In case of a unicast connection request, a fan-out of one is used, i.e. a single middle stage switch in middle stage 130 is used to satisfy the request. Moreover, although in the above-described embodiment a limit of two has been placed on the fan-out into the middle stage switches in middle stage 130, the limit can be greater depending on the number of middle stage switches in a network (while maintaining the rearrangeably nonblocking nature of operation of the network for multicast connections). However any arbitrary fan-out may be used within any of the middle stage switches and the output stage switches to satisfy the connection request.

Figure 1F:
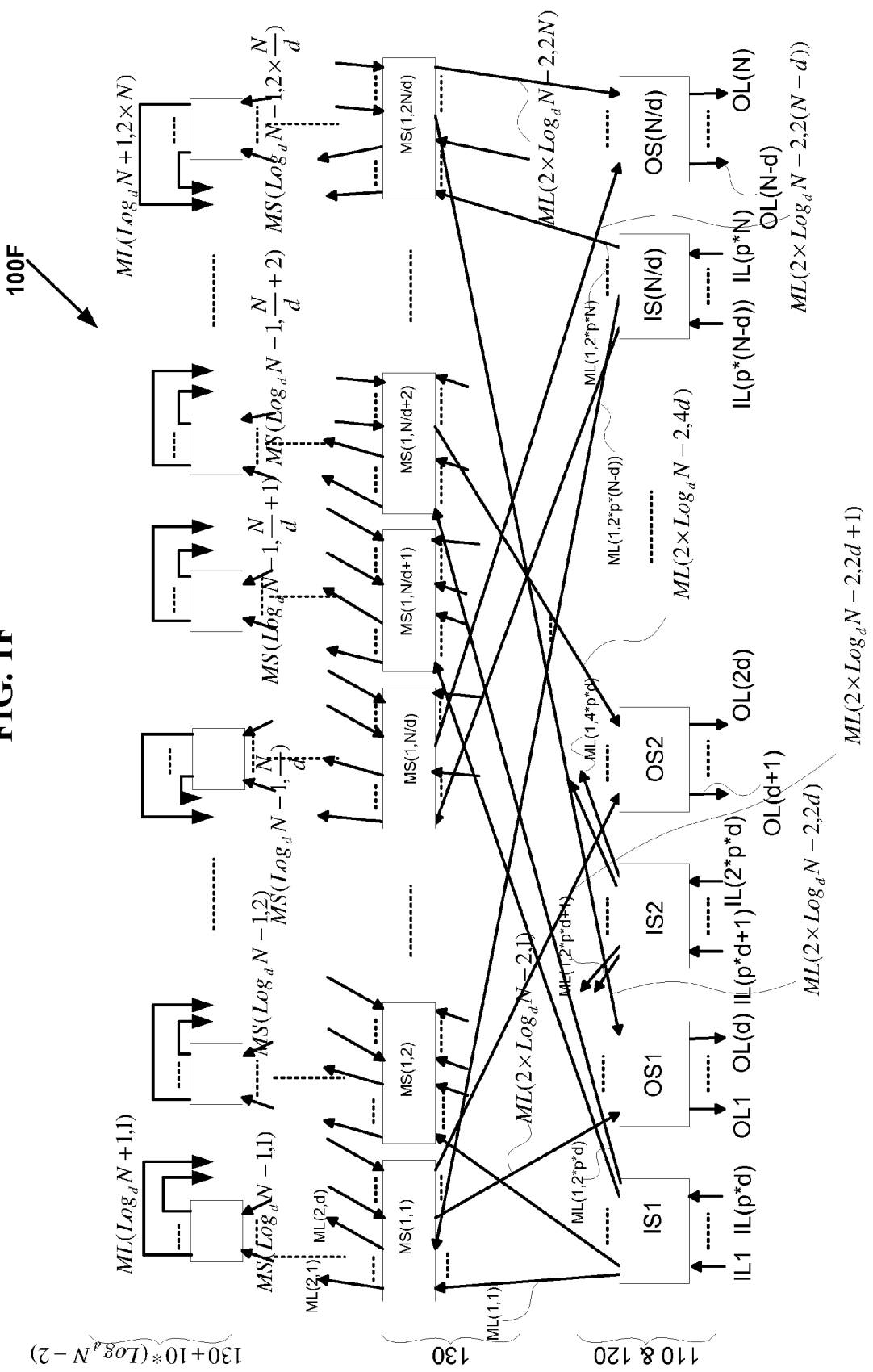
FIG. 1F is a diagram 100F of a general asymmetrical Butterfly fat tree network $V_{bft}(N_1,N_2,d,2)$ with $N_1=p*N_2$ and with ($\log_d N$) stages strictly nonblocking network for unicast connections and rearrangeably nonblocking network for arbitrary fan-out multicast connections in accordance with the invention.

Generalized Asymmetric RNB ($N_1 > N_2$) Embodiments:

Network 100F of FIG. 1F is an example of general asymmetrical Butterfly fat tree network $V_{bft}(N_1, N_2, d, s)$ with ($\log_d N$) stages where $N_1 > N_2$ and $N_1 = p*N_2$ where $p > 1$. In network 100F of FIG. 1F, $N_2 = N$ and $N_1 = p*N$. The general asymmetrical Butterfly fat tree network $V_{bft}(N_1, N_2, d, s)$ can be operated in rearrangeably nonblocking manner for multicast when $s=2$ according to the current invention. Also the general asymmetrical Butterfly fat tree network $V_{bft}(N_1, N_2, d, s)$ can be operated in strictly nonblocking manner for unicast if $s=2$ according to the current invention. (And in the example of FIG. 1F, $s=2$). The general asymmetrical Butterfly fat tree network $V_{bft}(N_1, N_2, d, s)$ with ($\log_d N$) stages has $d_1$ (where $$d_1 = N_1 \times \frac{d}{N_2} = p \times d$$

inlet links for each of $$\frac{N_2}{d}$$

input switches IS1-IS($N_2/d$) (for example the links IL1-IL($p*d$) to the input switch IS1) and $d+d_1$ ($=d+p\times d$) outgoing links for each of $$\frac{N_2}{d}$$

input switches IS1-IS($N_2/d$) (for example the links ML(1,1)-ML(1,($d+p*d$)) to the input switch IS1). There are d outlet links for each of $$\frac{N_2}{d}$$

output switches OS1-OS($N_2/d$) (for example the links OL1-OL(d) to the output switch OS1) and $2\times d$ incoming links for each of $$\frac{N_2}{d}$$

output switches OS1-OS($N_2/d$) (for example ML($2\times\log_d N_2-2,1$)-ML($2\times\log_d N_2-2, 2\times d$) to the output switch OS1).

Each of the $$\frac{N_2}{d}$$

input switches IS1-IS($N_2/d$) are connected to exactly $d+d_1$ switches in middle stage 130 through $d+d_1$ links (for example in one embodiment the input switch IS1 is connected to middle switches MS(1,1)-MS(1,($d+d_1$)/2) through the links ML(1,1)-ML(1,($d+d_1$)/2) and to middle switches MS(1,$N_1/d+1$)-MS(1,$\{N_1/d\}+(d+d_1)/2$) through the links ML(1,(($d+d_1$)/2)+1)-ML(1, ($d+d_1$)) respectively.

Each of the $$2 \times \frac{N_2}{d}$$

middle switches MS(1,1)-MS(1,$2*N_2/d$) in the middle stage 130 are connected from exactly d input switches through d links and also are connected from exactly d switches in middle stage 130 through d links.

Similarly each of the $$2 \times \frac{N_2}{d}$$

middle switches MS(1,1)-MS(1,$2*N_2/d$) in the middle stage 130 also are connected to exactly d switches in middle stage 140 through d links and also are connected to exactly d output switches in output stage 120 through d links.

Similarly each of the $$2 \times \frac{N_2}{d}$$

middle switches $$MS(\log_d N_2 - 1, 1) - MS\left(\log_d N_2 - 1, 2 \times \frac{N_2}{d}\right)$$

in the middle stage 130+10*($\log_d N_2-2$) are connected from exactly d switches in middle stage 130+10*($\log_d N_2-3$) through d links and also are connected to exactly d switches in middle stage 130+10*($\log_d N_2-1$) through d links.

Each of the $$\frac{N_2}{d}$$

output switches OS1-OS($N_2/d$) are connected from exactly $2\times d$ switches in middle stage 130+10*($2*\log_d N_2-4$) through $2\times d$ links.

As described before, again the connection topology of a general $V_{bft}(N_1,N_2,d,s)$ may be any one of the connection topologies. For example the connection topology of the network $V_{bft}(N_1,N_2,d,s)$ may be back to back inverse Benes networks, back to back Omega networks, back to back Benes networks, Delta Networks and many more combinations. The applicant notes that the fundamental property of a valid connection topology of the general $V_{bft}(N_1,N_2,d,s)$ network is, when no connections are setup from any input link if any output link should be reachable. Based on this property numerous embodiments of the network $V_{bft}(N_1,N_2,d,s)$ can be built. The embodiments of FIG. 1E, FIG. 1E1, and FIG. 1E2 are three examples of network $V_{bft}(N_1,N_2,d,s)$ for s=2 and $N_1 > N_2$.

The general symmetrical Butterfly fat tree network $V_{bft}(N_1,N_2,d,s)$ can be operated in rearrangeably nonblocking manner for multicast when $s \geq 2$ according to the current invention. Also the general symmetrical Butterfly fat tree network $V_{bft}(N_1,N_2,d,s)$ can be operated in strictly nonblocking manner for unicast if $s \geq 2$ according to the current invention.

For example, the network of FIG. 1E shows an exemplary three-stage network, namely $V_{bft}(24,8,2,2)_9$ with the following multicast assignment $I_1 = \{2,3\}$ and all other $I_j = \phi$ for j=[2-8]. It should be noted that the connection $I_1$ fans out in the first stage switch IS1 into middle switches MS(1,1) and MS(1,5) in middle stage 130, and fans out in middle switches MS(1,1) and MS(1,5) only once into output switch OS2 in output stage 120 and middle switch and MS(2,7) in middle stage 140 respectively.

The connection $I_1$ also fans out in middle switch MS(2,7) only once into middle switch MS(1,7) in middle stage 130. The connection $I_1$ also fans out in middle switch MS(1,7) only once into output switch OS3 in output stage 120. Finally the connection $I_1$ fans out once in the output stage switch OS2 into outlet link OL3 and in the output stage switch OS3 twice into the outlet links OL5 and OL6. In accordance with the invention, each connection can fan out in the input stage switch into at most two middle stage switches in middle stage 130.

Strictly Nonblocking Butterfly Fat Tree Networks:

The general symmetric Butterfly fat tree network $V_{bft}(N,d,s)$ can also be operated in strictly nonblocking manner for multicast when $s \geq 3$ according to the current invention. Similarly the general asymmetric Butterfly fat tree network $V_{bft}(N_1,N_2,d,s)$ can also be operated in strictly nonblocking manner for multicast when $s \geq 3$ according to the current invention.

Figure 2A:
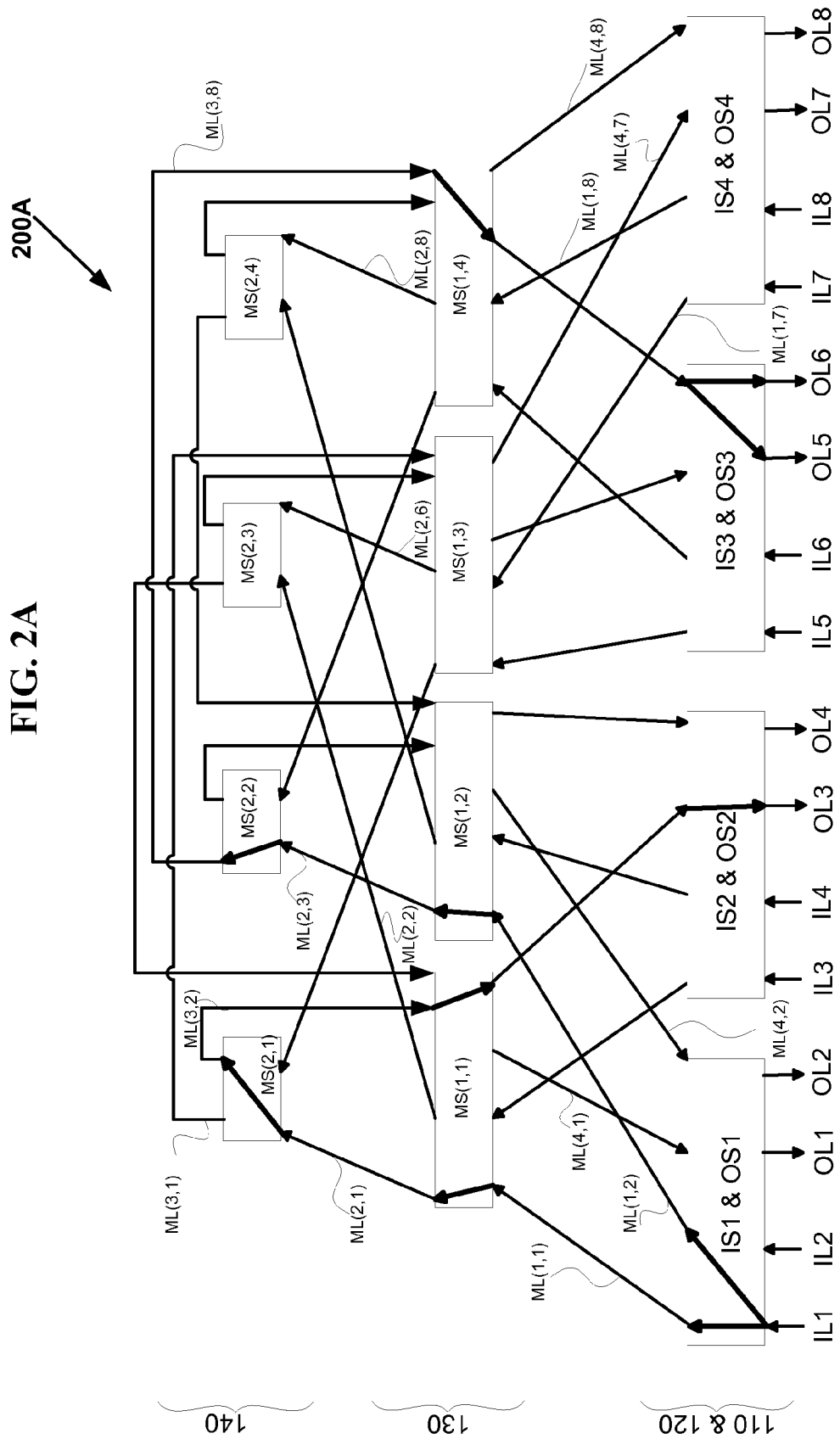
FIG. 2A is a diagram 200A of an exemplary Symmetrical Butterfly fat tree network $V_{bft}(N,d,s)$ having inverse Benes connection topology of three stages with N=8, d=2 and s=1 with exemplary unicast connections rearrangeably nonblocking network for unicast connections, in accordance with the invention.

Symmetric RNB Unicast Embodiments:

Referring to FIG. 2A, in one embodiment, an exemplary symmetrical Butterfly fat tree network 200A with three stages of sixteen switches for satisfying communication requests, such as setting up a telephone call or a data call, or a connection between configurable logic blocks, between an input stage 110 and output stage 120 via middle stages 130, and 140 is shown where input stage 110 consists of four, two by two switches IS1-IS4 and output stage 120 consists of four, two by two switches OS1-OS4. Input stage 110 and output stage 120 together belong to leaf stage. And all the middle stages excepting root stage namely middle stage 130 consists of four, four by four switches MS(1,1)-MS(1,4), and root stage i.e., middle stage 140 consists of four, two by two switches MS(2,1)-MS(2,4).

Such a network can be operated in rearrangeably nonblocking manner for unicast connections, because the switches in the input stage 110 are of size two by two, the switches in output stage 120 are of size two by two, and there are four switches in each of middle stage 130 and middle stage 140.

In one embodiment of this network each of the input switches IS1-IS4 and output switches OS1-OS4 are crossbar switches. The number of switches of input stage 110 and of output stage 120 can be denoted in general with the variable $$\frac{N}{d},$$

where N is the total number of inlet links or outlet links. The number of middle switches in each middle stage is denoted by $$\frac{N}{d}.$$

The size of each input switch IS1-IS4 can be denoted in general with the notation d*d and each output switch OS1-OS4 can be denoted in general with the notation d*d. Likewise, the size of each switch in any of the middle stages can be denoted as $2d*2d$ excepting that the size of each switch in middle stage 140 is denoted as d*d. (In another embodiment, the size of each switch in any of the middle stages other than the middle stage 140, can be implemented as $d*2d$ and $d*d$ since the down coming middle links are never setup to the up going middle links. For example in network 200A of FIG. 2A, the down coming middle links ML(3,2) and ML(3,5) are never setup to the up going middle links ML(2,1) and ML(2,2) for the middle switch MS(1,1). So middle switch MS(1,1) can be implemented as a two by four switch with middle links ML(1,1) and ML(1,3) as inputs and middle links ML(2,1), ML(2,2), ML(4,1) and ML(4,2) as outputs; and a two by two switch with middle links ML(3,2) and ML(3,5) as inputs and middle links ML(4,1) and ML(4,2) as outputs).

Middle stage 140 is called as root stage. A switch as used herein can be either a crossbar switch, or a network of switches each of which in turn may be a crossbar switch or a network of switches. A symmetric Butterfly fat tree network can be represented with the notation $V_{bft}(N,d,s)$, where N represents the total number of inlet links of all input switches (for example the links IL1-IL8), d represents the inlet links of each input switch or outlet links of each output switch, and s is the ratio of number of outgoing links from each input switch to the inlet links of each input switch. Although it is not necessary that there be the same number of inlet links IL1-IL8 as there are outlet links OL1-OL8, in a symmetrical network they are the same.

Each of the $$\frac{N}{d}$$

input switches IS1-IS4 are connected to exactly d switches in middle stage 130 through $2 \times d$ links (for example input switch IS1 is connected to middle switch MS(1,1) through the link ML(1,1); and input switch IS1 is also connected to middle switch MS(1,2) through the link ML(1,2)).

Each of the $$\frac{N}{d}$$

middle switches MS(1,1)-MS(1,4) in the middle stage 130 are connected from exactly d input switches through d links (for example the link ML(1,1) is connected to the middle switch MS(1,1) from input switch IS1; and the link ML(1,3) is connected to the middle switch MS(1,1) from input switch IS2) and are also connected from exactly d switches in middle stage 140 through d links (for example the link ML(3,2) is connected to the middle switch MS(1,1) from middle switch MS(2,1) and also the link ML(3,5) is connected to the middle switch MS(1,1) from middle switch MS(2,3)).

Each of the $$\frac{N}{d}$$

middle switches MS(1,1)-MS(1,4) in the middle stage 130 are connected to exactly d switches in middle stage 140 through d links (for example the link ML(2,1) is connected from middle switch MS(1,1) to middle switch MS(2,1), and the link ML(2,2) is connected from middle switch MS(1,1) to middle switch MS(2,3)) and also are connected to exactly d output switches in output stage 120 through d links (for example the link ML(4,1) is connected to output switch OS1 from middle switch MS(1,1), and the link ML(4,2) is connected to output switch OS2 from middle switch MS(1,1)).

Similarly each of the $$\frac{N}{d}$$

middle switches MS(2,1)-MS(2,4) in the middle stage 140 are connected from exactly d switches in middle stage 130 through d links (for example the link ML(2,1) is connected to the middle switch MS(2,1) from middle switch MS(1,1), and the link ML(2,5) is connected to the middle switch MS(2,1) from middle switch MS(1,3)), and also are connected to exactly d switches in middle stage 130 through d links (for example the link ML(3,1) is connected from middle switch MS(2,1) to middle switch MS(1,3); and the link ML(3,2) is connected from middle switch MS(2,1) to middle switch MS(1,1)).

Each of the $$\frac{N}{d}$$

output switches OS1-OS4 are connected from exactly d switches in middle stage 130 through d links (for example output switch OS1 is connected from middle switch MS(1,1) through the link ML(4,1); and output switch OS1 is also connected from middle switch MS(1,2) through the link ML(4,2)).

Finally the connection topology of the network 200A shown in FIG. 2A is known to be back to back inverse Benes connection topology.

In other embodiments the connection topology may be different from the network 200A of FIG. 2A. That is the way the links ML(1,1)-ML(1,8), ML(2,1)-ML(2,8), ML(3,1)-ML(3,8), and ML(4,1)-ML(4,8) are connected between the respective stages is different. Even though only one embodiment is illustrated, in general, the network $V_{bft}(N,d,s)$ can comprise any arbitrary type of connection topology. For example the connection topology of the network $V_{bft}(N,d,s)$ may be back to back Benes networks, Delta Networks and many more combinations. The applicant notes that the fundamental property of a valid connection topology of the $V_{bft}(N,d,s)$ network is, when no connections are setup from any input link all the output links should be reachable. Based on this property numerous embodiments of the network $V_{bft}(N,d,s)$ can be built. The embodiment of FIG. 2A is only one example of network $V_{bft}(N,d,s)$.

In the embodiment of FIG. 2A each of the links ML(1,1)-ML(1,8), ML(2,1)-ML(2,8), ML(3,1)-ML(3,8) and ML(4,1)-ML(4,8) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,4) and MS(2,1)-MS(2,4) are referred to as middle switches or middle ports. The middle stage 130 is also referred to as root stage and middle stage switches MS(2,1)-MS(2,4) are referred to as root stage switches.

Figure 2B:
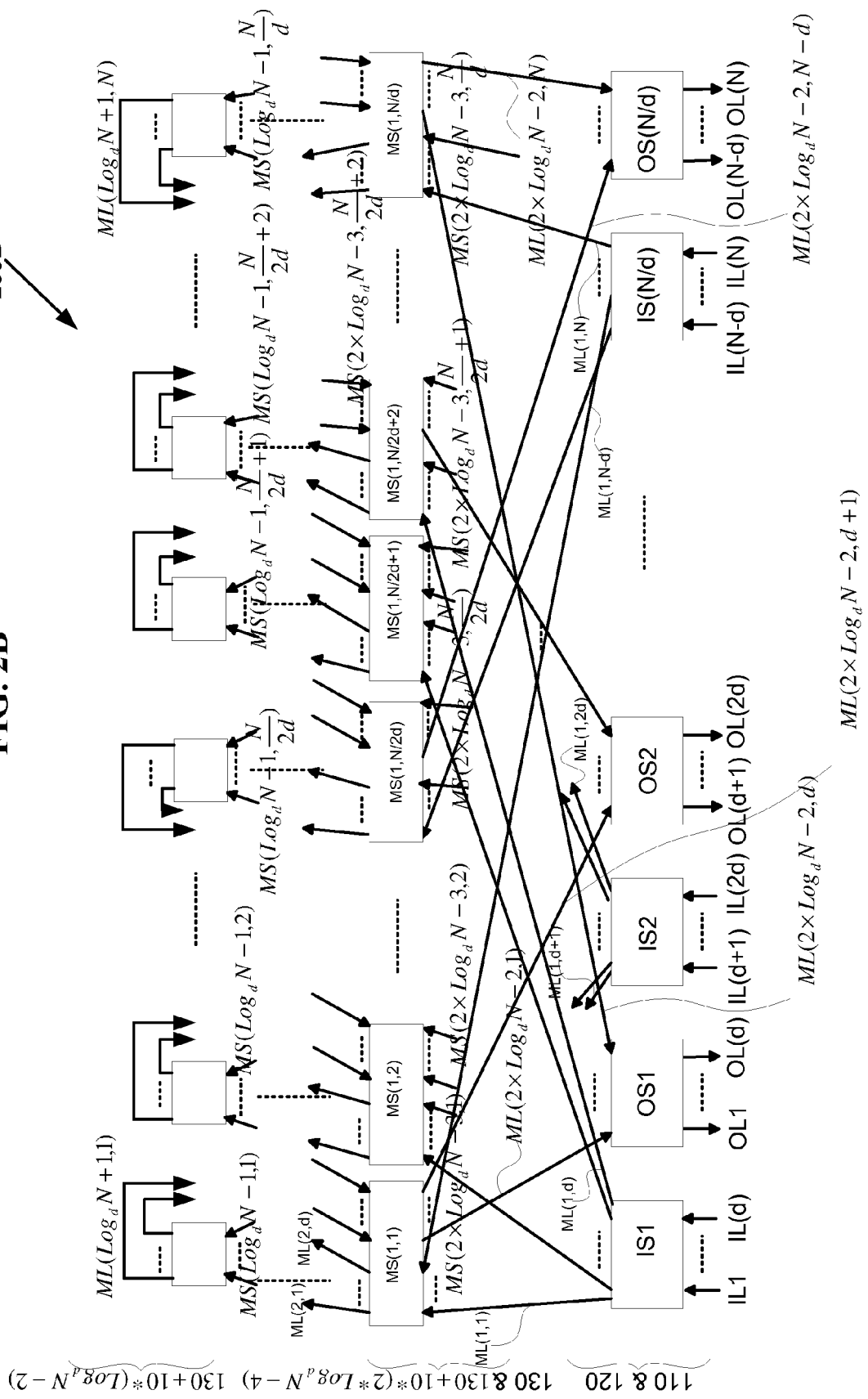
FIG. 2B is a diagram 200B of a general symmetrical Butterfly fat tree network $V_{bft}(N,d,s)$ with ($\log_d N$) stages and s=1, rearrangeably nonblocking network for unicast connections in accordance with the invention.

Generalized Symmetric RNB Unicast Embodiments:

Network 200B of FIG. 2B is an example of general symmetrical Butterfly fat tree network $V_{bft}(N,d,s)$ with $(\log_d N)$ stages. The general symmetrical Butterfly fat tree network $V_{bft}(N,d,s)$ can be operated in rearrangeably nonblocking manner for unicast when s=1 according to the current invention (and in the example of FIG. 2B, s=1). The general symmetrical Butterfly fat tree network $V_{bft}(N,d,s)$ with $(\log_d N)$ stages has d inlet links for each of $$\frac{N}{d}$$

input switches IS1-IS(N/d) (for example the links IL1-IL(d) to the input switch IS1) and d outgoing links for each of $$\frac{N}{d}$$

input switches IS1-IS(N/d) (for example the links ML(1,1)-ML(1,d) to the input switch IS1). There are d outlet links for each of $$\frac{N}{d}$$

output switches OS1-OS(N/d) (for example the links OL1-OL(d) to the output switch OS1) and d incoming links for each of output switches OS1-OS(N/d) (for example ML($2 \times \text{Log}_d N-2,1$)-ML($2 \times \text{Log}_d N-2,d$) to the output switch OS1).

Each of the $$\frac{N}{d}$$

input switches IS1-IS(N/d) are connected to exactly d switches in middle stage 130 through d links.

Each of the $$\frac{N}{d}$$

middle switches MS(1,1)-MS(1,N/d) in the middle stage 130 are connected from exactly d input switches through d links and also are connected to exactly d switches in middle stage 140 through d links.

Similarly each of the $$\frac{N}{d}$$

middle switches MS(1,1)-MS(1,N/d) in the middle stage 130 are also connected from exactly d switches in middle stage 140 through d links and also are connected to exactly d output switches in output stage 120 through d links.

Similarly each of the $$\frac{N}{d}$$

middle switches $$MS(\text{Log}_d N - 1, 1) - MS\left(\text{Log}_d N - 1, \frac{N}{d}\right)$$

in the middle stage 130+10*($\text{Log}_d$ N-2) are connected from exactly d switches in middle stage 130+10*($\text{Log}_d$ N-3) through d links and also are connected to exactly d switches in middle stage 130+10*($\text{Log}_d$ N-1) through d links.

Each of the $$\frac{N}{d}$$

output switches OS1-OS(N/d) are connected from exactly d switches in middle stage 130 through d links.

As described before, again the connection topology of a general $V_{bft}$(N,d,s) may be any one of the connection topologies. For example the connection topology of the network $V_{bft}$(N,d,s) may be back to back inverse Benes networks, back to back Omega networks, back to back Benes networks, Delta Networks and many more combinations. The applicant notes that the fundamental property of a valid connection topology of the general $V_{bft}$(N,d,s) network is, when no connections are setup from any input link if any output link should be reachable. Based on this property numerous embodiments of the network $V_{bft}$(N,d,s) can be built. The embodiment of FIG. 2A are one example of network $V_{bft}$(N,d,s).

The general symmetrical Butterfly fat tree network $V_{bft}$(N,d,s) is operated in rearrangeably nonblocking manner for unicast when s≧1 according to the current invention.

Figure 2C:
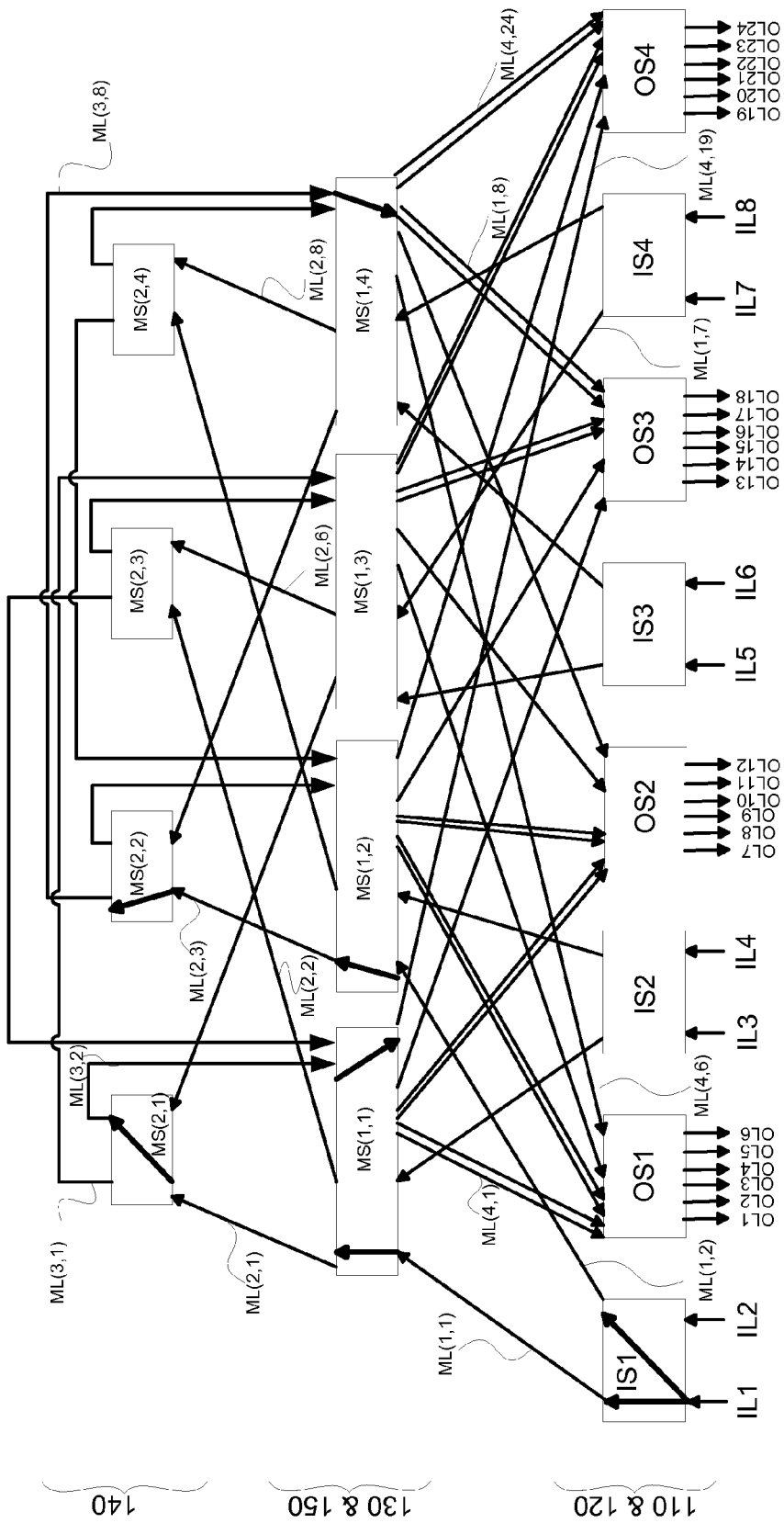
FIG. 2C is a diagram 200C of an exemplary Asymmetrical Butterfly fat tree network $V_{bft}(N_1,N_2,d,1)$ having inverse Benes connection topology of three stages with $N_1=8$, $N_2=p*N_1=24$ where p=3, and d=2 with exemplary unicast connections rearrangeably nonblocking network for unicast connections, in accordance with the invention.

Asymmetric RNB Unicast ($N_2 > N_1$) Embodiments:

Referring to FIG. 2C, in one embodiment, an exemplary asymmetrical Butterfly fat tree network 200C with three stages of sixteen switches for satisfying communication requests, such as setting up a telephone call or a data call, or a connection between configurable logic blocks, between an input stage 110 and output stage 120 via middle stages 130 and 140 is shown where input stage 110 consists of four, two by two switches IS1-IS4 and output stage 120 consists of four, six by six switches OS1-OS4. Middle stage 130 consists of four, four by eight switches MS(1,1)-MS(1,4) and middle stage 140 consists of four, two by two switches MS(2,1)-MS(2,4).

Such a network can be operated in rearrangeably nonblocking manner for unicast connections, because the switches in the input stage 110 are of size two by two, the switches in output stage 120 are of size six by six, and there are four switches of size four by eight in middle stage 130 and four switches of size two by two in middle stage 140.

In one embodiment of this network each of the input switches IS1-IS4 and output switches OS1-OS4 are crossbar switches. The number of switches of input stage 110 and of output stage 120 can be denoted in general with the variable $$\frac{N_1}{d},$$

where $N_1$ is the total number of inlet links or and $N_2$ is the total number of outlet links and $N_2 > N_1$ and $N_2 = p*N_1$ where p>1. The number of middle switches in each middle stage is denoted by $$\frac{N_1}{d}.$$

The size of each input switch IS1-IS4 can be denoted in general with the notation d*d and each output switch OS1-OS4 can be denoted in general with the notation $d_2*d_2$, where $$d_2 = N_2 \times \frac{d}{N_1} = p \times d.$$

The size of each switch in middle stage 130 can be denoted as $2d*(d+d_2)$. The size of each switch in the root stage (i.e., middle stage140) can be denoted as d*d. The size of each switch in all the middle stages excepting middle stage 130 and root stage can be denoted as $2d*2d$ (In network 200C of FIG. 2C, there is no such middle stage). (In another embodiment, the size of each switch in any of the middle stages other than the middle stage 140, can be implemented as d*$2d$ and d*d since the down coming middle links are never setup to the up going middle links. For example in network 200C of FIG. 2C, the down coming middle links ML(3,2) and ML(3,5) are never setup to the up going middle links ML(2,1) and ML(2,

2) for the middle switch MS(1,1). So middle switch MS(1,1) can be implemented as a two by four switch with middle links ML(1,1) and ML(1,3) as inputs and middle links ML(2,1), ML(2,2), ML(4,1) and ML(4,2) as outputs; and a two by two switch with middle links ML(3,2) and ML(3,5) as inputs and middle links ML(4,1) and ML(4,2) as outputs).

A switch as used herein can be either a crossbar switch, or a network of switches each of which in turn may be a crossbar switch or a network of switches. An asymmetric Butterfly fat tree network can be represented with the notation $V_{bft}(N_1,N_2,d,s)$, where $N_1$ represents the total number of inlet links of all input switches (for example the links IL1-IL8), $N_2$ represents the total number of outlet links of all output switches (for example the links OL1-OL24), d represents the inlet links of each input switch where $N_2 > N_1$, and s is the ratio of number of outgoing links from each input switch to the inlet links of each input switch.

Each of the $$\frac{N_1}{d}$$

input switches IS1-IS4 are connected to exactly d switches in middle stage 130 through d links (for example input switch IS1 is connected to middle switch MS(1,1) through the link ML(1,1), and input switch IS1 is also connected to MS(1,2) through the link ML(1,2)).

Each of the $$\frac{N_1}{d}$$

middle switches MS(1,1)-MS(1,4) in the middle stage 130 are connected from exactly d input switches through d links (for example the link ML(1,1) is connected to the middle switch MS(1,1) from input switch IS1 and the link ML(1,3) is connected to the middle switch MS(1,1) from input switch IS2) and are also connected from exactly d switches in middle stage 140 through d links (for example the link ML(3,2) is connected to the middle switch MS(1,1) from middle switch MS(2,1), and the link ML(3,5) is connected to the middle switch MS(1,1) from middle switch MS(2,3)).

Similarly each of the $$\frac{N_1}{d}$$

middle switches MS(1,1)-MS(1,4) in the middle stage 130 are connected to exactly d switches in middle stage 140 through d links (for example the link ML(2,1) is connected from middle switch MS(1,1) to middle switch MS(2,1), and the link ML(2,2) is connected from middle switch MS(1,1) to middle switch MS(2,3)), and also are connected to exactly $$\frac{d_2}{2}$$

output switches in output stage 120 through $d_2$ links (for example the link ML(4,1) and ML(4,2) are connected from middle switch MS(1,1) to output switch OS1; the links ML(4,3) and ML(4,4) are connected from middle switch MS(1,1) to output switch OS2; the link ML(4,5) is connected from middle switch MS(1,1) to output switch OS3; and the links ML(4,6) is connected from middle switch MS(1,1) to output switch OS4).

Similarly each of the $$\frac{N_1}{d}$$

middle switches MS(2,1)-MS(2,4) in the middle stage 140 are connected from exactly d switches in middle stage 130 through d links (for example the link ML(2,1) is connected to the middle switch MS(2,1) from middle switch MS(1,1); and the link ML(2,5) is connected to the middle switch MS(2,1) from middle switch MS(1,3)) and also are connected to exactly d switches in middle stage 130 through d links (for example the link ML(3,2) is connected from middle switch MS(2,1) to middle switch MS(1,1); and the link ML(3,1) is connected from middle switch MS(2,1) to middle switch MS(1,3)).

Each of the $$\frac{N_1}{d}$$

output switches OS1-OS4 are connected from exactly $$\frac{d_2}{2}$$

switches in middle stage 130 through $d_2$ links (for example output switch OS1 is connected from middle switch MS(1,1) through the links ML(4,1) and ML(4,2); output switch OS1 is connected from middle switch MS(1,2) through the links ML(4,7) and ML(4,8); output switch OS1 is connected from middle switch MS(1,3) through the link ML(4,13); output switch OS1 is connected from middle switch MS(1,4) through the link ML(4,19)).

Finally the connection topology of the network 200C shown in FIG. 2C is known to be back to back inverse Benes connection topology.

In other embodiments the connection topology may be different from the embodiment of the network 200C of FIG. 2C. That is the way the links ML(1,1)-ML(1,8), ML(2,1)-ML(2,8), ML(3,1)-ML(3,8), and ML(4,1)-ML(4,24) are connected between the respective stages is different. Even though only one embodiment is illustrated, in general, the network $V_{bft}(N_1,N_2,d,s)$ can comprise any arbitrary type of connection topology. For example the connection topology of the network $V_{bft}(N_1,N_2,d,s)$ may be back to back Benes networks, Delta Networks and many more combinations. The applicant notes that the fundamental property of a valid connection topology of the $V_{bft}(N_1,N_2,d,s)$ network is, when no connections are setup from any input link all the output links should be reachable. Based on this property numerous embodiments of the network $V_{bft}(N_1,N_2,d,s)$ can be built. The embodiment of FIG. 2C, are only one example of network $V_{bft}(N_1, N_2,d,s)$.

In the embodiment of FIG. 2C, each of the links ML(1,1)-ML(1,8), ML(2,1)-ML(2,8), ML(3,1)-ML(3,8) and ML(4,1)-ML(4,24) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,4) and MS(2,1)-MS(2,4) are referred to as middle switches or middle ports. The middle stage 130 is also referred to as root stage and middle stage switches MS(1,2)-MS(2,4) are referred to as root stage switches.

Figure 2D:
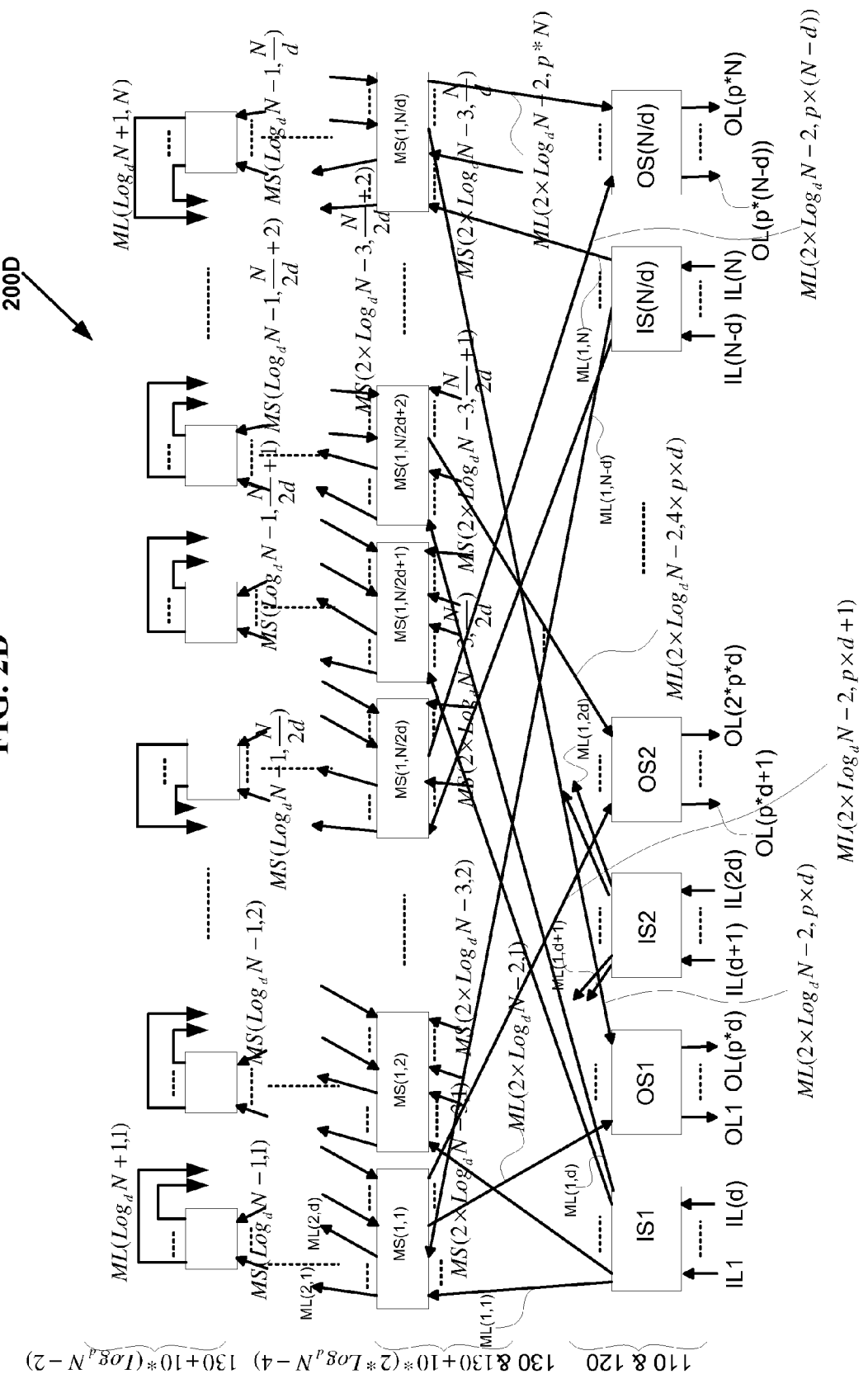
FIG. 2D is a diagram 200D of a general asymmetrical Butterfly fat tree network $V_{bft}(N_1,N_2,d,1)$ with $N_2=p*N_1$ and with ($\log_d N$) stages rearrangeably nonblocking network for unicast connections in accordance with the invention.

Generalized Asymmetric RNB Unicast ($N_2 > N_1$) Embodiments:

Network 200D of FIG. 2D is an example of general asymmetrical Butterfly fat tree network $V_{bft}(N_1,N_2,d,s)$ with ($\log_d N$) stages where $N_2 > N_1$ and $N_2 = p*N_1$ where $p>1$. In network 200D of FIG. 2D, $N_1 = N$ and $N_2 = p*N$. The general asymmetrical Butterfly fat tree network $V_{bft}(N_1,N_2,d,s)$ can be operated in rearrangeably nonblocking manner for unicast when s=1 according to the current invention (and in the example of FIG. 2D, s=1). The general asymmetrical Butterfly fat tree network $V_{bft}(N_1,N_2,d,s)$ with ($\log_d N$) stages has d inlet links for each of $$\frac{N_1}{d}$$

input switches IS1-IS($N_1/d$) (for example the links IL1-IL(d) to the input switch IS1) and d outgoing links for each of $$\frac{N_1}{d}$$

input switches IS1-IS($N_1/d$) (for example the links ML(1,1)-ML(1,d) to the input switch IS1). There are $d_2$ $$\left(\text{where } d_2 = N_2 \times \frac{d}{N_1} = p \times d\right)$$

outlet links for each of $$\frac{N_1}{d}$$

output switches OS1-OS($N_1/d$) (for example the links OL1-OL(p*d) to the output switch OS1) and $d_2$ (=p×d) incoming links for each of $$\frac{N_1}{d}$$

output switches OS1-OS($N_1/d$) (for example ML(2×$\log_d N_1-2$,1)-ML(2×$\log_d N_1-2$,$d_2$) to the output switch OS1).

Each of the $$\frac{N_1}{d}$$

input switches IS1-IS($N_1/d$) are connected to exactly d switches in middle stage 130 through d links.

Each of the $$\frac{N_1}{d}$$

middle switches MS(1,1)-MS(1,$N_1/d$) in the middle stage 130 are connected from exactly d input switches through d links and also are connected to exactly d switches in middle stage 140 through d links.

Similarly each of the $$\frac{N_1}{d}$$

middle switches MS(1,1)-MS(1,$N_1/d$) in the middle stage 130 are connected from exactly d switches in middle stage 140 through d links and also are connected to exactly $$\frac{d_2}{2}$$

output switches in output stage 120 through $d_2$ links.

Similarly each of the $$\frac{N_1}{d}$$

middle switches $$MS(\text{Log}_d N_1 - 1, 1) - MS\left(\text{Log}_d N_1 - 1, \frac{N_1}{d}\right)$$

in the middle stage 130+10*($\text{Log}_d N_1-2$) are connected from exactly d switches in middle stage 130+10*($\text{Log}_d N_1-3$) through d links and also are connected to exactly d switches in middle stage 130+10*($\text{Log}_d N_1-1$) through d links.

Each of the $$\frac{N_1}{d}$$

output switches OS1-OS($N_1/d$) are connected from exactly $$\frac{d_2}{2}$$

switches in middle stage 130 through $d_2$ links.

As described before, again the connection topology of a general $V_{bft}(N_1,N_2,d,s)$ may be any one of the connection topologies. For example the connection topology of the network $V_{bft}(N_1,N_2,d,s)$ may be back to back inverse Benes networks, back to back Omega networks, back to back Benes networks, Delta Networks and many more combinations. The applicant notes that the fundamental property of a valid connection topology of the general $V_{bft}(N_1,N_2,d,s)$ network is, when no connections are setup from any input link if any output link should be reachable. Based on this property numerous embodiments of the network $V_{bft}(N_1,N_2,d,s)$ can be built. The embodiment of FIG. 2C is one example of network $V_{bft}(N_1, N_2,d,s)$ for s=1 and $N_2>N_1$.

The general asymmetrical Butterfly fat tree network $V_{bft}(N_1,N_2,d,s)$ can be operated in rearrangeably nonblocking manner for unicast when $s\geq 1$ according to the current invention.

Figure 2E:
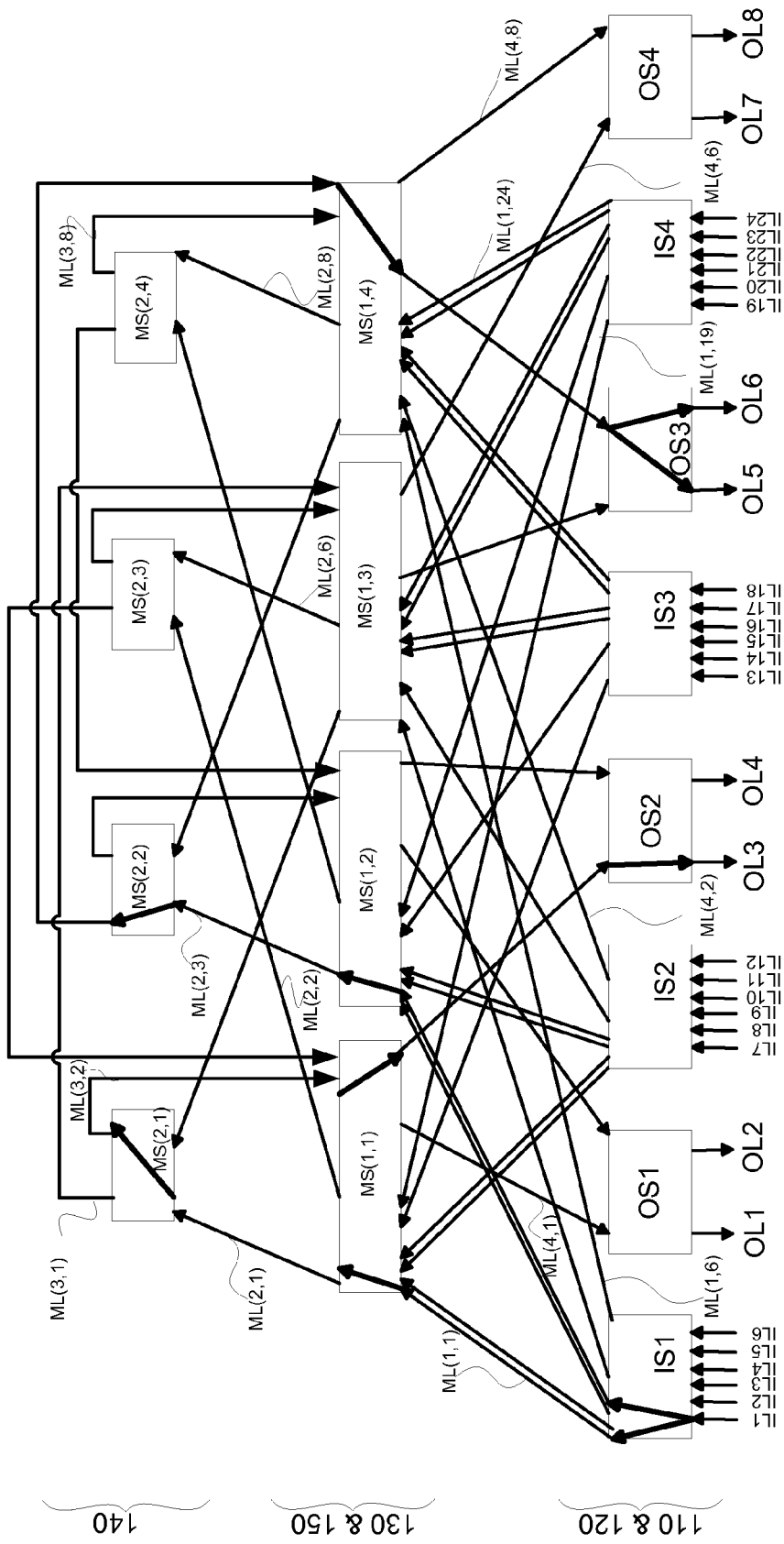
FIG. 2E is a diagram 200E of an exemplary Asymmetrical Butterfly fat tree network $V_{bft}(N_1,N_2,d,1)$ having inverse Benes connection topology of three stages with $N_2=8$, $N_1=p*N_2=24$, where p=3, and d=2 with exemplary unicast connections rearrangeably nonblocking network for unicast connections, in accordance with the invention.

Asymmetric RNB Unicast ($N_1>N_2$) Embodiments:

Referring to FIG. 2E, in one embodiment, an exemplary asymmetrical Butterfly fat tree network 200E with three stages of sixteen switches for satisfying communication requests, such as setting up a telephone call or a data call, or a connection between configurable logic blocks, between an input stage 110 and output stage 120 via middle stages 130 and 140 is shown where input stage 110 consists of four, six by six switches IS1-IS4 and output stage 120 consists of four, two by two switches OS1-OS4. Middle stage 130 consists of four, eight by four switches MS(1,1)-MS(1,4) and middle stage 140 consists of four, two by two switches MS(2,1)-MS(2,4).

Such a network can be operated in strictly non-blocking manner for unicast connections, because the switches in the input stage 110 are of size six by six, the switches in output stage 120 are of size two by two, and there are four switches in each of middle stage 130 and middle stage 140. Such a network can be operated in rearrangeably non-blocking manner for unicast connections, because the switches in the input stage 110 are of size six by six, the switches in output stage 120 are of size two by two, and there are four switches of size eight by four in middle stage 130, and four switches of size two by two in middle stage 140.

In one embodiment of this network each of the input switches IS1-IS4 and output switches OS1-OS4 are crossbar switches. The number of switches of input stage 110 and of output stage 120 can be denoted in general with the variable $$\frac{N_2}{d},$$

where $N_1$ is the total number of inlet links or and $N_2$ is the total number of outlet links and $N_1>N_2$ and $N_1=p*N_2$ where $p>1$. The number of middle switches in each middle stage is denoted by $$\frac{N_2}{d}.$$

The size of each input switch IS1-IS4 can be denoted in general with the notation $d_1*d_1$ and each output switch OS1-OS4 can be denoted in general with the notation $(d*d)$, where $$d_1 = N_1 \times \frac{d}{N_2} = p \times d.$$

The size of each switch in middle stage 130 can be denoted as $(d+d_1)*2d$. The size of each switch in the root stage (i.e., middle stage 140) can be denoted as $d*d$. The size of each switch in all the middle stages excepting middle stage 130 and root stage can be denoted as $2d*2d$ (In network 200E of FIG. 2E, there is no such middle stage). (In another embodiment, the size of each switch in any of the middle stages other than the middle stage 140, can be implemented as $d*2d$ and $d*d$ since the down coming middle links are never setup to the up going middle links. For example in network 200E of FIG. 2E, the down coming middle links ML(3,2) and ML(3,5) are never setup to the up going middle links ML(2,1) and ML(2,2) for the middle switch MS(1,1). So middle switch MS(1,1) can be implemented as a two by four switch with middle links ML(1,1) and ML(1,3) as inputs and middle links ML(2,1), ML(2,2), ML(4,1) and ML(4,2) as outputs; and a two by two switch with middle links ML(3,2) and ML(3,5) as inputs and middle links ML(4,1) and ML(4,2) as outputs).

A switch as used herein can be either a crossbar switch, or a network of switches each of which in turn may be a crossbar switch or a network of switches. An asymmetric Butterfly fat tree network can be represented with the notation $V_{bft}(N_1,N_2,d,s)$, where $N_1$ represents the total number of inlet links of all input switches (for example the links IL1-IL24), $N_2$ represents the total number of outlet links of all output switches (for example the links OL1-OL8), d represents the inlet links of each input switch where $N_1>N_2$, and s is the ratio of number of incoming links to each output switch to the outlet links of each output switch.

Each of the $$\frac{N_2}{d}$$

input switches IS1-IS4 are connected to exactly $$\frac{d_1}{2}$$

switches in middle stage 130 through $d_1$ links (for example input switch IS1 is connected to middle switch MS(1,1) through the links ML(1,1) and ML(1,2); input switch IS1 is connected to middle switch MS(1,2) through the links ML(1,3) and ML(1,4); input switch IS1 is connected to middle switch MS(1,3) through the link ML(1,5); input switch IS1 is connected to middle switch MS(1,4) through the link ML(1,6)).

Each of the $$\frac{N_2}{d}$$

middle switches MS(1,1)-MS(1,4) in the middle stage 130 are connected from exactly $$\frac{d_1}{2}$$

input switches through $d_1$ links (for example the links ML(1,1) and ML(1,2) are connected from input switch IS1 to middle switch MS(1,1); the links ML(1,7) and ML(1,8) are connected from input switch IS2 to middle switch MS(1,1); the link ML(1,13) is connected from input switch IS3 to middle switch MS(1,1); the link ML(1,19) is connected from input switch IS4 to middle switch MS(1,1)), and also are connected from exactly d switches in middle stage 140 through d links (for example the link ML(3,2) is connected to the middle switch MS(1,1) from middle switch MS(2,1); and the link ML(3,5) is connected to the middle switch MS(1,1) from middle switch MS(2,3)).

Similarly each of the $$\frac{N_2}{d}$$

middle switches MS(1,1)-MS(1,4) in the middle stage 130 are connected to exactly d switches in middle stage 140 through d links (for example the link ML(2,1) is connected from middle switch MS(1,1) to middle switch MS(2,1) and the link ML(2,2) is connected from middle switch MS(1,1) to middle switch MS(2,3)), and also are connected to exactly d output switches in output stage 120 through d links (for example the link ML(4,1) is connected to output switch OS1 from middle switch MS(1,1) and the link ML(4,2) is connected to output switch OS2 from middle switch MS(1,1)).

Similarly each of the $$\frac{N_2}{d}$$

middle switches MS(2,1)-MS(2,4) in the middle stage 140 are connected from exactly d switches in middle stage 130 through d links (for example the link ML(2,1) is connected to the middle switch MS(2,1) from middle switch MS(1,1) and the link ML(2,5) is connected to the middle switch MS(2,1) from middle switch MS(1,3)) and also are connected to exactly d switches in middle stage 130 through d links (for example the link ML(3,2) is connected from middle switch MS(2,1) to middle switch MS(1,1) and the link ML(3,1) is connected from middle switch MS(2,1) to middle switch MS(1,3)).

Each of the $$\frac{N_2}{d}$$

output switches OS1-OS4 are connected from exactly d switches in middle stage 130 through d links (for example output switch OS1 is connected from middle switch MS(1,1) through the link ML(4,1), and output switch OS1 is connected from middle switch MS(1,2) through the link ML(4,3)).

Finally the connection topology of the network 200E shown in FIG. 2E is known to be back to back inverse Benes connection topology.

In other embodiments the connection topology may be different from the embodiment of the network 200E of FIG. 2E. That is the way the links ML(1,1)-ML(1,24), ML(2,1)-ML(2,8), ML(3,1)-ML(3,8), and ML(4,1)-ML(4,8) are connected between the respective stages is different. Even though only one embodiment is illustrated, in general, the network $V_{bft}(N_1,N_2,d,s)$ can comprise any arbitrary type of connection topology. For example the connection topology of the network $V_{bft}(N_1,N_2,d,s)$ may be back to back Benes networks, Delta Networks and many more combinations. The applicant notes that the fundamental property of a valid connection topology of the $V_{bft}(N_1,N_2,d,s)$ network is, when no connections are setup from any input link all the output links should be reachable. Based on this property numerous embodiments of the network $V_{bft}(N_1,N_2,d,s)$ can be built. The embodiment of FIG. 2E is only one example of network $V_{bft}(N_1,N_2,d,s)$.

In the embodiment of FIG. 2E, each of the links ML(1,1)-ML(1,24), ML(2,1)-ML(2,8), ML(3,1)-ML(3,8) and ML(4,1)-ML(4,8) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,4) and MS(2,1)-MS(2,4) are referred to as middle switches or middle ports.

Figure 2F:
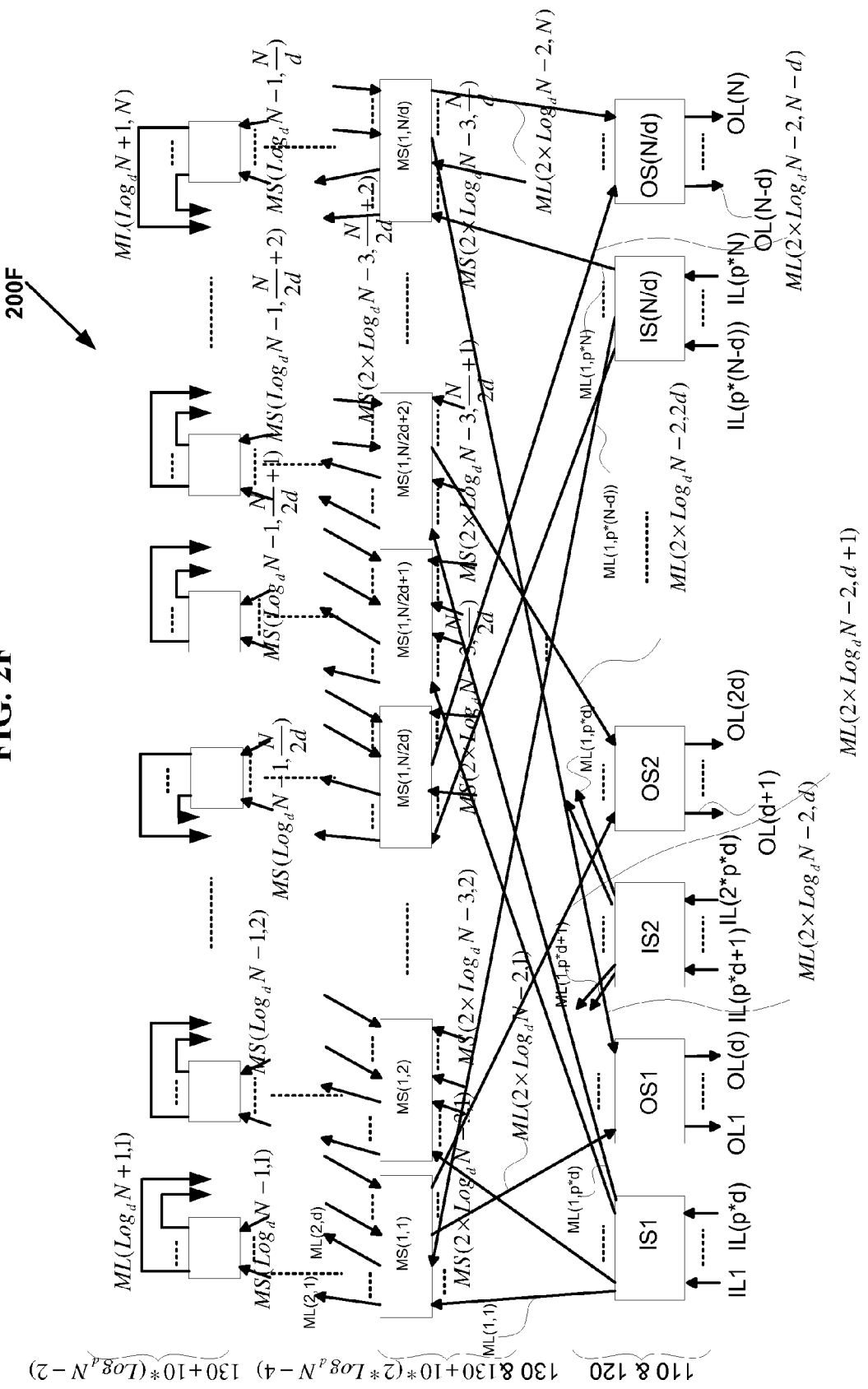
FIG. 2F is a diagram 200F of a general asymmetrical Butterfly fat tree network $V_{bft}(N_1,N_2,d,1)$ with $N_1=p*N_2$ and with ($\log_d N$) stages rearrangeably nonblocking network for unicast connections in accordance with the invention.

Generalized Asymmetric RNB Unicast ($N_1>N_2$) Embodiments:

Network 200F of FIG. 2F is an example of general asymmetrical Butterfly fat tree network $V_{bft}(N_1,N_2,d,s)$ with ($\log_d N$) stages where $N_1>N_2$ and $N_1=p*N_2$ where p>1. In network 200F of FIG. 2F, $N_2=N$ and $N_1=p*N$. The general asymmetrical Butterfly fat tree network $V_{bft}(N_1,N_2,d,s)$ can be operated in rearrangeably nonblocking manner for unicast when s=1 according to the current invention. (And in the example of FIG. 2F, s=1). The general asymmetrical Butterfly fat tree network $V_{bft}(N_1,N_2,d,s)$ with ($\log_d N$) stages has $d_1$ (where $$d_1 = N_1 \times \frac{d}{N_2} = p \times d$$

inlet links for each of $$\frac{N_2}{d}$$

input switches IS1-IS($N_2/d$) (for example the links IL1-IL(p*d) to the input switch IS1) and $d_1$ (=p×d) outgoing links for each of $$\frac{N_2}{d}$$

input switches IS1-IS($N_2/d$) (for example the links ML(1,1)-ML(1,(d+p*d)) to the input switch IS1). There are d outlet links for each of $$\frac{N_2}{d}$$

output switches OS1-OS($N_2/d$) (for example the links OL1-OL(d) to the output switch OS1) and d incoming links for each of $$\frac{N_2}{d}$$

output switches OS1-OS($N_2/d$) (for example ML($2 \times \log_d N_2-2,1$)-ML($2 \times \log_d N_2-2,d$) to the output switch OS1).

Each of the $$\frac{N_2}{d}$$

input switches IS1-IS($N_2$/d) are connected to exactly $$\frac{d_1}{2}$$

switches in middle stage 130 through $d_1$ links
  Each of the $$\frac{N_2}{d}$$

middle switches MS(1,1)-MS(1,$N_2$/d) in the middle stage 130 are connected from exactly $$\frac{d_1}{2}$$

input switches through $d_1$ links and also are connected from exactly d switches in middle stage 140 through d links.
  Similarly each of the $$\frac{N_2}{d}$$

middle switches MS(1,1)-MS(1,$2N_2$/d) in the middle stage 130 also are connected to exactly d switches in middle stage 140 through d links and also are connected to exactly d output switches in output stage 120 through d links.
  Similarly each of the $$\frac{N_2}{d}$$

middle switches $$MS(\text{Log}_d N_2 - 1, 1) - MS\left(\text{Log}_d N_2 - 1, \frac{N_2}{d}\right)$$

in the middle stage 130+10*($\text{Log}_d N_2-2$) are connected from exactly d switches in middle stage 130+10*($\text{Log}_d N_2-3$) through d links and also are connected to exactly d switches in middle stage 130+10*($\text{Log}_d N_2-1$) through d links.
  Each of the $$\frac{N_2}{d}$$

output switches OS1-OS($N_2$/d) are connected from exactly d switches in middle stage 130+10*(2*$\text{Log}_d N_2-4$) through d links.

As described before, again the connection topology of a general $V_{bft}(N_1,N_2,d,s)$ may be any one of the connection topologies. For example the connection topology of the network $V_{bft}(N_1,N_2,d,s)$ may be back to back inverse Benes networks, back to back Omega networks, back to back Benes networks, Delta Networks and many more combinations. The applicant notes that the fundamental property of a valid connection topology of the general $V_{bft}(N_1,N_2,d,s)$ network is, when no connections are setup from any input link if any output link should be reachable. Based on this property numerous embodiments of the network $V_{bft}(N_1,N_2,d,s)$ can be built. The embodiments of FIG. 2E is one example of network $V_{bft}(N_1,N_2,d,s)$ for s=1 and $N_1 > N_2$.

The general symmetrical Butterfly fat tree network $V_{bft}(N_1,N_2,d,s)$ can be operated in rearrangeably nonblocking manner for unicast when $s \geq 1$ according to the current invention.

Figure 3A:
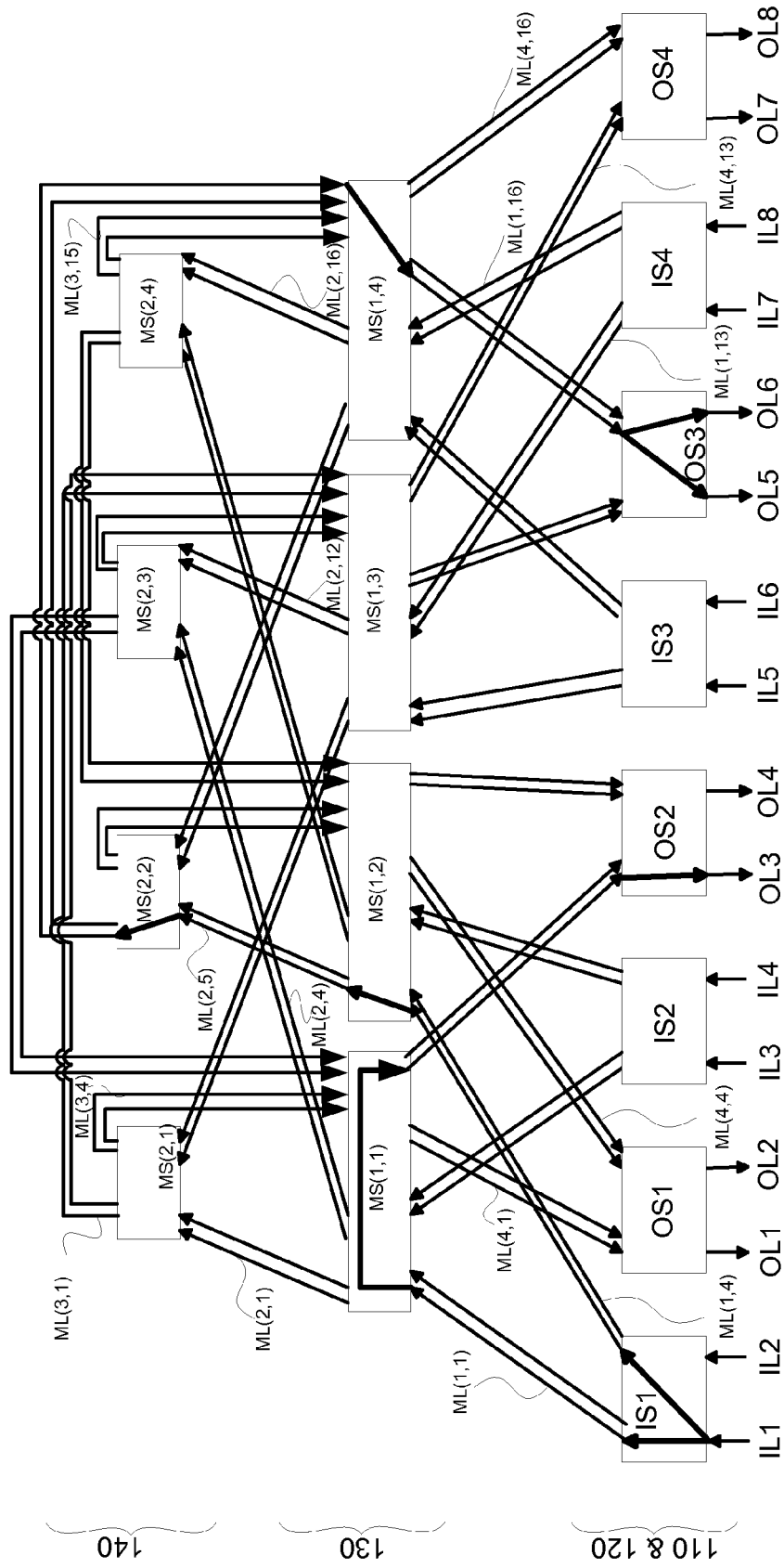
FIG. 3A is a diagram 300A of an exemplary symmetrical multi-link Butterfly fat tree network $V_{mlink-bft}(N,d,s)$ having inverse Benes connection topology of five stages with N=8, d=2 and s=2 with exemplary multicast connections, strictly nonblocking network for unicast connections and rearrangeably nonblocking network for arbitrary fan-out multicast connections, in accordance with the invention.

Multi-Link Butterfly Fat Tree Embodiments:
Symmetric RNB Embodiments:

Referring to FIG. 3A, in one embodiment, an exemplary symmetrical Multi-link Butterfly fat tree network 300A with three stages of sixteen switches for satisfying communication requests, such as setting up a telephone call or a data call, or a connection between configurable logic blocks, between an input stage 110 and output stage 120 via middle stages 130, and 140 is shown where input stage 110 consists of four, two by four switches IS1-IS4 and output stage 120 consists of four, four by two switches OS1-OS4. Input stage 110 and output stage 120 together belong to leaf stage. And all the middle stages excepting root stage namely middle stage 130 consists of four, eight by eight switches MS(1,1)-MS(1,4), and root stage i.e., middle stage 140 consists of four, four by four switches MS(2,1)-MS(2,4).

Such a network can be operated in strictly non-blocking manner for unicast connections, because the switches in the input stage 110 are of size two by four, the switches in output stage 120 are of size four by two, and there are four switches in each of middle stage 130 and middle stage 140. Such a network can be operated in rearrangeably non-blocking manner for multicast connections, because the switches in the input stage 110 are of size two by four, the switches in output stage 120 are of size four by two, and there are four switches in each of middle stage 130 and middle stage 140.

In one embodiment of this network each of the input switches IS1-IS4 and output switches OS1-OS4 are crossbar switches. The number of switches of input stage 110 and of output stage 120 can be denoted in general with the variable $$\frac{N}{d},$$

where N is the total number of inlet links or outlet links The number of middle switches in each middle stage is denoted by $$\frac{N}{d}.$$

The size of each input switch IS1-IS4 can be denoted in general with the notation d*2d and each output switch OS1-OS4 can be denoted in general with the notation 2d*d. Likewise, the size of each switch in any of the middle stages can be denoted as 4d*4d excepting that the size of each switch in middle stage 140 is denoted as 2d*2d. (In another embodiment, the size of each switch in any of the middle stages other than the middle stage 140, can be implemented as 2d*4d and 2d*2d since the down coming middle links are never setup to the up going middle links. For example in network 300A of FIG. 3A, the down coming middle links ML(3,3), ML(3,4), ML(3,9) and ML(3,10) are never setup to the up going middle links ML(2,1), ML(2,2), ML(2,3) and ML(2,4) for the middle switch MS(1,1). So middle switch MS(1,1) can be implemented as a four by eight switch with middle links ML(1,1), ML(1,2), ML(1,5) and ML(1,6) as inputs and middle links ML(2,1), ML(2,2), ML(2,3), ML(2,4), ML(4,1), ML(4,2), ML(4,3), and ML(4,4) as outputs; and a four by four switch with middle links ML(3,3), ML(3,4), ML(3,9) and ML(3,10) as inputs and middle links ML(4,1), ML(4,2), ML(4,3), and ML(4,4) as outputs).

Middle stage 140 is called as root stage. A switch as used herein can be either a crossbar switch, or a network of switches each of which in turn may be a crossbar switch or a network of switches. A symmetric Multi-link Butterfly fat tree network can be represented with the notation $V_{mlink\text{-}bft}$(N,d,s), where N represents the total number of inlet links of all input switches (for example the links IL1-IL8), d represents the inlet links of each input switch or outlet links of each output switch, and s is the ratio of number of outgoing links from each input switch to the inlet links of each input switch. Although it is not necessary that there be the same number of inlet links IL1-IL8 as there are outlet links OL1-OL8, in a symmetrical network they are the same.

Each of the $$\frac{N}{d}$$

input switches IS1-IS4 are connected to exactly d switches in middle stage 130 through 2×d links (for example input switch IS1 is connected to middle switch MS(1,1) through the links ML(1,1) and ML(1,2); and input switch IS1 is also connected to middle switch MS(1,2) through the links ML(1,3) and ML(1,4)).

Each of the $$\frac{N}{d}$$

middle switches MS(1,1)-MS(1,4) in the middle stage 130 are connected from exactly d input switches through 2×d links (for example the links ML(1,1) and ML(1,2) are connected to the middle switch MS(1,1) from input switch IS1; and the links ML(1,5) and ML(1,6) are connected to the middle switch MS(1,1) from input switch IS2) and are also connected from exactly d switches in middle stage 140 through 2×d links (for example the links ML(3,3) and ML(3, 4) are connected to the middle switch MS(1,1) from middle switch MS(2,1) and also the links ML(3,9) and ML(3,10) are connected to the middle switch MS(1,1) from middle switch MS(2,3)).

Each of the $$\frac{N}{d}$$

middle switches MS(1,1)-MS(1,4) in the middle stage 130 are connected to exactly d switches in middle stage 140 through 2×d links (for example the links ML(2,1) and ML(2, 2) are connected from middle switch MS(1,1) to middle switch MS(2,1), and the links ML(2,3) and ML(2,4) are connected from middle switch MS(1,1) to middle switch MS(2, 3)) and also are connected to exactly d output switches in output stage 120 through 2×d links (for example the links ML(4,1) and ML(4,2) are connected to output switch OS1 from middle switch MS(1,1), and the links ML(4,3) and ML(4,4) are connected to output switch OS2 from middle switch MS(1,1)).

Similarly each of the $$\frac{N}{d}$$

middle switches MS(2,1)-MS(2,4) in the middle stage 140 are connected from exactly d switches in middle stage 130 through 2×d links (for example the links ML(2,1) and ML(2, 2) are connected to the middle switch MS(2,1) from middle switch MS(1,1), and the links ML(2,9) and ML(2,10) are connected to the middle switch MS(2,1) from middle switch MS(1,3)), and also are connected to exactly d switches in middle stage 130 through 2×d links (for example the links ML(3,1) and ML(3,2) are connected from middle switch MS(2,1) to middle switch MS(1,3); and the links ML(3,3) and ML(3,4) are connected from middle switch MS(2,1) to middle switch MS(1,1)).

Each of the $$\frac{N}{d}$$

output switches OS1-OS4 are connected from exactly d switches in middle stage 130 through 2×d links (for example output switch OS1 is connected from middle switch MS(1,1) through the links ML(4,1), ML(4,2); and output switch OS1 is also connected from middle switch MS(1,2) through the links ML(4,5) and ML(4,6)).

Finally the connection topology of the network 300A shown in FIG. 3A is known to be back to back inverse Benes connection topology.

In other embodiments the connection topology may be different from the network 300A of FIG. 3A. That is the way the links ML(1,1)-ML(1,16), ML(2,1)-ML(2,16), ML(3,1)-ML(3,16), and ML(4,1)-ML(4,16) are connected between the respective stages is different. Even though only one embodiment is illustrated, in general, the network $V_{mlink\text{-}bft}$(N,d,s) can comprise any arbitrary type of connection topology. For example the connection topology of the network $V_{mlink\text{-}bft}$(N, d,s) may be back to back Benes networks, Delta Networks and many more combinations. The applicant notes that the fundamental property of a valid connection topology of the $V_{mlink\text{-}bft}$(N,d,s) network is, when no connections are setup from any input link all the output links should be reachable. Based on this property numerous embodiments of the network $V_{mlink\text{-}bft}$(N,d,s) can be built. The embodiment of FIG. 3A is only one example of network $V_{mlink\text{-}bft}$(N,d,s).

In the embodiment of FIG. 3A each of the links ML(1,1)-ML(1,16), ML(2,1)-ML(2,16), ML(3,1)-ML(3,16) and ML(4,1)-ML(4,16) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1, 1)-MS(1,4) and MS(2,1)-MS(2,4) are referred to as middle switches or middle ports. The middle stage 130 is also referred to as root stage and middle stage switches MS(2,1)-MS(2,4) are referred to as root stage switches.

In the example illustrated in FIG. 3A, a fan-out of four is possible to satisfy a multicast connection request if input switch is IS2, but only two switches in middle stage 130 will be used. Similarly, although a fan-out of three is possible for a multicast connection request if the input switch is IS1, again only a fan-out of two is used. The specific middle switches that are chosen in middle stage 130 when selecting a fan-out of two is irrelevant so long as at most two middle switches are selected to ensure that the connection request is satisfied. In essence, limiting the fan-out from input switch to no more than two middle switches permits the network 300A, to be operated in rearrangeably nonblocking manner in accordance with the invention.

The connection request of the type described above can be unicast connection request, a multicast connection request or a broadcast connection request, depending on the example. In case of a unicast connection request, a fan-out of one is used, i.e. a single middle stage switch in middle stage 130 is used to satisfy the request. Moreover, although in the above-described embodiment a limit of two has been placed on the fan-out into the middle stage switches in middle stage 130, the limit can be greater depending on the number of middle stage switches in a network (while maintaining the rearrangeably nonblocking nature of operation of the network for multicast connections). However any arbitrary fan-out may be used within any of the middle stage switches and the output stage switches to satisfy the connection request.

Figure 3B:
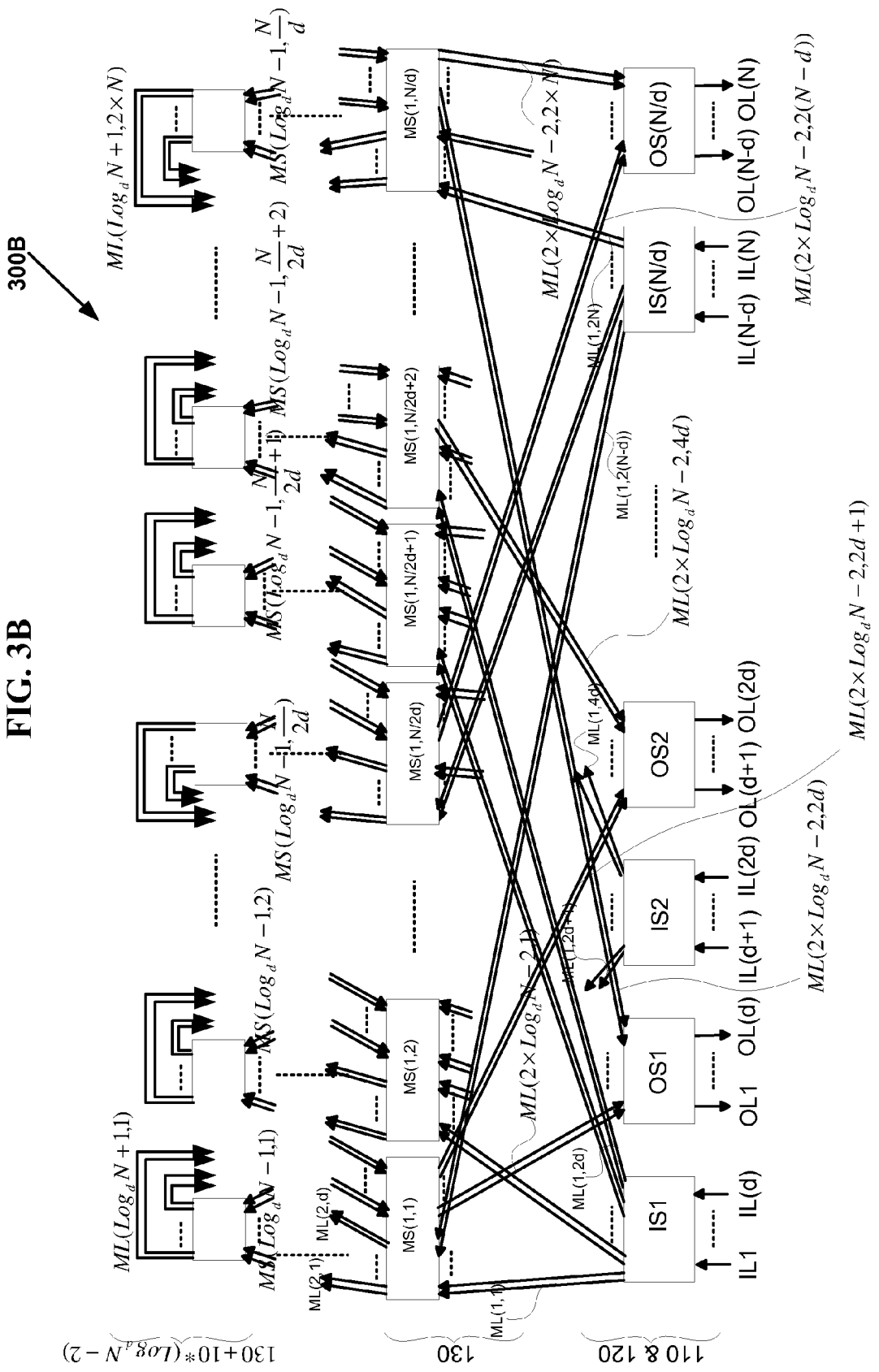
FIG. 3B is a diagram 300B of a general symmetrical multi-link Butterfly fat tree network $V_{mlink-bft}(N,d,2)$ with ($\log_d N$) stages strictly nonblocking network for unicast connections and rearrangeably nonblocking network for arbitrary fan-out multicast connections in accordance with the invention.

Generalized Symmetric RNB Embodiments:

Network 300B of FIG. 3B is an example of general symmetrical Multi-link Butterfly fat tree network $V_{mlink\text{-}bft}(N,d,s)$ with $(\log_d N)$ stages. The general symmetrical Multi-link Butterfly fat tree network $V_{mlink\text{-}bft}(N,d,s)$ can be operated in rearrangeably nonblocking manner for multicast when s=2 according to the current invention. Also the general symmetrical Multi-link Butterfly fat tree network $V_{mlink\text{-}bft}(N,d,s)$ can be operated in strictly nonblocking manner for unicast if s=2 according to the current invention. (And in the example of FIG. 3B, s=2). The general symmetrical Multi-link Butterfly fat tree network $V_{mlink\text{-}bft}(N,d,s)$ with $(\log_d N)$ stages has d inlet links for each of $$\frac{N}{d}$$

input switches IS1-IS(N/d) (for example the links IL1-IL(d) to the input switch IS1) and 2×d outgoing links for each of $$\frac{N}{d}$$

input switches IS1-IS(N/d) (for example the links ML(1,1)-ML(1,2d) to the input switch IS1). There are d outlet links for each of $$\frac{N}{d}$$

output switches OS1-OS(N/d) (for example the links OL1-OL(d) to the output switch OS1) and 2×d incoming links for each of $$\frac{N}{d}$$

output switches OS1-OS(N/d) (for example ML(2×$Log_d$ N−2,1)-ML(2×$Log_d$ N−2,2×d) to the output switch OS1).

Each of the $$\frac{N}{d}$$

input switches IS1-IS(N/d) are connected to exactly d switches in middle stage 130 through 2×d links.

Each of the $$\frac{N}{d}$$

middle switches MS(1,1)-MS(1,N/d) in the middle stage 130 are connected from exactly d input switches through 2×d links and also are connected to exactly d switches in middle stage 140 through 2×d links.

Similarly each of the $$\frac{N}{d}$$

middle switches MS(1,1)-MS(1,N/d) in the middle stage 130 are also connected from exactly d switches in middle stage 140 through 2×d links and also are connected to exactly d output switches in output stage 120 through 2×d links.

Similarly each of the $$\frac{N}{d}$$

middle switches $$MS(\text{Log}_d N - 1, 1) - MS\left(\text{Log}_d N - 1, \frac{N}{d}\right)$$

in the middle stage 130+10*($Log_d$ N−2) are connected from exactly d switches in middle stage 130+10*($Log_d$ N−3) through 2×d links and also are connected to exactly d switches in middle stage 130+10*($Log_d$ N−1) through 2×d links.

Each of the $$\frac{N}{d}$$

output switches OS1-OS(N/d) are connected from exactly d switches in middle stage 130 through 2×d links.

As described before, again the connection topology of a general $V_{mlink\text{-}bft}(N,d,s)$ may be any one of the connection topologies. For example the connection topology of the network $V_{mlink\text{-}bft}(N,d,s)$ may be back to back inverse Benes networks, back to back Omega networks, back to back Benes networks, Delta Networks and many more combinations. The applicant notes that the fundamental property of a valid connection topology of the general $V_{mlink\text{-}bft}(N,d,s)$ network is, when no connections are setup from any input link if any output link should be reachable. Based on this property numerous embodiments of the network $V_{mlink-bft}(N,d,s)$ can be built. The embodiment of FIG. 3A are one example of network $V_{mlink-bft}(N,d,s)$.

The general symmetrical Multi-link Butterfly fat tree network $V_{mlink-bft}(N,d,s)$ can be operated in rearrangeably nonblocking manner for multicast when $s \geq 2$ according to the current invention. Also the general symmetrical Multi-link Butterfly fat tree network $V_{mlink-bft}(N,d,s)$ can be operated in strictly nonblocking manner for unicast if $s \geq 2$ according to the current invention.

Every switch in the Multi-link Butterfly fat tree networks discussed herein has multicast capability. In a $V_{mlink-bft}(N,d,s)$ network, if a network inlet link is to be connected to more than one outlet link on the same output switch, then it is only necessary for the corresponding input switch to have one path to that output switch. This follows because that path can be multicast within the output switch to as many outlet links as necessary. Multicast assignments can therefore be described in terms of connections between input switches and output switches. An existing connection or a new connection from an input switch to r' output switches is said to have fan-out r'. If all multicast assignments of a first type, wherein any inlet link of an input switch is to be connected in an output switch to at most one outlet link are realizable, then multicast assignments of a second type, wherein any inlet link of each input switch is to be connected to more than one outlet link in the same output switch, can also be realized. For this reason, the following discussion is limited to general multicast connections of the type (with fan-out r', $$1 \leq r' \leq \frac{N}{d})$$

although the same discussion is applicable to the second type.

To characterize a multicast assignment, for each inlet link $$i \in \left\{1, 2, \ldots, \frac{N}{d}\right\},$$

let $I_i = O$, where $$O \subset \left\{1, 2, \ldots, \frac{N}{d}\right\},$$

denote the subset of output switches to which inlet link i is to be connected in the multicast assignment. For example, the network of FIG. 3A shows an exemplary three-stage network, namely $V_{mlink-bft}(8,2,2)$, with the following multicast assignment $I_1 = \{2,3\}$ and all other $I_j = \phi$ for $j = [2-8]$. It should be noted that the connection $I_1$ fans out in the first stage switch IS1 into middle switches MS(1,1) and MS(1,2) in middle stage 130, and fans out in middle switches MS(1,1) and MS(1,2) only once into output switch OS2 in output stage 120 and middle switch MS(2,2) in middle stage 140 respectively.

The connection $I_1$ also fans out in middle switch MS(2,2) only once into middle switches MS(1,4) in middle stage 130. The connection $I_1$ also fans out in middle switch MS(1,4) only once into output switch OS3 in output stage 120. Finally the connection $I_1$ fans out once in the output stage switch OS2 into outlet link OL3 and in the output stage switch OS3 twice into the outlet links OL5 and OL6. In accordance with the invention, each connection can fan out in the input stage switch into at most two middle stage switches in middle stage 130.

Figure 3C:
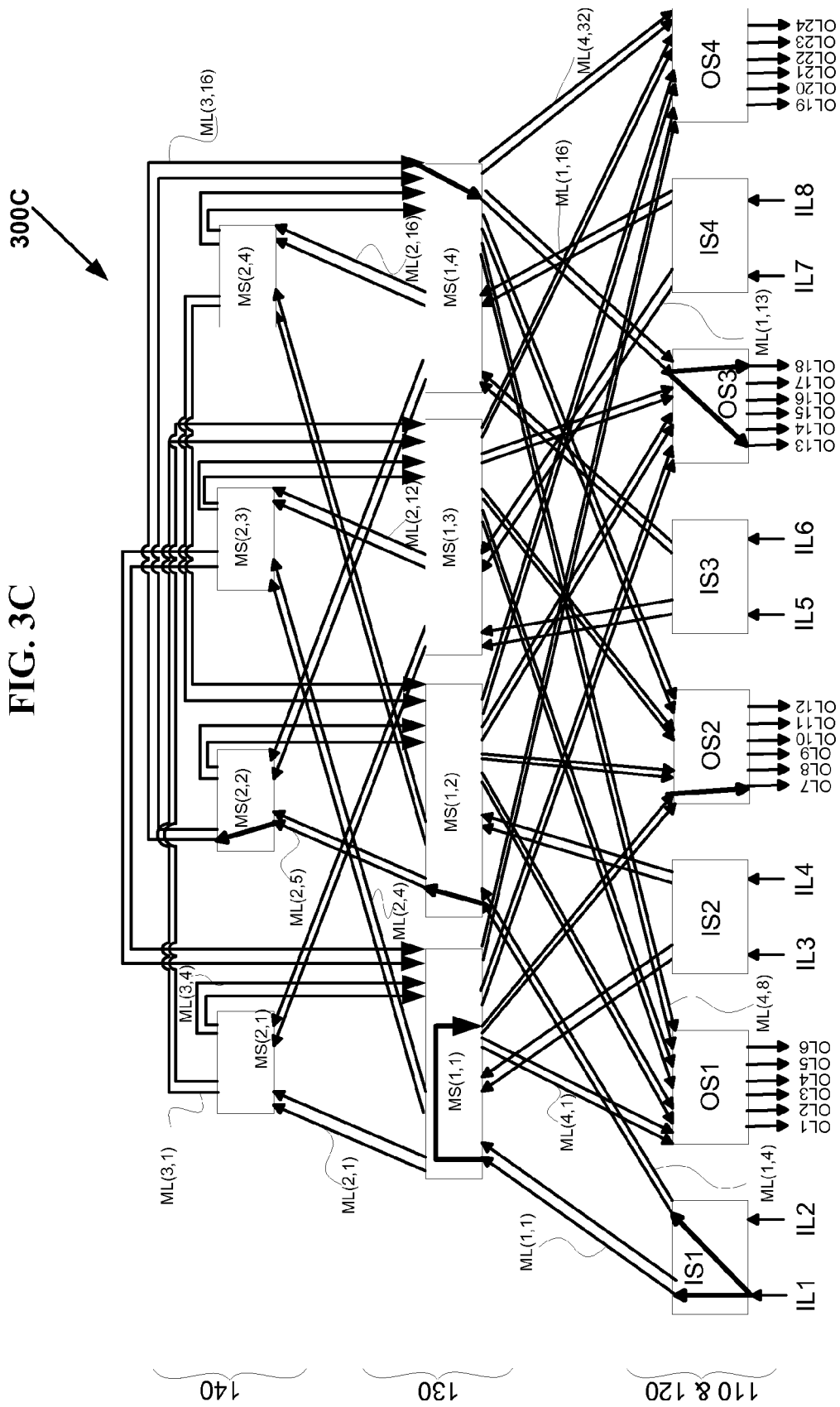
FIG. 3C is a diagram 300C of an exemplary asymmetrical multi-link Butterfly fat tree network $V_{mlink-bft}(N_1,N_2,d,2)$ having inverse Benes connection topology of five stages with $N_1=8$, $N_2=p*N_1=24$ where p=3, and d=2 with exemplary multicast connections, strictly nonblocking network for unicast connections and rearrangeably nonblocking network for arbitrary fan-out multicast connections, in accordance with the invention.

Asymmetric RNB ($N_2 > N_1$) Embodiments:

Referring to FIG. 3C, in one embodiment, an exemplary asymmetrical Multi-link Butterfly fat tree network 300C with three stages of sixteen switches for satisfying communication requests, such as setting up a telephone call or a data call, or a connection between configurable logic blocks, between an input stage 110 and output stage 120 via middle stages 130 and 140 is shown where input stage 110 consists of four, two by four switches IS1-IS4 and output stage 120 consists of four, eight by six switches OS1-OS4. Middle stage 130 consists of four, eight by twelve switches MS(1,1)-MS(1,4) and middle stage 140 consists of four, four by four switches MS(2,1)-MS(2,4).

Such a network can be operated in strictly non-blocking manner for unicast connections, because the switches in the input stage 110 are of size two by four, the switches in output stage 120 are of size eight by six, and there are four switches in each of middle stage 130 and middle stage 140. Such a network can be operated in rearrangeably non-blocking manner for multicast connections, because the switches in the input stage 110 are of size two by four, the switches in output stage 120 are of size eight by six, and there are four switches of size eight by twelve in middle stage 130 and four switches of size four by four in middle stage 140.

In one embodiment of this network each of the input switches IS1-IS4 and output switches OS1-OS4 are crossbar switches. The number of switches of input stage 110 and of output stage 120 can be denoted in general with the variable $$\frac{N_1}{d},$$

where $N_1$ is the total number of inlet links or and $N_2$ is the total number of outlet links and $N_2 > N_1$ and $N_2 = p*N_1$ where $p > 1$. The number of middle switches in each middle stage is denoted by $$\frac{N_1}{d}.$$

The size of each input switch IS1-IS4 can be denoted in general with the notation $d*2d$ and each output switch OS1-OS4 can be denoted in general with the notation $(d+d_2)*d_2$, where $$d_2 = N_2 \times \frac{d}{N_1} = p \times d.$$

The size of each switch in middle stage 130 can be denoted as $4d*2(d+d_2)$. The size of each switch in the root stage (i.e., middle stage 140) can be denoted as $2d*2d$. The size of each switch in all the middle stages excepting middle stage 130 and root stage can be denoted as $4d*4d$ (In network 300C of FIG. 3C, there is no such middle stage). (In another embodiment, the size of each switch in any of the middle stages other than the middle stage 140, can be implemented as $2d*4d$ and $2d*2d$ since the down coming middle links are never setup to the up going middle links. For example in network 300C of FIG. 3C, the down coming middle links ML(3,3), ML(3,4), ML(3,9) and ML(3,10) are never setup to the up going middle links ML(2,1), ML(2,2), ML(2,3) and ML(2,4) for the middle switch MS(1,1). So middle switch MS(1,1) can be implemented as a four by eight switch with middle links ML(1,1), ML(1,2), ML(1,5) and ML(1,6) as inputs and middle links ML(2,1), ML(2,2), ML(2,3), ML(2,4), ML(4,1), ML(4,2), ML(4,3), and ML(4,4) as outputs; and a four by four switch with middle links ML(3,3), ML(3,4), ML(3,9) and ML(3,10) as inputs and middle links ML(4,1), ML(4,2), ML(4,3), and ML(4,4) as outputs).

A switch as used herein can be either a crossbar switch, or a network of switches each of which in turn may be a crossbar switch or a network of switches. An asymmetric Multi-link Butterfly fat tree network can be represented with the notation $V_{mlink\text{-}bft}(N_1,N_2,d,s)$, where $N_1$ represents the total number of inlet links of all input switches (for example the links IL1-IL8), $N_2$ represents the total number of outlet links of all output switches (for example the links OL1-OL24), d represents the inlet links of each input switch where $N_2 > N_1$, and s is the ratio of number of outgoing links from each input switch to the inlet links of each input switch.

Each of the $$\frac{N_1}{d}$$

input switches IS1-IS4 are connected to exactly d switches in middle stage 130 through $2 \times d$ links (for example input switch IS1 is connected to middle switch MS(1,1) through the links ML(1,1) and ML(1,2), and input switch IS1 is also connected to MS(1,2) through the links ML(1,3) and ML(1,4)).

Each of the $$\frac{N_1}{d}$$

middle switches MS(1,1)-MS(1,4) in the middle stage 130 are connected from exactly d input switches through $2 \times d$ links (for example the links ML(1,1) and ML(1,2) are connected to the middle switch MS(1,1) from input switch IS1 and the links ML(1,5) and ML(1,6) are connected to the middle switch MS(1,1) from input switch IS2) and are also connected from exactly d switches in middle stage 140 through $2 \times d$ links (for example the links ML(3,3) and ML(3,4) are connected to the middle switch MS(1,1) from middle switch MS(2,1), and the links ML(3,9) and ML(3,10) are connected to the middle switch MS(1,1) from middle switch MS(2,3)).

Similarly each of the $$\frac{N_1}{d}$$

middle switches MS(1,1)-MS(1,4) in the middle stage 130 are connected to exactly d switches in middle stage 140 through $2 \times d$ links (for example the links ML(2,1) and ML(2,2) are connected from middle switch MS(1,1) to middle switch MS(2,1), and the links ML(2,3) and ML(2,4) are connected from middle switch MS(1,1) to middle switch MS(2,3)), and also are connected to exactly $$\frac{d_2}{2}$$

output switches in output stage 120 through $d_2$ links (for example the links ML(4,1) and ML(4,2) are connected from middle switch MS(1,1) to output switch OS1; the links ML(4,3) and ML(4,4) are connected from middle switch MS(1,1) to output switch OS2; the links ML(4,4) and ML(4,6) are connected from middle switch MS(1,1) to output switch OS3; and the links ML(4,7) and ML(4,8) are connected from middle switch MS(1,1) to output switch OS4).

Similarly each of the $$\frac{N_1}{d}$$

middle switches MS(2,1)-MS(2,4) in the middle stage 140 are connected from exactly d switches in middle stage 130 through $2 \times d$ links (for example the links ML(2,1) and ML(2,2) are connected to the middle switch MS(2,1) from middle switch MS(1,1); and the links ML(2,9) and ML(2,10) are connected to the middle switch MS(2,1) from middle switch MS(1,3)) and also are connected to exactly d switches in middle stage 130 through $2 \times d$ links (for example the links ML(3,3) and ML(3,4) are connected from middle switch MS(2,1) to middle switch MS(1,1); and the links ML(3,1) and ML(3,2) are connected from middle switch MS(2,1) to middle switch MS(1,3)).

Each of the $$\frac{N_1}{d}$$

output switches OS1-OS4 are connected from exactly $$\frac{d_2}{2}$$

switches in middle stage 130 through $d_2$ links (for example output switch OS1 is connected from middle switch MS(1,1) through the links ML(4,1) and ML(4,2); output switch OS1 is connected from middle switch MS(1,2) through the links ML(4,9) and ML(4,10); output switch OS1 is connected from middle switch MS(1,3) through the links ML(4,17) and ML(4,18); output switch OS1 is connected from middle switch MS(1,4) through the links ML(4,25) and ML(4,26)).

Finally the connection topology of the network 300C shown in FIG. 3C is known to be back to back inverse Benes connection topology.

In other embodiments the connection topology may be different from the embodiment of the network 300C of FIG. 3C. That is the way the links ML(1,1)-ML(1,16), ML(2,1)-ML(2,16), ML(3,1)-ML(3,16), and ML(4,1)-ML(4,32) are connected between the respective stages is different. Even though only one embodiment is illustrated, in general, the network $V_{mlink\text{-}bft}(N_1,N_2,d,s)$ can comprise any arbitrary type of connection topology. For example the connection topology of the network $V_{mlink\text{-}bft}(N_1,N_2,d,s)$ may be back to back Benes networks, Delta Networks and many more combinations. The applicant notes that the fundamental property of a valid connection topology of the $V_{mlink\text{-}bft}(N_1,N_2,d,s)$ network is, when no connections are setup from any input link all the output links should be reachable. Based on this property numerous embodiments of the network $V_{mlink-bft}(N_1,N_2,d,s)$ can be built. The embodiment of FIG. 3C, are only one example of network $V_{mlink-bft}(N_1,N_2d,s)$.

In the embodiment of FIG. 3C, each of the links ML(1,1)-ML(1,16), ML(2,1)-ML(2,16), ML(3,1)-ML(3,16) and ML(4,1)-ML(4,32) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,4) and MS(2,1)-MS(2,4) are referred to as middle switches or middle ports. The middle stage 130 is also referred to as root stage and middle stage switches MS(1,2)-MS(2,4) are referred to as root stage switches.

In the example illustrated in FIG. 3C, a fan-out of four is possible to satisfy a multicast connection request if input switch is IS2, but only two switches in middle stage 130 will be used. Similarly, although a fan-out of three is possible for a multicast connection request if the input switch is IS1, again only a fan-out of two is used. The specific middle switches that are chosen in middle stage 130 when selecting a fan-out of two is irrelevant so long as at most two middle switches are selected to ensure that the connection request is satisfied. In essence, limiting the fan-out from input switch to no more than two middle switches permits the network 300C, to be operated in rearrangeably nonblocking manner in accordance with the invention.

The connection request of the type described above can be unicast connection request, a multicast connection request or a broadcast connection request, depending on the example. In case of a unicast connection request, a fan-out of one is used, i.e. a single middle stage switch in middle stage 130 is used to satisfy the request. Moreover, although in the above-described embodiment a limit of two has been placed on the fan-out into the middle stage switches in middle stage 130, the limit can be greater depending on the number of middle stage switches in a network (while maintaining the rearrangeably nonblocking nature of operation of the network for multicast connections). However any arbitrary fan-out may be used within any of the middle stage switches and the output stage switches to satisfy the connection request.

Figure 3D:
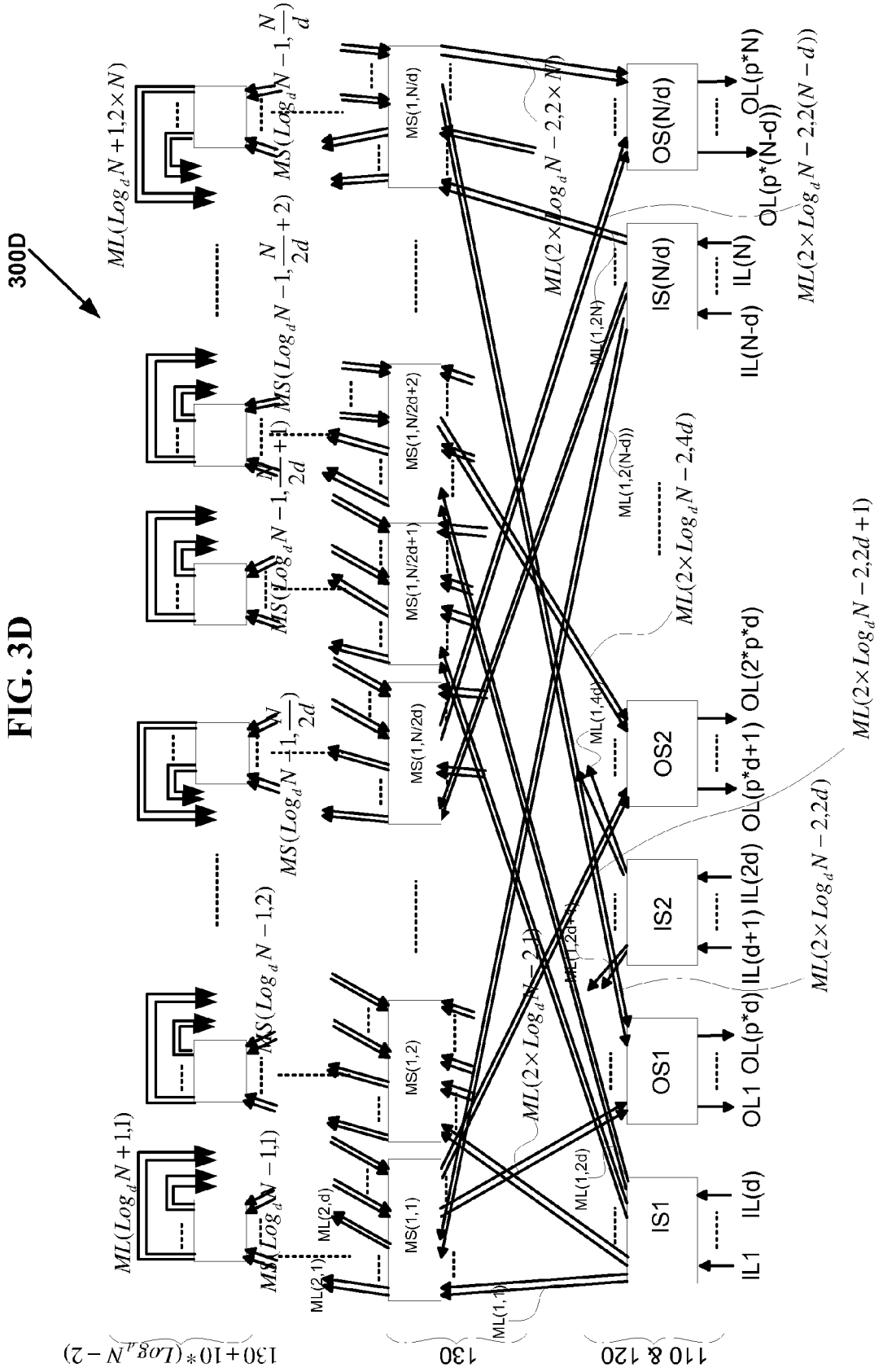
FIG. 3D is a diagram 300D of a general asymmetrical multi-link Butterfly fat tree network $V_{mlink-bft}(N_1,N_2,d,2)$ with $N_2=p*N_1$ and with ($\log_d N$) stages strictly nonblocking network for unicast connections and rearrangeably nonblocking network for arbitrary fan-out multicast connections in accordance with the invention.

Generalized Asymmetric RNB ($N_2 > N_1$) Embodiments:

Network 300D of FIG. 3D is an example of general asymmetrical Multi-link Butterfly fat tree network $V_{mlink-bft}(N_1, N_2,d,s)$ with ($\log_d N$) stages where $N_2>N_1$ and $N_2=p*N$, where p>1. In network 300D of FIG. 3D, $N_1=N$ and $N_2=p*N$. The general asymmetrical Multi-link Butterfly fat tree network $V_{mlink-bft}(N_1,N_2,d,s)$ can be operated in rearrangeably nonblocking manner for multicast when s=2 according to the current invention. Also the general asymmetrical Multi-link Butterfly fat tree network $V_{mlink-bft}(N_1,N_2,d,s)$ can be operated in strictly nonblocking manner for unicast if s=2 according to the current invention. (And in the example of FIG. 3D, s=2). The general asymmetrical Multi-link Butterfly fat tree network $V_{mlink-bft}(N_1,N_2,d,s)$ with ($\log_d N$) stages has d inlet links for each of $$\frac{N_1}{d}$$

input switches IS1-IS($N_1/d$) (for example the links IL1-IL(d) to the input switch IS1) and $2 \times d$ outgoing links for each of $$\frac{N_1}{d}$$

input switches IS1-IS($N_1/d$) (for example the links ML(1,1)-ML(1,2d) to the input switch IS1). There are $d_2$ (where $$\left(\text{where } d_2 = N_2 \times \frac{d}{N_1} = p \times d\right)$$

outlet links for each of $$\frac{N_1}{d}$$

output switches OS1-OS($N_1/d$) (for example the links OL1-OL(p*d) to the output switch OS1) and $d+d_2$ (=$d+p \times d$) incoming links for each of $$\frac{N_1}{d}$$

output switches OS1-OS($N_1/d$) (for example ML($2 \times \text{Log}_d N_1-2,1$)-ML($2 \times \text{Log}_d N_1-2, d+d_2$) to the output switch OS1).

Each of the $$\frac{N_1}{d}$$

input switches IS1-IS($N_1/d$) are connected to exactly d switches in middle stage 130 through $2 \times d$ links.

Each of the $$\frac{N_1}{d}$$

middle switches MS(1,1)-MS(1, $N_1/d$) in the middle stage 130 are connected from exactly d input switches through $2 \times d$ links and also are connected to exactly d switches in middle stage 140 through $2 \times d$ links.

Similarly each of the $$\frac{N_1}{d}$$

middle switches MS(1,1)-MS(1,$N_1/d$) in the middle stage 130 are connected from exactly d switches in middle stage 140 through $2 \times d$ links and also are connected to exactly $$\frac{d+d_2}{2}$$

output switches in output stage 120 through $d+d_2$ links.

Similarly each of the $$\frac{N_1}{d}$$

middle switches $$MS(Log_d N_1 - 1, 1) - MS\left(Log_d N_1 - 1, \frac{N_1}{d}\right)$$

in the middle stage $130+10*(Log_d N_1-2)$ are connected from exactly d switches in middle stage $130+10*(Log_d N_1-3)$ through $2 \times d$ links and also are connected to exactly d switches in middle stage $130+10*(Log_d N_1-1)$ through $2 \times d$ links.

Each of the $$\frac{N_1}{d}$$

output switches $OS1\text{-}OS(N_1/d)$ are connected from exactly $$\frac{d+d_2}{2}$$

switches in middle stage 130 through $d+d_2$ links.

As described before, again the connection topology of a general $V_{mlink\text{-}bft}(N_1,N_2,d,s)$ may be any one of the connection topologies. For example the connection topology of the network $V_{mlink\text{-}bft}(N_1,N_2,d,s)$ may be back to back inverse Benes networks, back to back Omega networks, back to back Benes networks, Delta Networks and many more combinations. The applicant notes that the fundamental property of a valid connection topology of the general $V_{mlink\text{-}bft}(N_1,N_2,d,s)$ network is, when no connections are setup from any input link if any output link should be reachable. Based on this property numerous embodiments of the network $V_{mlink\text{-}bft}(N_1,N_2,d,s)$ can be built. The embodiment of FIG. 3C is one example of network $V_{mlink\text{-}bft}(N_1,N_2,d,s)$ for s=2 and $N_2 > N_1$.

The general asymmetrical Multi-link Butterfly fat tree network $V_{mlink\text{-}bft}(N_1,N_2,d,s)$ can be operated in rearrangeably nonblocking manner for multicast when $s \geq 2$ according to the current invention. Also the general symmetrical Multi-link Butterfly fat tree network $V_{mlink\text{-}bft}(N_1,N_2,d,s)$ can be operated in strictly nonblocking manner for unicast if $s \geq 2$ according to the current invention.

For example, the network of FIG. 3C shows an exemplary three-stage network, namely $V_{mlink\text{-}bft}(8,24,2,2)$, with the following multicast assignment $I_1=\{2,3\}$ and all other $I_j=\phi$ for j=[2-8]. It should be noted that the connection $I_1$ fans out in the first stage switch IS1 into middle switches MS(1,1) and MS(1,2) in middle stage 130, and fans out in middle switches MS(1,1) and MS(1,2) only once into output switch OS2 in output stage 120 and middle switch MS(2,2) in middle stage 140.

The connection $I_1$ also fans out in middle switch MS(2,2) only once into middle switches MS(1,4) in middle stage 130. The connection $I_1$ also fans out in middle switch MS(1,4) only once into output switch OS3 in output stage 120. Finally the connection $I_1$ fans out once in the output stage switch OS2 into outlet link OL7 and in the output stage switch OS3 twice into the outlet links OL13 and OL18. In accordance with the invention, each connection can fan out in the input stage switch into at most two middle stage switches in middle stage 130.

Figure 3E:
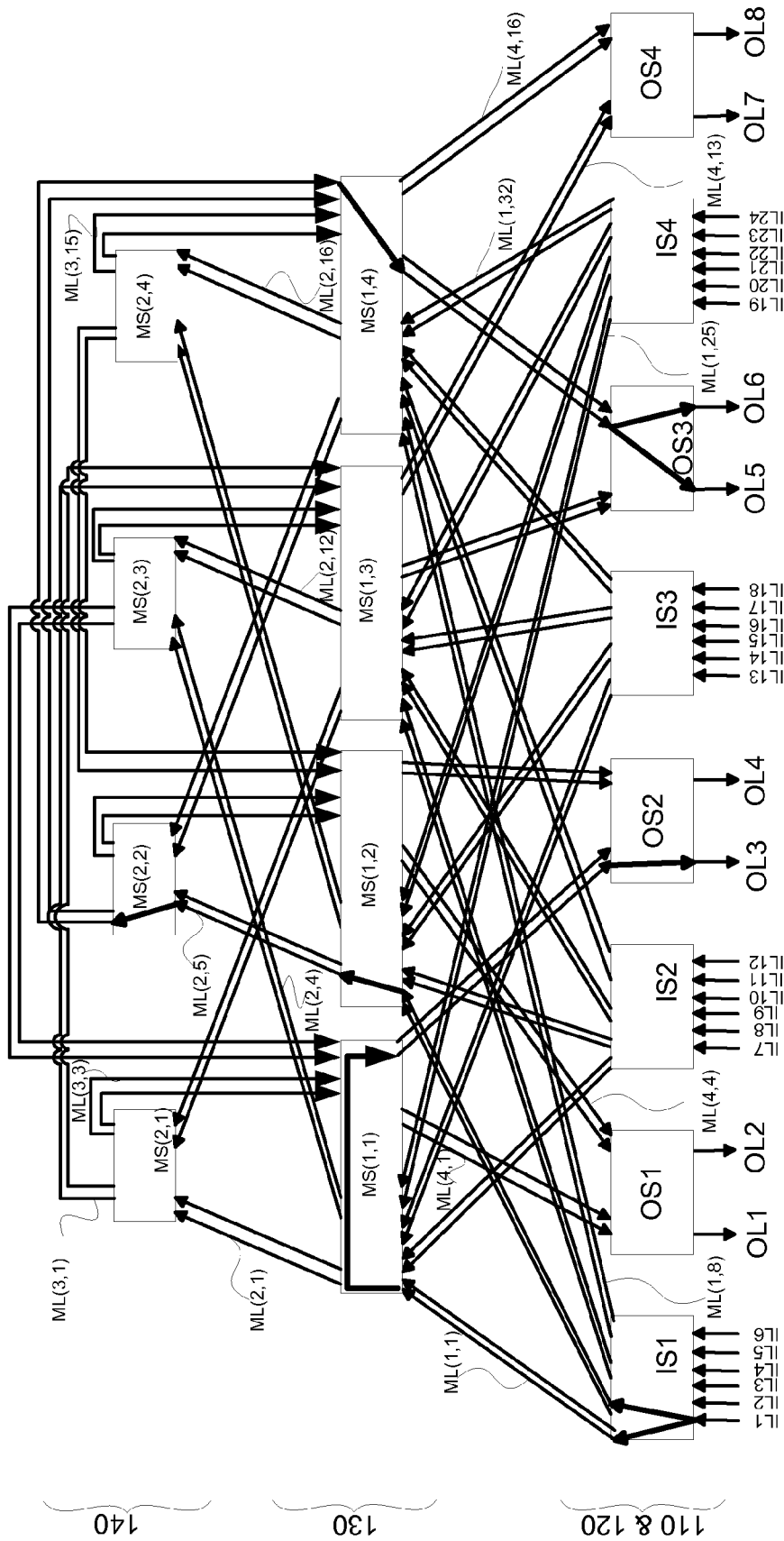
FIG. 3E is a diagram 300E of an exemplary asymmetrical multi-link Butterfly fat tree network $V_{mlink-bft}(N_1,N_2,d,2)$ having inverse Benes connection topology of five stages with $N_2=8$, $N_1=p*N_2=24$, where p=3, and d=2 with exemplary multicast connections, strictly nonblocking network for unicast connections and rearrangeably nonblocking network for arbitrary fan-out multicast connections, in accordance with the invention.

Asymmetric RNB ($N_1 > N_2$) Embodiments:

Referring to FIG. 3E, in one embodiment, an exemplary asymmetrical Multi-link Butterfly fat tree network 300E with three stages of sixteen switches for satisfying communication requests, such as setting up a telephone call or a data call, or a connection between configurable logic blocks, between an input stage 110 and output stage 120 via middle stages 130 and 140 is shown where input stage 110 consists of four, six by eight switches IS1-IS4 and output stage 120 consists of four, four by two switches OS1-OS4. Middle stage 130 consists of four, twelve by eight switches MS(1,1)-MS(1,4) and middle stage 140 consists of four, four by four switches MS(2,1)-MS(2,4).

Such a network can be operated in strictly non-blocking manner for unicast connections, because the switches in the input stage 110 are of size six by eight, the switches in output stage 120 are of size four by two, and there are four switches in each of middle stage 130 and middle stage 140. Such a network can be operated in rearrangeably non-blocking manner for multicast connections, because the switches in the input stage 110 are of size six by eight, the switches in output stage 120 are of size four by two, and there are four switches of size twelve by eight in middle stage 130, and four switches of size four by four in middle stage 140.

In one embodiment of this network each of the input switches IS1-IS4 and output switches OS1-OS4 are crossbar switches. The number of switches of input stage 110 and of output stage 120 can be denoted in general with the variable $$\frac{N_2}{d},$$

where $N_1$ is the total number of inlet links or and $N_2$ is the total number of outlet links and $N_1 > N_2$ and $N_1 = p*N_2$ where p>1. The number of middle switches in each middle stage is denoted by $$\frac{N_2}{d}.$$

The size of each input switch IS1-IS4 can be denoted in general with the notation $d_1*(d+d_1)$ and each output switch OS1-OS4 can be denoted in general with the notation $(2d*d)$, where $$d_1 = N_1 \times \frac{d}{N_2} = p \times d.$$

The size of each switch in middle stage 130 can be denoted as $2(d+d_1)*4d$. The size of each switch in the root stage (i.e., middle stage 140) can be denoted as $2d*2d$. The size of each switch in all the middle stages excepting middle stage 130 and root stage can be denoted as $4d*4d$ (In network 300C of FIG. 3C, there is no such middle stage). (In another embodiment, the size of each switch in any of the middle stages other than the middle stage 140, can be implemented as $2d*4d$ and $2d*2d$ since the down coming middle links are never setup to the up going middle links. For example in network 300E of FIG. 3E, the down coming middle links ML(3,3), ML(3,4), ML(3,9) and ML(3,10) are never setup to the up going middle links ML(2,1), ML(2,2), ML(2,3) and ML(2,4) for the middle switch MS(1,1). So middle switch MS(1,1) can be implemented as a four by eight switch with middle links ML(1,1), ML(1,2), ML(1,5) and ML(1,6) as inputs and middle links ML(2,1), ML(2,2), ML(2,3), ML(2,4), ML(4,1), ML(4,2), ML(4,3), and ML(4,4) as outputs; and a four by four switch with middle links ML(3,3), ML(3,4), ML(3,9) and ML(3,10) as inputs and middle links ML(4,1), ML(4,2), ML(4,3), and ML(4,4) as outputs).

A switch as used herein can be either a crossbar switch, or a network of switches each of which in turn may be a crossbar switch or a network of switches. An asymmetric Multi-link Butterfly fat tree network can be represented with the notation $V_{mlink-bft}(N_1,N_2,d,s)$, where $N_1$ represents the total number of inlet links of all input switches (for example the links IL1-IL24), $N_2$ represents the total number of outlet links of all output switches (for example the links OL1-OL8), d represents the inlet links of each input switch where $N_1 > N_2$, and s is the ratio of number of incoming links to each output switch to the outlet links of each output switch.

Each of the $$\frac{N_2}{d}$$

input switches IS1-IS4 are connected to exactly $$\frac{(d+d_1)}{2}$$

switches in middle stage 130 through $d+d_1$ links (for example input switch IS1 is connected to middle switch MS(1,1) through the links ML(1,1) and ML(1,2); input switch IS1 is connected to middle switch MS(1,2) through the links ML(1,3) and ML(1,4); input switch IS1 is connected to middle switch MS(1,3) through the links ML(1,5) and ML(1,6); input switch IS1 is connected to middle switch MS(1,4) through the links ML(1,7) and ML(1,8)).

Each of the $$\frac{N_2}{d}$$

middle switches MS(1,1)-MS(1,4) in the middle stage 130 are connected from exactly $$\frac{(d+d_1)}{2}$$

input switches through $d+d_1$ links (for example the links ML(1,1) and ML(1,2) are connected from input switch IS1 to middle switch MS(1,1); the links ML(1,9) and ML(1,10) are connected from input switch IS2 to middle switch MS(1,1); the links ML(1,17) and ML(1,18) are connected from input switch IS3 to middle switch MS(1,1); the links ML(1,25) and ML(1,26) are connected from input switch IS4 to middle switch MS(1,1)), and also are connected from exactly d switches in middle stage 140 through 2d links (for example the links ML(3,3) and ML(3,4) are connected to the middle switch MS(1,1) from middle switch MS(2,1); and the links ML(3,9) and ML(3,10) are connected to the middle switch MS(1,1) from middle switch MS(2,3)).

Similarly each of the $$\frac{N_2}{d}$$

middle switches MS(1,1)-MS(1,4) in the middle stage 130 are connected to exactly d switches in middle stage 140 through 2d links (for example the links ML(2,1) and ML(2,2) are connected from middle switch MS(1,1) to middle switch MS(2,1) and the links ML(2,3) and ML(2,4) are connected from middle switch MS(1,1) to middle switch MS(2,3)), and also are connected to exactly d output switches in output stage 120 through 2d links (for example the links ML(4,1) and ML(4,2) are connected to output switch OS1 from middle switch MS(1,1) and the links ML(4,3) and ML(4,4) are connected to output switch OS2 from middle switch MS(1,1)).

Similarly each of the $$\frac{N_2}{d}$$

middle switches MS(2,1)-MS(2,4) in the middle stage 140 are connected from exactly d switches in middle stage 130 through 2d links (for example the links ML(2,1) and ML(2,2) are connected to the middle switch MS(2,1) from middle switch MS(1,1) and the links ML(2,9) and ML(2,10) are connected to the middle switch MS(2,1) from middle switch MS(1,3)) and also are connected to exactly d switches in middle stage 130 through 2d links (for example the links ML(3,3) and ML(3,4) are connected from middle switch MS(2,1) to middle switch MS(1,1) and the links ML(3,1) and ML(3,2) are connected from middle switch MS(2,1) to middle switch MS(1,3)).

Each of the $$\frac{N_2}{d}$$

output switches OS1-OS4 are connected from exactly d switches in middle stage 130 through 2×d links (for example output switch OS1 is connected from middle switch MS(1,1) through the links ML(4,1) and ML(4,2), and output switch OS1 is connected from middle switch MS(1,2) through the links ML(4,5) and ML(4,6).

Finally the connection topology of the network 300E shown in FIG. 3E is known to be back to back inverse Benes connection topology.

In other embodiments the connection topology may be different from the embodiment of the network 300E of FIG. 3E. That is the way the links ML(1,1)-ML(1,32), ML(2,1)-ML(2,16), ML(3,1)-ML(3,16), and ML(4,1)-ML(4,16) are connected between the respective stages is different. Even though only one embodiment is illustrated, in general, the network $V_{mlink-bft}(N_1,N_2,d,s)$ can comprise any arbitrary type of connection topology. For example the connection topology of the network $V_{mlink-bft}(N_1,N_2,d,s)$ may be back to back Benes networks, Delta Networks and many more combinations. The applicant notes that the fundamental property of a valid connection topology of the $V_{mlink-bft}(N_1,N_2,d,s)$ network is, when no connections are setup from any input link all the output links should be reachable. Based on this property numerous embodiments of the network $V_{mlink-bft}(N_1,N_2,d,s)$ can be built. The embodiment of FIG. 3E is only one example of network $V_{mlink-bft}(N_1,N_2,d,s)$.

In the embodiment of FIG. 3E, each of the links ML(1,1)-ML(1,32), ML(2,1)-ML(2,16), ML(3,1)-ML(3,16) and ML(4,1)-ML(4,16) are either available for use by a new connection or not available if currently used by an existing connection. The input switches IS1-IS4 are also referred to as the network input ports. The input stage 110 is often referred to as the first stage. The output switches OS1-OS4 are also referred to as the network output ports. The output stage 120 is often referred to as the last stage. The middle stage switches MS(1,1)-MS(1,4) and MS(2,1)-MS(2,4) are referred to as middle switches or middle ports.

In the example illustrated in FIG. 3E, a fan-out of four is possible to satisfy a multicast connection request if input switch is IS2, but only two switches in middle stage 130 will be used. Similarly, although a fan-out of three is possible for a multicast connection request if the input switch is IS1, again only a fan-out of two is used. The specific middle switches that are chosen in middle stage 130 when selecting a fan-out of two is irrelevant so long as at most two middle switches are selected to ensure that the connection request is satisfied. In essence, limiting the fan-out from input switch to no more than two middle switches permits the network 300E, to be operated in rearrangeably nonblocking manner in accordance with the invention.

The connection request of the type described above can be unicast connection request, a multicast connection request or a broadcast connection request, depending on the example. In case of a unicast connection request, a fan-out of one is used, i.e. a single middle stage switch is used to satisfy the request. Moreover, although in the above-described embodiment a limit of two has been placed on the fan-out into the middle stage switches in middle stage 130, the limit can be greater depending on the number of middle stage switches in a network (while maintaining the rearrangeably nonblocking nature of operation of the network for multicast connections). However any arbitrary fan-out may be used within any of the middle stage switches and the output stage switches to satisfy the connection request.

Figure 3F:
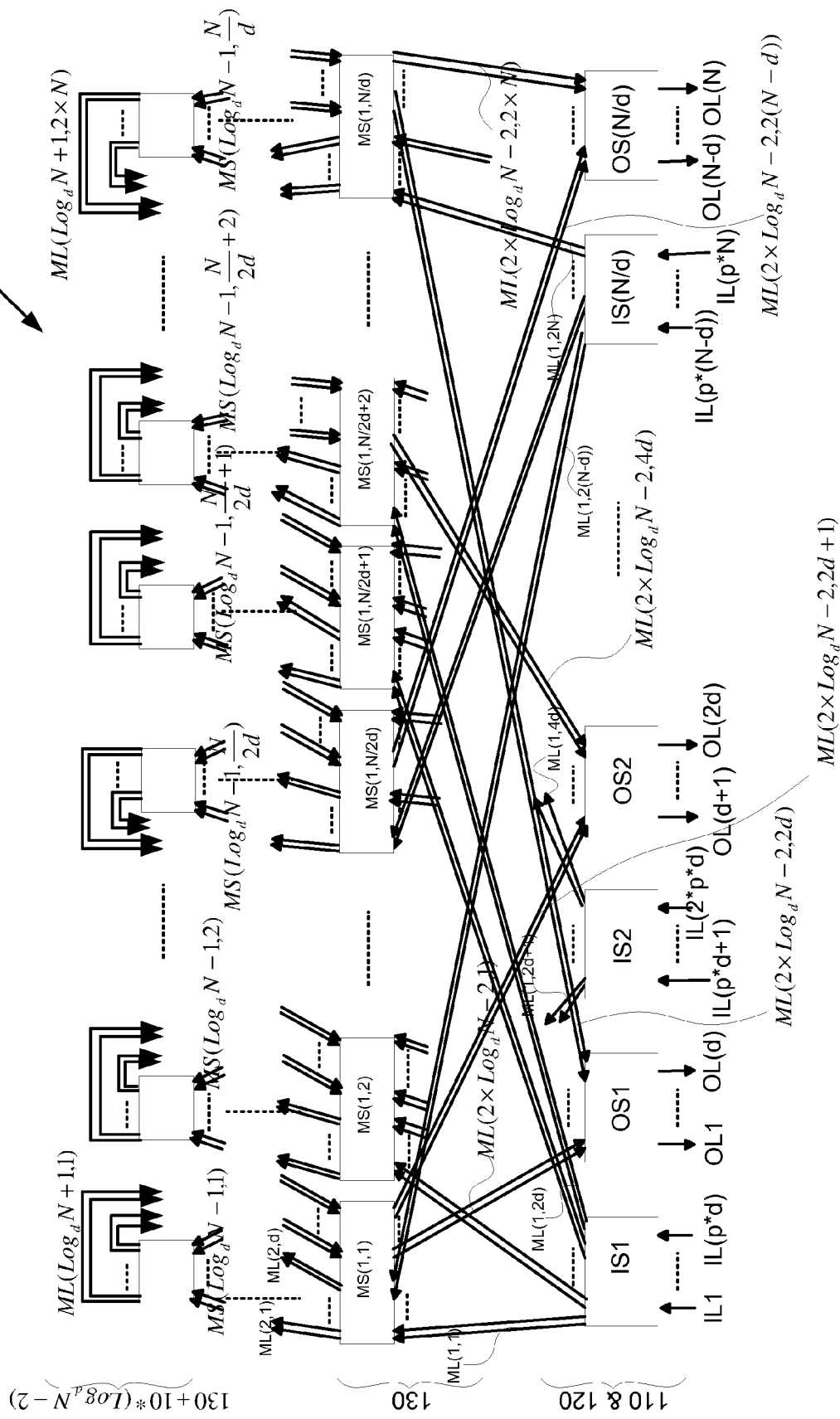
FIG. 3F is a diagram 300F of a general asymmetrical multi-link Butterfly fat tree network $V_{mlink-bft}(N_1,N_2,d,2)$ with $N_1=p*N_2$ and with ($\log_d N$) stages strictly nonblocking network for unicast connections and rearrangeably nonblocking network for arbitrary fan-out multicast connections in accordance with the invention.

Generalized Asymmetric RNB ($N_1 > N_2$) Embodiments:

Network 300F of FIG. 3F is an example of general asymmetrical Multi-link Butterfly fat tree network $V_{mlink\text{-}bft}(N_1, N_2, d, s)$ with ($\log_d N$) stages where $N_1 > N_2$ and $N_1 = p*N_2$ where $p > 1$. In network 300F of FIG. 3F, $N_2 = N$ and $N_1 = p*N$. The general asymmetrical Multi-link Butterfly fat tree network $V_{mlink\text{-}bft}(N_1, N_2, d, s)$ can be operated in rearrangeably nonblocking manner for multicast when s=2 according to the current invention. Also the general asymmetrical Multi-link Butterfly fat tree network $V_{mlink\text{-}bft}(N_1, N_2, d, s)$ can be operated in strictly nonblocking manner for unicast if s=2 according to the current invention. (And in the example of FIG. 3F, s=2). The general asymmetrical Multi-link Butterfly fat tree network $V_{mlink\text{-}bft}(N_1, N_2, d, s)$ with ($\log_d N$) stages has $d_1$ (where $$d_1 = N_1 \times \frac{d}{N_2} = p \times d$$

inlet links for each of $$\frac{N_2}{d}$$

input switches IS1-IS($N_2/d$) (for example the links IL1-IL(p*d) to the input switch IS1) and $d+d_1$ (=d+p×d) outgoing links for each of $$\frac{N_2}{d}$$

input switches IS1-IS($N_2/d$) (for example the links ML(1,1)-ML(1,(d+p*d)) to the input switch IS1). There are d outlet links for each of $$\frac{N_2}{d}$$

output switches OS1-OS($N_2/d$) (for example the links OL1-OL(d) to the output switch OS1) and 2×d incoming links for each of $$\frac{N_2}{d}$$

output switches OS1-OS($N_2/d$) (for example ML(2×$\log_d N_2$-2,1)-ML(2×$\log_d N_2$-2,2×d) to the output switch OS1).

Each of the $$\frac{N_2}{d}$$

input switches IS1-IS($N_2/d$) are connected to exactly $$\frac{d+d_1}{2}$$

switches in middle stage 130 through $d+d_1$ links.

Each of the $$\frac{N_2}{d}$$

middle switches MS(1,1)-MS(1,$N_2/d$) in the middle stage 130 are connected from exactly $$\frac{d+d_1}{2}$$

input switches through $d+d_1$ links and also are connected from exactly d switches in middle stage 140 through 2×d links.

Similarly each of the $$\frac{N_2}{d}$$

middle switches MS(1,1)-MS(1,2$N_2/d$) in the middle stage 130 also are connected to exactly d switches in middle stage 140 through 2×d links and also are connected to exactly d output switches in output stage 120 through 2×d links.

Similarly each of the $$\frac{N_2}{d}$$

middle switches $$MS(\text{Log}_d N_2 - 1, 1) - MS\left(\text{Log}_d N_2 - 1, \frac{N_2}{d}\right)$$

in the middle stage $130+10*(\text{Log}_d N_2-2)$ are connected from exactly d switches in middle stage $130+10*(\text{Log}_d N_2-3)$ through $2 \times d$ links and also are connected to exactly d switches in middle stage $130+10*(\text{Log}_d N_2-1)$ through $2 \times d$ links.

Each of the $$\frac{N_2}{d}$$

output switches OS1-OS($N_2$/d) are connected from exactly d switches in middle stage $130+10*(2*\text{Log}_d N_2-4)$ through $2 \times d$ links.

As described before, again the connection topology of a general $V_{mlink-bft}(N_1,N_2,d,s)$ may be any one of the connection topologies. For example the connection topology of the network $V_{mlink-bft}(N_1,N_2,d,s)$ may be back to back inverse Benes networks, back to back Omega networks, back to back Benes networks, Delta Networks and many more combinations. The applicant notes that the fundamental property of a valid connection topology of the general $V_{mlink-bft}(N_1,N_2,d,s)$ network is, when no connections are setup from any input link if any output link should be reachable. Based on this property numerous embodiments of the network $V_{mlink-bft}(N_1,N_2,d,s)$ can be built. The embodiments of FIG. 3E is one example of network $V_{mlink-bft}(N_1,N_2,d,s)$ for s=2 and $N_1 > N_2$.

The general symmetrical Multi-link Butterfly fat tree network $V_{mlink-bft}(N_1,N_2,d,s)$ can be operated in rearrangeably nonblocking manner for multicast when $s \geq 2$ according to the current invention. Also the general symmetrical Multi-link Butterfly fat tree network $V_{mlink-bft}(N_1,N_2,d,s)$ can be operated in strictly nonblocking manner for unicast if $s \geq 2$ according to the current invention.

For example, the network of FIG. 3E shows an exemplary three-stage network, namely $V_{mlink-bft}(24,8,2,2)$, with the following multicast assignment $I_1=\{2,3\}$ and all other $I_j=\phi$ for j=[2-8]. It should be noted that the connection $I_1$ fans out in the first stage switch IS1 into middle switches MS(1,1) and MS(1,2) in middle stage 130, and fans out in middle switches MS(1,1) and MS(1,2) only once into output switch OS2 in output stage 120 and middle switch and MS(2,2) in middle stage 140 respectively.

The connection $I_1$ also fans out in middle switch MS(2,2) only once into middle switch MS(1,4) in middle stage 130. The connection $I_1$ also fans out in middle switch MS(1,4) only once into output switch OS3 in output stage 120. Finally the connection $I_1$ fans out once in the output stage switch OS2 into outlet link OL3 and in the output stage switch OS3 twice into the outlet links OL5 and OL6. In accordance with the invention, each connection can fan out in the input stage switch into at most two middle stage switches in middle stage 130.

Strictly Nonblocking Multi-link Butterfly Fat Tree Networks:

The general symmetric multi-link Butterfly fat tree network $V_{mlink-bft}(N,d,s)$ can also be operated in strictly nonblocking manner for multicast when $s \geq 3$ according to the current invention. Similarly the general asymmetric multi-link Butterfly fat tree network $V_{mlink-bft}(N_1,N_2,d,s)$ can also be operated in strictly nonblocking manner for multicast when $s \geq 3$ according to the current invention.

Figure 4A:
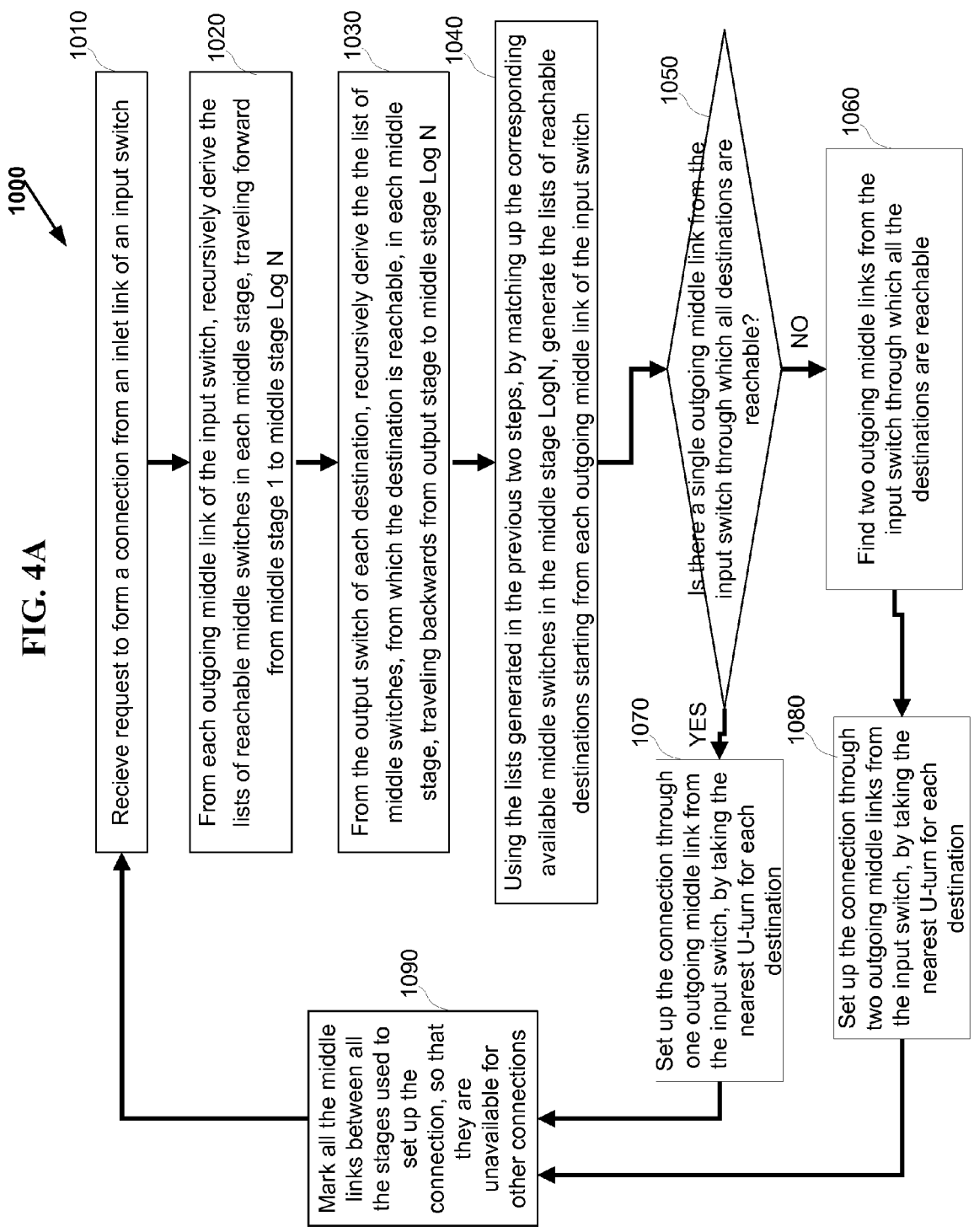
FIG. 4A is high-level flowchart of a scheduling method according to the invention, used to set up the multicast connections in all the networks disclosed in this invention.

Scheduling Method Embodiments:

FIG. 4A shows a high-level flowchart of a scheduling method 1000, in one embodiment executed to setup multicast and unicast connections in network 400A of FIG. 4A (or any of the networks $V_{bft}(N_1,N_2,d,s)$ and $V_{mlink-bft}(N_1,N_2,d,s)$ disclosed in this invention). According to this embodiment, a multicast connection request is received in act 1010. Then the control goes to act 1020.

In act 1020, based on the inlet link and input switch of the multicast connection received in act 1010, from each available outgoing middle link of the input switch of the multicast connection, by traveling forward from middle stage 130 to middle stage $130+10*(\text{Log}_d N-2)$, the lists of all reachable middle switches in each middle stage are derived recursively. That is, first, by following each available outgoing middle link of the input switch all the reachable middle switches in middle stage 130 are derived. Next, starting from the selected middle switches in middle stage 130 traveling through all of their available out going middle links to middle stage 140 (reverse links from middle stage 130 to output stage 120 are ignored) all the available middle switches in middle stage 140 are derived. (In the traversal from any middle stage to the following middle stage only upward links are used and no reverse links or downward links are used. That is for example, while deriving the list of available middle switches in middle stage 140, the reverse links going from middle stage 130 to output stage 120 are ignored.) This process is repeated recursively until all the reachable middle switches, starting from the outgoing middle link of input switch, in middle stage $130+10*(\text{Log}_d N-2)$ are derived. This process is repeated for each available outgoing middle link from the input switch of the multicast connection and separate reachable lists are derived in each middle stage from middle stage 130 to middle stage $130+10*(\text{Log}_d N-2)$ for all the available outgoing middle links from the input switch. Then the control goes to act 1030.

In act 1030, based on the destinations of the multicast connection received in act 1010, from the output switch of each destination, by traveling backward from output stage 120 to middle stage $130+10*(\text{Log}_d N-2)$, the lists of all middle switches in each middle stage from which each destination output switch (and hence the destination outlet links) is reachable, are derived recursively. That is, first, by following each available incoming middle link of the output switch of each destination link of the multicast connection, all the middle switches in middle stage 130 from which the output switch is reachable, are derived. Next, starting from the selected middle switches in middle stage 130 traveling backward through all of their available incoming middle links from middle stage 140 all the available middle switches in middle stage 140 (reverse links from middle stage 130 to input stage 120 are ignored) from which the output switch is reachable, are derived. (In the traversal from any middle stage to the following middle stage only upward links are used and no reverse links or downward links are used. That is for example, while deriving the list of available middle switches in middle stage 140, the reverse links coming to middle stage 130 from input stage 110 are ignored.) This process is repeated recursively until all the middle switches in middle stage $130+10*(\text{Log}_d \text{ N}-2)$ from which the output switch is reachable, are derived. This process is repeated for each output switch of each destination link of the multicast connection and separate lists in each middle stage from middle stage 130 to middle stage $130+10*(\text{Log}_d \text{ N}-2)$ for all the output switches of each destination link of the connection are derived. Then the control goes to act 1040.

In act 1040, using the lists generated in acts 1020 and 1030, particularly list of middle switches derived in middle stage $130+10*(\text{Log}_d \text{ N}-2)$ corresponding to each outgoing link of the input switch of the multicast connection, and the list of middle switches derived in middle stage $130+10*(\text{Log}_d \text{ N}-2)$ corresponding to each output switch of the destination links, the list of all the reachable destination links from each outgoing link of the input switch are derived. Specifically if a middle switch in middle stage $130+10*(\text{Log}_d \text{ N}-2)$ is reachable from an outgoing link of the input switch, say "x", and also from the same middle switch in middle stage $130+10*(\text{Log}_d \text{ N}-2)$ if the output switch of a destination link, say "y", is reachable then using the outgoing link of the input switch x, destination link y is reachable. Accordingly, the list of all the reachable destination links from each outgoing link of the input switch is derived. The control then goes to act 1050.

In act 1050, among all the outgoing links of the input switch, it is checked if all the destinations are reachable using only one outgoing link of the input switch. If one outgoing link is available through which all the destinations of the multicast connection are reachable (i.e., act 1050 results in "yes"), the control goes to act 1070. And in act 1070, the multicast connection is setup by traversing from the selected only one outgoing middle link of the input switch in act 1050, to all the destinations. Also the nearest U-turn is taken while setting up the connection. That is at any middle stage if one of the middle switch in the lists derived in acts 1020 and 1030 are common then the connection is setup so that the U-turn is made to setup the connection from that middle switch for all the destination links reachable from that common middle switch. Then the control transfers to act 1090.

If act 1050 results "no", that is one outgoing link is not available through which all the destinations of the multicast connection are reachable, then the control goes to act 1060. In act 1060, it is checked if all destination links of the multicast connection are reachable using two outgoing middle links from the input switch. According to the current invention, it is always possible to find at most two outgoing middle links from the input switch through which all the destinations of a multicast connection are reachable. So act 1060 always results in "yes", and then the control transfers to act 1080. In act 1080, the multicast connection is setup by traversing from the selected only two outgoing middle links of the input switch in act 1060, to all the destinations. Also the nearest U-turn is taken while setting up the connection. That is at any middle stage if one of the middle switch in the lists derived in acts 1020 and 1030 are common then the connection is setup so that the U-turn is made to setup the connection from that middle switch for all the destination links reachable from that common middle switch. Then the control transfers to act 1090.

In act 1090, all the middle links between any two stages of the network used to setup the connection in either act 1070 or act 1080 are marked unavailable so that these middle links will be made unavailable to other multicast connections. The control then returns to act 1010, so that acts 1010, 1020, 1030, 1040, 1050, 1060, 1070, 1080, and 1090 are executed in a loop, for each connection request until the connections are set up.

In the example illustrated in FIG. 1A, four outgoing middle links are available to satisfy a multicast connection request if input switch is IS2, but only at most two outgoing middle links of the input switch will be used in accordance with this method. Similarly, although three outgoing middle links is available for a multicast connection request if the input switch is IS1, again only at most two outgoing middle links is used. The specific outgoing middle links of the input switch that are chosen when selecting two outgoing middle links of the input switch is irrelevant to the method of FIG. 4A so long as at most two outgoing middle links of the input switch are selected to ensure that the connection request is satisfied, i.e. the destination switches identified by the connection request can be reached from the outgoing middle links of the input switch that are selected. In essence, limiting the outgoing middle links of the input switch to no more than two permits the network $V_{bft}(N_1,N_2,d,s)$ and the network $V_{mlink-bft}(N_1,N_2,d,s)$ to be operated in nonblocking manner in accordance with the invention.

According to the current invention, using the method 1040 of FIG. 4A, the network $V_{bft}(N_1,N_2,d,s)$ and the network $V_{mlink-bft}(N_1,N_2,d,s)$ are operated in rearrangeably nonblocking for unicast connections when $s \geq 1$, are operated in strictly nonblocking for unicast connections when $s \geq 2$, are operated in rearrangeably nonblocking for multicast connections when $s \geq 2$, and are operated in strictly nonblocking for multicast connections when $s \geq 3$.

The connection request of the type described above in reference to method 1000 of FIG. 4A can be unicast connection request, a multicast connection request or a broadcast connection request, depending on the example. In case of a unicast connection request, only one outgoing middle link of the input switch is used to satisfy the request. Moreover, in method 1000 described above in reference to FIG. 4A any number of middle links may be used between any two stages excepting between the input stage and middle stage 130, and also any arbitrary fan-out may be used within each output stage switch, to satisfy the connection request.

As noted above method 1000 of FIG. 4A can be used to setup multicast connections, unicast connections, or broadcast connection of all the networks $V_{bft}(N,d,s)$, $V_{bft}(N_1,N_2,d,s)$, $V_{mlink-bft}(N,d,s)$, and $V_{mlink-bft}(N_1,N_2,d,s)$ disclosed in this invention.

Applications Embodiments

Figure 5A:
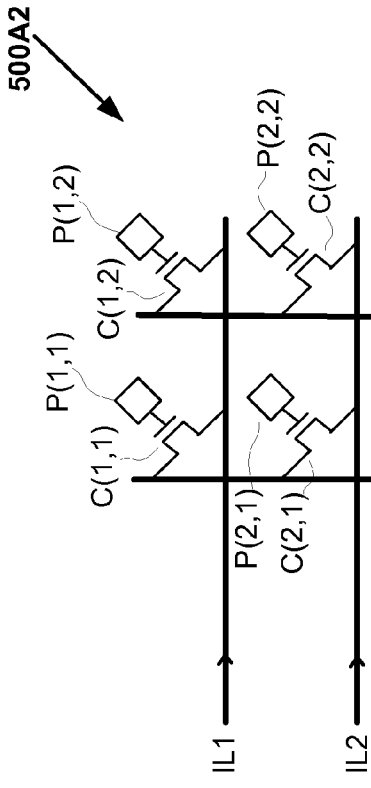
Figure 5A:
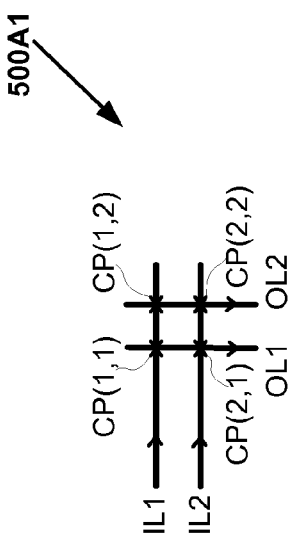
Figure 5A:
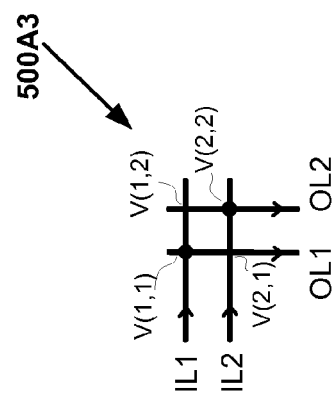
Figure 5A:
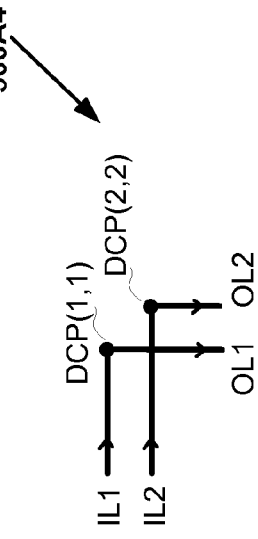

All the embodiments disclosed in the current invention are useful in many varieties of applications. FIG. 5A1 illustrates the diagram of 500A1 which is a typical two by two switch with two inlet links namely IL1 and IL2, and two outlet links namely OL1 and OL2. The two by two switch also implements four crosspoints namely CP(1,1), CP(1,2), CP(2,1) and CP(2,2) as illustrated in FIG. 5A1. For example the diagram of 500A1 may the implementation of middle switch MS(2,1) of the diagram 100A of FIG. 1A where inlet link IL1 of diagram 500A1 corresponds to middle link ML(2,1) of diagram 100A, inlet link IL2 of diagram 500A1 corresponds to middle link ML(2,5) of diagram 100A, outlet link OL1 of diagram 500A1 corresponds to middle link ML(3,1) of diagram 100A, outlet link OL2 of diagram 500A1 corresponds to middle link ML(3,2) of diagram 100A.

1) Programmable Integrated Circuit Embodiments:

All the embodiments disclosed in the current invention are useful in programmable integrated circuit applications. FIG. 5A2 illustrates the detailed diagram 500A2 for the implementation of the diagram 500A1 in programmable integrated circuit embodiments. Each crosspoint is implemented by a transistor coupled between the corresponding inlet link and outlet link, and a programmable cell in programmable integrated circuit embodiments. Specifically crosspoint CP(1,1) is implemented by transistor C(1,1) coupled between inlet link IL1 and outlet link OL1, and programmable cell P(1,1); crosspoint CP(1,2) is implemented by transistor C(1,2) coupled between inlet link IL1 and outlet link OL2, and programmable cell P(1,2); crosspoint CP(2,1) is implemented by transistor C(2,1) coupled between inlet link IL2 and outlet link OL1, and programmable cell P(2,1); and crosspoint CP(2,2) is implemented by transistor C(2,2) coupled between inlet link IL2 and outlet link OL2, and programmable cell P(2,2).

If the programmable cell is programmed ON, the corresponding transistor couples the corresponding inlet link and outlet link If the programmable cell is programmed OFF, the corresponding inlet link and outlet link are not connected. For example if the programmable cell P(1,1) is programmed ON, the corresponding transistor C(1,1) couples the corresponding inlet link IL1 and outlet link OL1. If the programmable cell P(1,1) is programmed OFF, the corresponding inlet link IL1 and outlet link OL1 are not connected. In volatile programmable integrated circuit embodiments the programmable cell may be an SRAM (Static Random Address Memory) cell. In non-volatile programmable integrated circuit embodiments the programmable cell may be a Flash memory cell. Also the programmable integrated circuit embodiments may implement field programmable logic arrays (FPGA) devices, or programmable Logic devices (PLD), or Application Specific Integrated Circuits (ASIC) embedded with programmable logic circuits or 3D-FPGAs.

2) One-time Programmable Integrated Circuit Embodiments:

All the embodiments disclosed in the current invention are useful in one-time programmable integrated circuit applications. FIG. 5A3 illustrates the detailed diagram 500A3 for the implementation of the diagram 500A1 in one-time programmable integrated circuit embodiments. Each crosspoint is implemented by a via coupled between the corresponding inlet link and outlet link in one-time programmable integrated circuit embodiments. Specifically crosspoint CP(1,1) is implemented by via V(1,1) coupled between inlet link IL1 and outlet link OL1; crosspoint CP(1,2) is implemented by via V(1,2) coupled between inlet link IL1 and outlet link OL2; crosspoint CP(2,1) is implemented by via V(2,1) coupled between inlet link IL2 and outlet link OL1; and crosspoint CP(2,2) is implemented by via V(2,2) coupled between inlet link IL2 and outlet link OL2.

If the via is programmed ON, the corresponding inlet link and outlet link are permanently connected which is denoted by thick circle at the intersection of inlet link and outlet link If the via is programmed OFF, the corresponding inlet link and outlet link are not connected which is denoted by the absence of thick circle at the intersection of inlet link and outlet link For example in the diagram 500A3 the via V(1,1) is programmed ON, and the corresponding inlet link IL1 and outlet link OL1 are connected as denoted by thick circle at the intersection of inlet link IL1 and outlet link OL1; the via V(2,2) is programmed ON, and the corresponding inlet link IL2 and outlet link OL2 are connected as denoted by thick circle at the intersection of inlet link IL2 and outlet link OL2; the via V(1,2) is programmed OFF, and the corresponding inlet link IL1 and outlet link OL2 are not connected as denoted by the absence of thick circle at the intersection of inlet link IL1 and outlet link OL2; the via V(2,1) is programmed OFF, and the corresponding inlet link IL2 and outlet link OL1 are not connected as denoted by the absence of thick circle at the intersection of inlet link IL2 and outlet link OL1. One-time programmable integrated circuit embodiments may be anti-fuse based programmable integrated circuit devices or mask programmable structured ASIC devices.

3) Integrated Circuit Placement and Route Embodiments:

All the embodiments disclosed in the current invention are useful in Integrated Circuit Placement and Route applications, for example in ASIC backend Placement and Route tools. FIG. 5A4 illustrates the detailed diagram 500A4 for the implementation of the diagram 500A1 in Integrated Circuit Placement and Route embodiments. In an integrated circuit since the connections are known a-priori, the switch and crosspoints are actually virtual. However the concept of virtual switch and virtual crosspoint using the embodiments disclosed in the current invention reduces the number of required wires, wire length needed to connect the inputs and outputs of different netlists and the time required by the tool for placement and route of netlists in the integrated circuit.

Each virtual crosspoint is used to either to hardwire or provide no connectivity between the corresponding inlet link and outlet link Specifically crosspoint CP(1,1) is implemented by direct connect point DCP(1,1) to hardwire (i.e., to permanently connect) inlet link IL1 and outlet link OL1 which is denoted by the thick circle at the intersection of inlet link IL1 and outlet link OL1; crosspoint CP(2,2) is implemented by direct connect point DCP(2,2) to hardwire inlet link IL2 and outlet link OL2 which is denoted by the thick circle at the intersection of inlet link IL2 and outlet link OL2. The diagram 500A4 does not show direct connect point DCP(1,2) and direct connect point DCP(1,3) since they are not needed and in the hardware implementation they are eliminated. Alternatively inlet link IL1 needs to be connected to outlet link OL1 and inlet link IL1 does not need to be connected to outlet link OL2. Also inlet link IL2 needs to be connected to outlet link OL2 and inlet link IL2 does not need to be connected to outlet link OL1. Furthermore in the example of the diagram 500A4, there is no need to drive the signal of inlet link IL1 horizontally beyond outlet link OL1 and hence the inlet link IL1 is not even extended horizontally until the outlet link OL2. Also the absence of direct connect point DCP(2,1) illustrates there is no need to connect inlet link IL2 and outlet link OL1.

In summary in integrated circuit placement and route tools, the concept of virtual switches and virtual cross points is used during the implementation of the placement & routing algorithmically in software, however during the hardware implementation cross points in the cross state are implemented as hardwired connections between the corresponding inlet link and outlet link, and in the bar state are implemented as no connection between inlet link and outlet link 3) More Application Embodiments:

All the embodiments disclosed in the current invention are also useful in the design of SoC interconnects, Field programmable interconnect chips, parallel computer systems and in time-space-time switches.

Numerous modifications and adaptations of the embodiments, implementations, and examples described herein will be apparent to the skilled artisan in view of the disclosure.

What is claimed is:

1. A network having a plurality of multicast connections, said network comprising:

$N_1$ inlet links and $N_2$ outlet links, and when $N_2 \geqq N_1$ and $N_2 = p*N_1$ where $p \geqq 1$ then $N_1=N$, $d_1=d$, and $$d_2 = N_2 \times \frac{d}{N_1} = p \times d;$$

and a leaf stage comprising an input stage and an output stage; and said input stage comprising $$\frac{N_1}{d}$$

input switches, and each input switch comprising d inlet links and each said input switch further comprising x×d outgoing links connecting to switches in its immediate succeeding stage where x>0; and said output stage comprising $$\frac{N_1}{d}$$

output switches, and each output switch comprising $d_2$ outlet links and each said output switch further comprising $$x \times \frac{(d + d_2)}{2}$$

incoming links connecting from switches in its immediate succeeding stage; and a plurality of y middle stages, excepting a root stage, comprising $$x \times \frac{N}{d}$$

middle switches in each of said y middle stages wherein one of said middle stages is an immediate succeeding stage to both said input stage and said output stage, where y>1, and said root stage comprising $$\frac{N}{d}$$

middle switches; and each middle switch in all said middle stages, excepting said root stage and said succeeding stage to both said input stage said output stage, comprising d incoming links (hereinafter "incoming middle links") connecting from switches in its immediate preceding stage and d incoming links connecting from switches in its immediate succeeding stage, and each middle switch further comprising d outgoing links (hereinafter "outgoing middle links") connecting to switches in its immediate succeeding stage and d outgoing links connecting to switches in its immediate succeeding stage; and each middle switch in said succeeding stage to both said input stage and said output stage comprising d incoming links connecting from switches in said input stage and d incoming links connecting from switches it its immediate succeeding stage, and each middle switch further comprising $$\frac{(d + d_2)}{2}$$

outgoing links connecting to switches in said output stage and d outgoing links connecting to switches in its immediate succeeding stage; and each middle switch in said root stage comprising d incoming links connecting from switches in its immediate preceding stage and each middle switch further comprising d outgoing links connecting to switches in its immediate preceding stage; or when $N_1 > N_2$ and $N_1 = p*N_2$ where p>1 then $N_2=N$, $d_2=d$ and $$d_1 = N_1 \times \frac{d}{N_2} = p \times d$$

and a leaf stage comprising an input stage and an output stage; said input stage comprising $$\frac{N_2}{d}$$

input switches, and each input switch comprising $d_1$ inlet links and each input switch further comprising $$x \times \frac{(d + d_1)}{2}$$

outgoing links connecting to switches in its immediate succeeding stage where x>0; and said output stage comprising $$\frac{N_2}{d}$$

output switches, and each output switch comprising d outlet links and each output switch further comprising x×d incoming links connecting from switches in its immediate succeeding stage; and a plurality of y middle stages, excepting a root stage, comprising $$x \times \frac{N}{d}$$

middle switches in each of said y middle stages wherein one of said middle stages is an immediate succeeding stage to both said input stage and said output stage, where y>1, and said root stage comprising $$\frac{N}{d}$$

middle switches; and each middle switch in all said middle stages, excepting said root stage and said succeeding stage to both said input stage said output stage, comprising d incoming links (hereinafter "incoming middle links") connecting from switches in its immediate preceding stage and d incoming links connecting from switches in its immediate succeeding stage, and each middle switch further comprising d outgoing links (hereinafter "outgoing middle links") connecting to switches in its immediate succeeding stage and d outgoing links connecting to switches in its immediate succeeding stage; and each middle switch in said succeeding stage to both said input stage and said output stage comprising $$\frac{(d+d_1)}{2}$$

incoming links connecting from switches in said input stage and d incoming links connecting from switches it its immediate succeeding stage, and each middle switch further comprising d outgoing links connecting to switches in said output stage and d outgoing links connecting to switches in its immediate succeeding stage; and each middle switch in said root stage comprising d incoming links connecting from switches in its immediate preceding stage and each middle switch further comprising d outgoing links connecting to switches in its immediate preceding stage; and wherein each multicast connection from an inlet link passes through at most two outgoing links in the input switch, and said multicast connection further passes through a plurality of outgoing links in a plurality of switches in each said middle stage and in said output stage.

2. The network of claim 1, wherein all said incoming middle links and outgoing middle links are connected in any arbitrary topology such that when no connections are setup in said network, a connection from any said inlet link to any said outlet link can be setup.

3. The network of claim 2, wherein $y \geq (\log_d N_1)-1$ when $N_2 > N_1$, and $y \geq (\log_d N_2)-1$ when $N_1 > N_2$.

4. The network of claim 3, wherein $x \geq 1$, wherein said each multicast connection comprises only one destination link, and said each multicast connection from an inlet link passes through only one outgoing link in the input switch, and said multicast connection further passes through only one outgoing link in one of the switches in each said middle stage and in said output stage, and further is always capable of setting up said multicast connection by changing a path, defined by a passage of an existing multicast connection, thereby to change only one outgoing link of the input switch used by said existing multicast connection, and said network is hereinafter "rearrangeably nonblocking network for unicast".

5. The network of claim 3, wherein $x \geq 2$, wherein said each multicast connection comprises only one destination link, and said each multicast connection from an inlet link passes through only one outgoing link in the input switch, and said multicast connection further passes through only one outgoing link in one of the switches in each said middle stage and in said output stage, and further is always capable of setting up said multicast connection by never changing a path of an existing multicast connection, wherein said each multicast connection comprises only one destination link and the network is hereinafter "strictly nonblocking network for unicast".

6. The network of claim 3, wherein $x \geq 2$, further is always capable of setting up said multicast connection by changing a path, defined by a passage of an existing multicast connection, thereby to change one or two outgoing links of the input switch used by said existing multicast connection, and said network is hereinafter "rearrangeably nonblocking network".

7. The network of claim 3, wherein $x \geq 3$, further is always capable of setting up said multicast connection by never changing a path of an existing multicast connection, and the network is hereinafter "strictly nonblocking network".

8. The network of claim 1, further comprising a controller coupled to each of said input, output and middle stages to set up said multicast connection.

9. The network of claim 1, wherein said $N_1$ inlet links and $N_2$ outlet links are the same number of links, i.e., $N_1=N_2=N$, and $d_1=d_2=d$.

10. The network of claim 1, wherein said input switches, said output switches and said middle switches are not fully populated.

11. The network of claim 1, wherein each of said input switches, or each of said output switches, or each of said middle switches further recursively comprise one or more networks.

12. A method for setting up one or more multicast connections in a network having $N_1$ inlet links and $N_2$ outlet links, and when $N_2 \geq N_1$ and $N_2 = p*N_1$ where $p \geq 1$ then $N_1=N$, $d_1=d$, and $$d_2 = N_2 \times \frac{d}{N_1} = p \times d;$$

and having a leaf stage comprising an input stage and an output stage; and said input stage having $$\frac{N_1}{d}$$

input switches, and each input switch having d inlet links and each input switch further having x×d outgoing links connected to switches in its immediate succeeding stage where x>0; and said output stage having $$\frac{N_1}{d}$$

output switches, and each output switch having $d_2$ outlet links and each output switch further having $$x \times \frac{(d+d_2)}{2}$$

incoming links connected from switches in its immediate succeeding stage; and a plurality of y middle stages, excepting a root stage, having $$x \times \frac{N}{d}$$

middle switches in each of said y middle stages wherein one of said middle stages is an immediate succeeding stage to both said input stage and said output stage, where y>1, and said root stage having $$\frac{N}{d}$$

middle switches, and each middle switch in all said middle stages, excepting said root stage and said succeeding stage to both said input stage said output stage, having d incoming links connected from switches in its immediate preceding stage and d incoming links connected from switches in its immediate succeeding stage, and each middle switch further comprising d outgoing links connected to switches in its immediate succeeding stage and d outgoing links connected to switches in its immediate succeeding stage; and each middle switch in said succeeding stage to both said input stage and said output stage having d incoming links connected from switches in said input stage and d incoming links connected from switches it its immediate succeeding stage, and each middle switch further having $$\frac{(d + d_2)}{2}$$

outgoing links connected to switches in said output stage and d outgoing links connected to switches in its immediate succeeding stage; and each middle switch in said root stage having d incoming links connected from switches in its immediate preceding stage and each middle switch further having d outgoing links connected to switches in its immediate preceding stage; or when $N_1 > N_2$ and $N_1 = p * N_2$ where p>1 then $N_2 = N$, $d_2 = d$ and $$d_1 = N_1 \times \frac{d}{N_2} = p \times d;$$

and having having a leaf stage having an input stage and an output stage; and said input stage having $$\frac{N_2}{d}$$

input switches, and each input switch having $d_1$ inlet links and each input switch further having $$x \times \frac{(d - d_1)}{2}$$

outgoing links connected to switches in its immediate succeeding stage where x>0; and said output stage having $$\frac{N_2}{d}$$

output switches, and each output switch having d outlet links and each output switch further having x×d incoming links connected from switches in its immediate succeeding stage; and a plurality of y middle stages, excepting a root stage, having $$x \times \frac{N}{d}$$

middle switches in each of said y middle stages wherein one of said middle stages is an immediate succeeding stage to both said input stage and said output stage, where y>1, and said root stage having $$\frac{N}{d}$$

middle switches, and each middle switch in all said middle stages, excepting said root stage and said succeeding stage to both said input stage said output stage, having d incoming links connected from switches in its immediate preceding stage and d incoming links connected from switches in its immediate succeeding stage, and each middle switch further comprising d outgoing links connected to switches in its immediate succeeding stage and d outgoing links connected to switches in its immediate succeeding stage; and each middle switch in said succeeding stage to both said input stage and said output stage having $$\frac{(d + d_1)}{2}$$

incoming links connected from switches in said input stage and d incoming links connected from switches it its immediate succeeding stage, and each middle switch further having d outgoing links connected to switches in said output stage and d outgoing links connected to switches in its immediate succeeding stage; and each middle switch in said root stage having d incoming links connected from switches in its immediate preceding stage and each middle switch further having d outgoing links connected to switches in its immediate preceding stage; and said method comprising:

receiving a multicast connection at said input stage;

fanning out said multicast connection through at most two outgoing links in the input switch and a plurality of outgoing links in a plurality of middle switches in each said middle stage to set up said multicast connection to a plurality of output switches among said $$\frac{N_2}{d}$$

output switches, wherein said plurality of output switches are specified as destinations of said multicast connection, wherein said at most two outgoing links in the input switch and said plurality of outgoing links in said plurality of middle switches in each said middle stage are available if necessary by rearranging any previous connections that are set up.

13. The method of claim 12 wherein said act of fanning out is performed without changing any existing connection to pass through another set of a plurality of middle switches in each said middle stage.

14. The method of claim 12 wherein said act of fanning out is performed recursively.

15. The method of claim 12 wherein a connection exists through said network and passes through a plurality of middle switches in each said middle stage and said method further comprises:
   if necessary, changing said connection to pass through another set of a plurality of middle switches in each said middle stage, act hereinafter "rearranging connection".

16. The method of claim 12 wherein said acts of fanning out and rearranging are performed recursively.

17. A method for setting up one or more multicast connections in a network having $N_1$ inlet links and $N_2$ outlet links, and
   when $N_2 > N_1$ and $N_2 = p*N_1$ where $p \geq 1$ then $N_1 = N$, $d_1 = d$, and $$d_2 = N_2 \times \frac{d}{N_1} = p \times d;$$

and
   having a leaf stage comprising an input stage and an output stage; and said input stage having $$\frac{N_1}{d}$$

input switches, and each input switch having d inlet links and each input switch further having x×d outgoing links connected to switches in its immediate succeeding stage where x>0; and said output stage having $$\frac{N_1}{d}$$

output switches, and each output switch having $d_2$ outlet links and each output switch further having $$x \times \frac{(d + d_2)}{2}$$

incoming links connected from switches in its immediate succeeding stage; and a plurality of y middle stages, excepting a root stage, having $$x \times \frac{N}{d}$$

middle switches in each of said y middle stages wherein one of said middle stages is an immediate succeeding stage to both said input stage and said output stage, where y>1, and said root stage having $$\frac{N}{d}$$

middle switches, and
   each middle switch in all said middle stages, excepting said root stage and said succeeding stage to both said input stage said output stage, having d incoming links connected from switches in its immediate preceding stage and d incoming links connected from switches in its immediate succeeding stage, and each middle switch further comprising d outgoing links connected to switches in its immediate succeeding stage and d outgoing links connected to switches in its immediate succeeding stage; and
   each middle switch in said succeeding stage to both said input stage and said output stage having d incoming links connected from switches in said input stage and d incoming links connected from switches it its immediate succeeding stage, and each middle switch further having $$\frac{(d + d_2)}{2}$$

outgoing links connected to switches in said output stage and d outgoing links connected to switches in its immediate succeeding stage; and
   each middle switch in said root stage having d incoming links connected from switches in its immediate preceding stage and each middle switch further having d outgoing links connected to switches in its immediate preceding stage; or
   when $N_1 > N_2$ and $N_1 = p*N_2$ where p>1 then $N_2 = N$, $d_2 = d$ and $$d_1 = N_1 \times \frac{d}{N_2} = p \times d;$$

and having
   having a leaf stage having an input stage and an output stage; and said input stage having $$\frac{N_2}{d}$$

input switches, and each input switch having $d_1$ inlet links and each input switch further having $$x \times \frac{(d + d_1)}{2}$$

outgoing links connected to switches in its immediate succeeding stage where x>0; and said output stage having $$\frac{N_2}{d}$$

output switches, and each output switch having d outlet links and each output switch further having x×d incoming links connected from switches in its immediate succeeding stage; and a plurality of y middle stages, excepting a root stage, having $$x \times \frac{N}{d}$$

middle switches in each of said y middle stages wherein one of said middle stages is an immediate succeeding stage to both said input stage and said output stage, where y>1, and said root stage having $$\frac{N}{d}$$

middle switches, and each middle switch in all said middle stages, excepting said root stage and said succeeding stage to both said input stage said output stage, having d incoming links connected from switches in its immediate preceding stage and d incoming links connected from switches in its immediate succeeding stage, and each middle switch further comprising d outgoing links connected to switches in its immediate succeeding stage and d outgoing links connected to switches in its immediate succeeding stage; and each middle switch in said succeeding stage to both said input stage and said output stage having $$\frac{(d + d_1)}{2}$$

incoming links connected from switches in said input stage and d incoming links connected from switches it its immediate succeeding stage, and each middle switch further having d outgoing links connected to switches in said output stage and d outgoing links connected to switches in its immediate succeeding stage; and each middle switch in said root stage having d incoming links connected from switches in its immediate preceding stage and each middle switch further having d outgoing links connected to switches in its immediate preceding stage; and said method comprising:

checking if a first outgoing link in the input switch and a first plurality of outgoing links in the plurality of middle switches in each said middle stage are available to at least a first subset of destination output switches of said multicast connection; and checking if a second outgoing link in the input switch and a second plurality of outgoing links in the plurality of middle switches in each said middle stage are available to a second subset of destination output switches of said multicast connection;

wherein each destination output switch of said multicast connection is one of said first subset of destination output switches and said second subset of destination output switches.

18. The method of claim 17 further comprising:

prior to said checkings, checking if all the destination output switches of said multicast connection are available through said first outgoing link in the input switch and said first plurality of outgoing links in a plurality of middle switches in each said middle stage.

19. The method of claim 17 further comprising:

repeating said checkings of available second outgoing link in the input switch and a second plurality of outgoing links in a plurality of middle switches in each said middle stage for a second subset of destination output switches of said multicast connection for each outgoing link in the input switch other than said first and said second outgoing links in the input switch;

wherein each destination output switch of said multicast connection is one of said first subset of destination output switches and said second subset of destination output switches.

20. The method of claim 17 further comprising:

repeating said checkings of available first outgoing link in the input switch and a first plurality of outgoing links in a plurality of middle switches in each said middle stage for a first subset of destination output switches of said multicast connection for each outgoing link in the input switch other than said first outgoing link in the input switch.

21. The method of claim 17 further comprising:

setting up each of said multicast connection from its said input switch to its said output switches through not more than two outgoing links, selected by said checkings, by fanning out said multicast connection in its said input switch into not more than said two outgoing links.

22. The method of claim 17 wherein any of said acts of checking and setting up are performed recursively.

* * * * *